(12) United States Patent
Higashitani et al.

(10) Patent No.: US 8,933,502 B2
(45) Date of Patent: Jan. 13, 2015

(54) 3D NON-VOLATILE MEMORY WITH METAL SILICIDE INTERCONNECT

(75) Inventors: Masaaki Higashitani, Cupertino, CA (US); Peter Rabkin, Cupertino, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 13/301,597

(22) Filed: Nov. 21, 2011

(65) Prior Publication Data

US 2013/0126957 A1 May 23, 2013

(51) Int. Cl.
| | |
|---|---|
| H01L 27/06 | (2006.01) |
| G11C 16/06 | (2006.01) |
| H01L 27/115 | (2006.01) |
| G11C 16/04 | (2006.01) |

(52) U.S. Cl.
CPC .......... *H01L 27/11582* (2013.01); *G11C 16/06* (2013.01); *H01L 27/11565* (2013.01); *H01L 27/11573* (2013.01); *H01L 27/11519* (2013.01); *G11C 16/0483* (2013.01); *H01L 27/11556* (2013.01); *H01L 27/11531* (2013.01)
USPC ................................. 257/326; 257/E27.026

(58) Field of Classification Search
None
See application file for complete search history.

(56) References Cited

U.S. PATENT DOCUMENTS

| | | | |
|---|---|---|---|
| 7,558,141 B2 | 7/2009 | Katsumata et al. | |
| 7,852,675 B2 | 12/2010 | Maejima | |
| 7,910,432 B2 | 3/2011 | Tanaka et al. | |
| 8,394,716 B2* | 3/2013 | Hwang et al. | 438/667 |
| 8,436,414 B2* | 5/2013 | Tanaka et al. | 257/324 |
| 2007/0252201 A1 | 11/2007 | Kito et al. | |
| 2009/0230449 A1* | 9/2009 | Sakaguchi et al. | 257/298 |
| 2009/0230450 A1 | 9/2009 | Shiino et al. | |
| 2009/0278193 A1 | 11/2009 | Murata et al. | |
| 2009/0310425 A1 | 12/2009 | Sim et al. | |
| 2010/0020608 A1* | 1/2010 | Kamigaichi et al. | 365/185.05 |
| 2010/0109071 A1* | 5/2010 | Tanaka et al. | 257/324 |
| 2010/0159657 A1* | 6/2010 | Arai et al. | 438/268 |
| 2010/0195395 A1 | 8/2010 | Jeong et al. | |
| 2010/0202206 A1 | 8/2010 | Seol et al. | |
| 2010/0320526 A1* | 12/2010 | Kidoh et al. | 257/324 |
| 2011/0127597 A1 | 6/2011 | Fukuzumi et al. | |

(Continued)

OTHER PUBLICATIONS

Deng, F., et al., "Salicidation process using NiSi and its device application," J. Appl. Phys., vol. 81, No. 12, Jun. 15, 1997, pp. 8047-8051.

(Continued)

*Primary Examiner* — Benjamin Sandvik
(74) *Attorney, Agent, or Firm* — Vierra Magen Marcus LLP

(57) ABSTRACT

A stacked non-volatile memory cell array include cell areas with rows of vertical columns of NAND cells, and an interconnect area, e.g., midway in the array and extending a length of the array. The interconnect area includes at least one metal silicide interconnect extending between insulation-filled slits, and does not include vertical columns of NAND cells. The metal silicide interconnect can route power and control signals from below the stack to above the stack. The metal silicide interconnect can also be formed in a peripheral region of the substrate. Contact structures can extend from a terraced portion of the interconnect to at least one upper metal layer, above the stack, to complete a conductive path from circuitry below the stack to the upper metal layer. Subarrays can be provided in a plane of the array without word line hook-up and transfer areas between the subarrays.

27 Claims, 44 Drawing Sheets

(56) References Cited

U.S. PATENT DOCUMENTS

| | | | |
|---|---|---|---|
| 2011/0151667 | A1 | 6/2011 | Hwang et al. |
| 2011/0180866 | A1* | 7/2011 | Matsuda et al. ............... 257/324 |
| 2011/0220987 | A1 | 9/2011 | Tanaka et al. |
| 2011/0227158 | A1* | 9/2011 | Zhu ................................ 257/347 |
| 2012/0300547 | A1 | 11/2012 | Choi |
| 2013/0056818 | A1 | 3/2013 | Iino et al. |
| 2014/0097485 | A1 | 4/2014 | Hattori et al. |

OTHER PUBLICATIONS

Aochi, Hideaki, "BiCS Flash as a Future 3D Non-volatile Memory Technology for Ultra High Density Storage Devices," IEEE International Memory Workshop, May 2009, 2 pages.

Hsiao, Yi-Hsuan, et al., "A Critical Examination of 3D Stackable NAND Flash Memory Architectures by Simulation Study of the Scaling Capability," IEEE International Memory Workshop, May 2010, 4 pages.

Ishiduki, Megumi, et al., "Optimal Device Structure for Pipe-shaped BiCS Flash Memory for Ultra High Density Storage Device with Excellent Performance and Reliability," IEEE International Electron Devices Meeting, Dec. 2009, 4 pages.

Katsumata, Ryota, et al., "Pipe-shaped BiCS Flash Memory with 16 Stacked Layers and Multi-Level-Cell Operation for Ultra High Density Storage Devices," Symposium on VLSI Technology Digest of Technical Papers, Jun. 2009, pp. 136-137.

Nitayama, Akihiro, et al., "Bit Cost Scalable (BiCS) Flash Technology for Future Ultra High Density Storage Devices," International Symposium on VLSI Technology Systems and Applications (VLSI-TSA), Apr. 2010, 2 pages.

Tanaka, et al., "Bit Cost Scalable Technology With Punch and Plus Process for Ultra High Density Flash Memory," IEEE Symposium on VLSI Technology, Jun. 1, 2007, pp. 14-15.

International Search Report & The Written Opinion of the International Searching Authority dated Feb. 20, 2013, International Application No. PCT/US2012/065375.

Restriction Requirement dated Jun. 27, 2014, U.S. Appl. No. 13/301,583, filed Nov. 21, 2011.

Response to Restriction Requirement dated Jul. 22, 2014, U.S. Appl. No. 13/301,583, filed Nov. 21, 2011.

Notice of Allowance dated Nov. 7, 2014, U.S. Appl. No. 13/301,583, filed Nov. 21, 2011.

\* cited by examiner

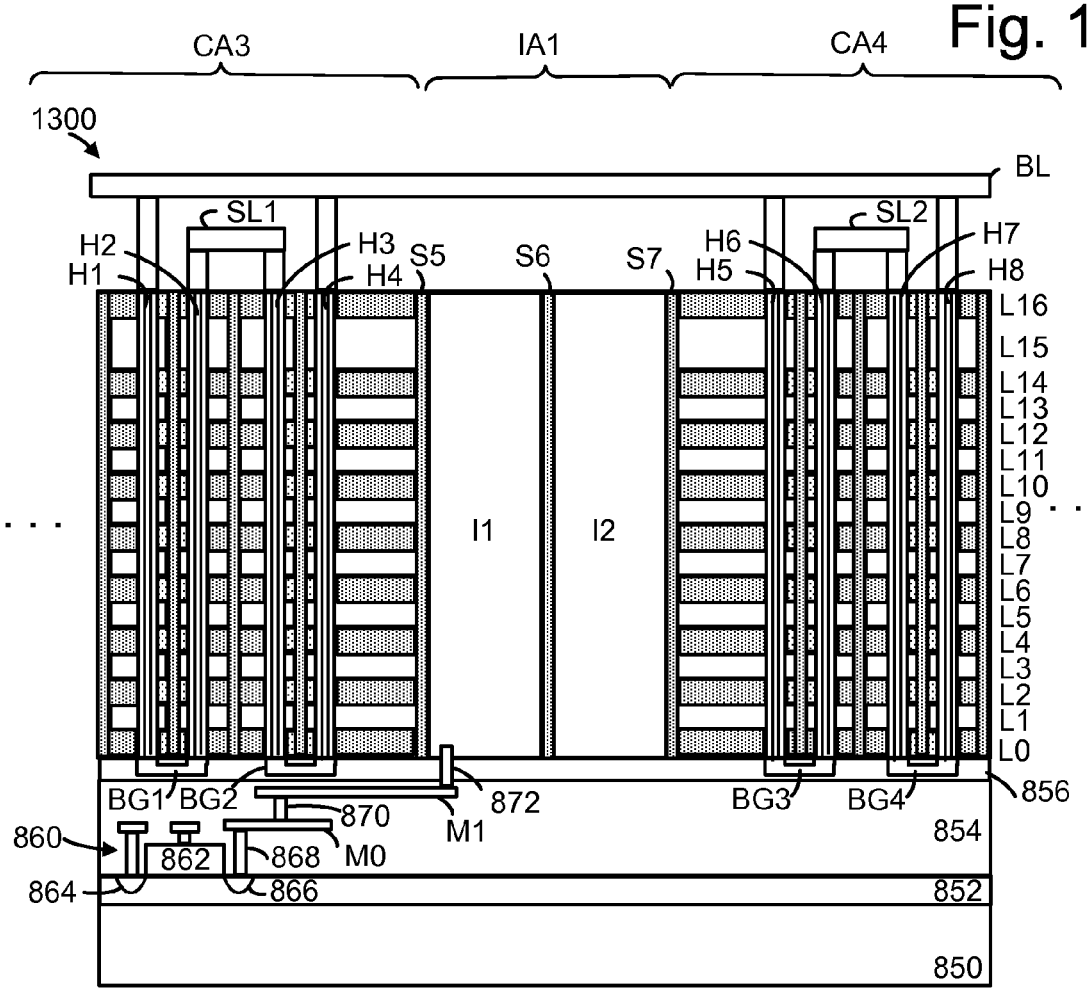

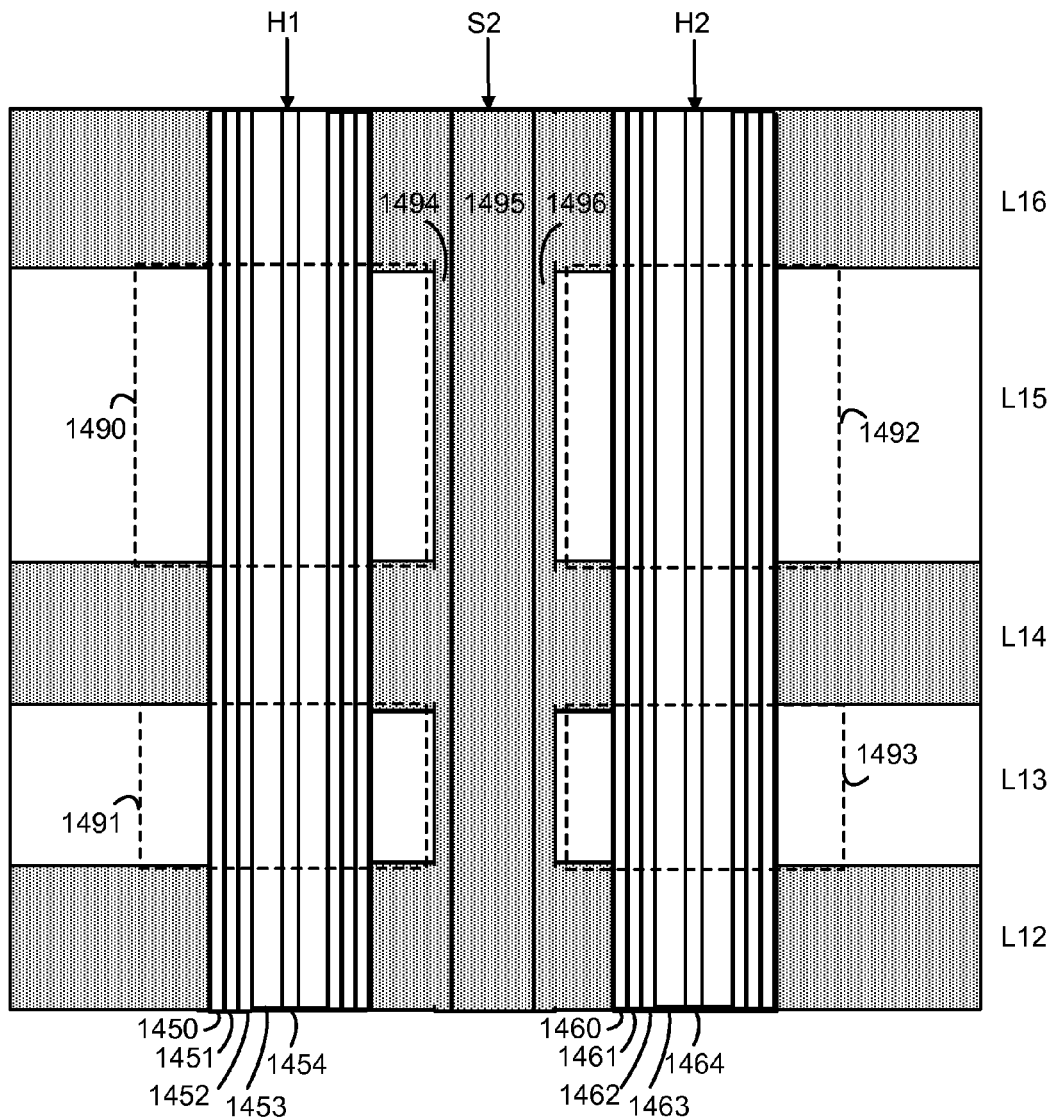
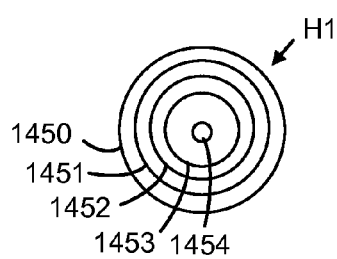
Fig. 14A
Fig. 14B

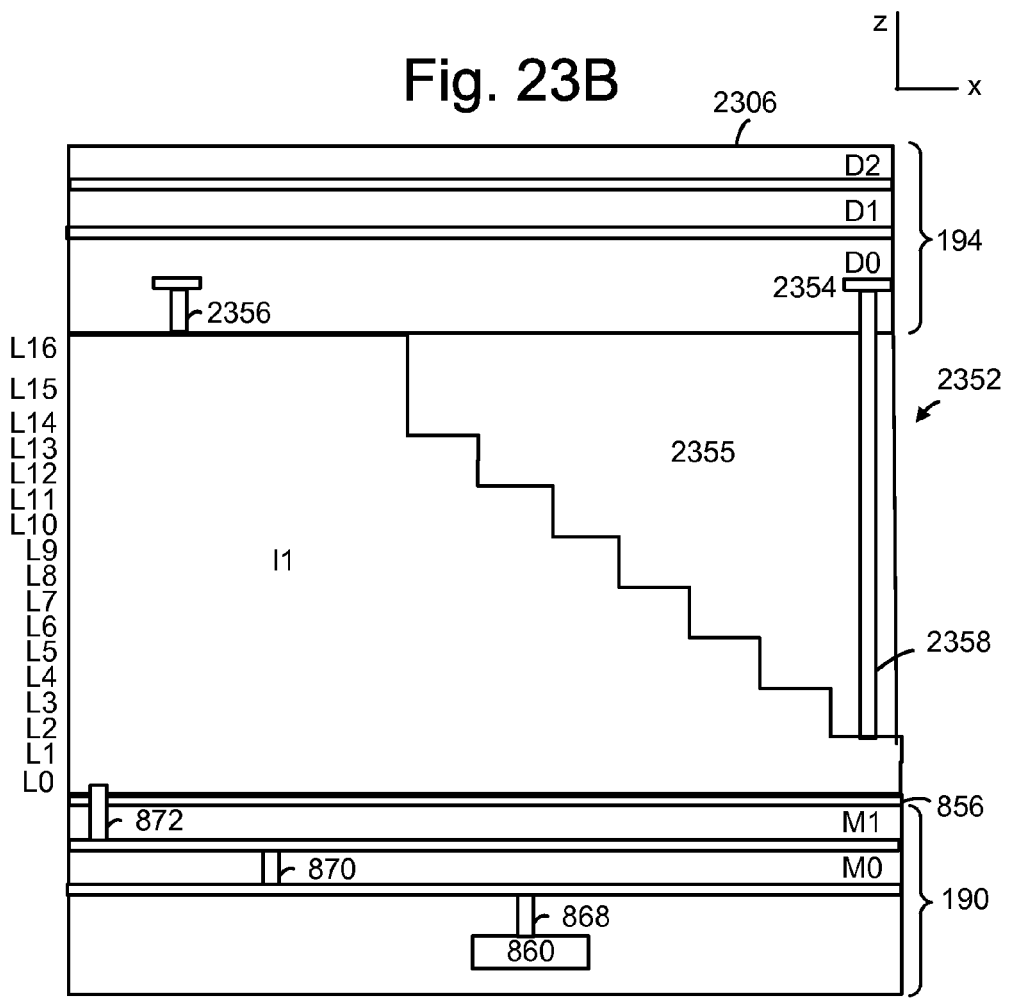

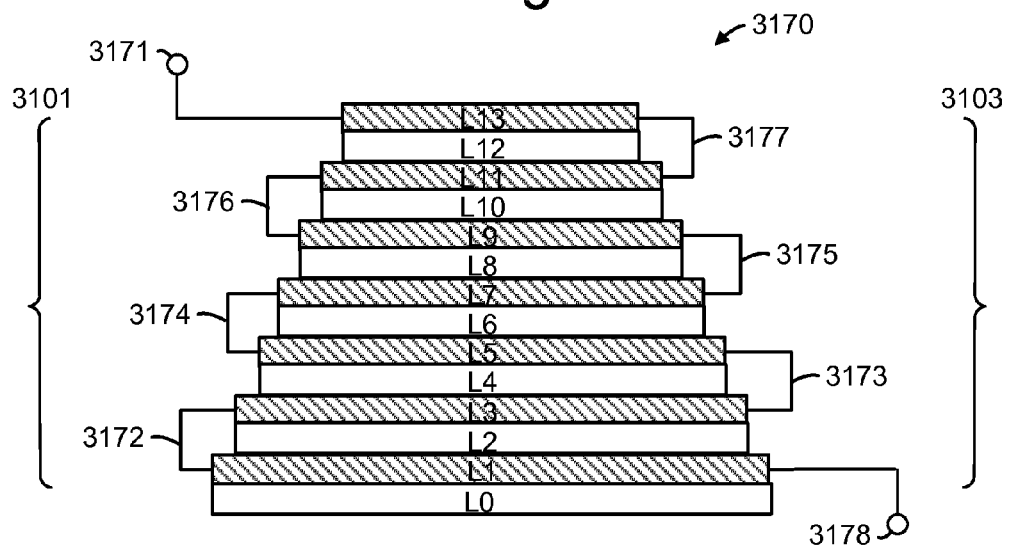
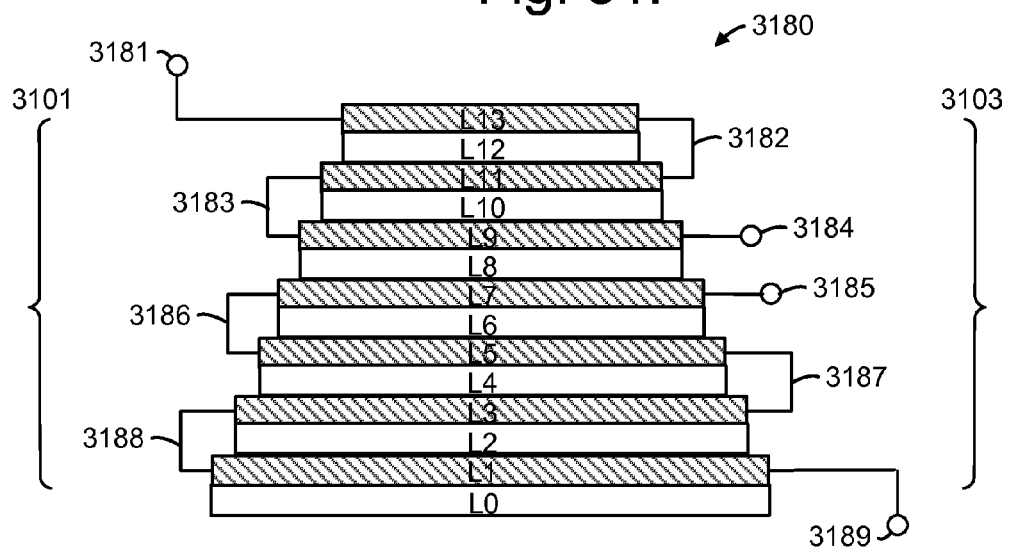

3D NON-VOLATILE MEMORY WITH METAL SILICIDE INTERCONNECT

BACKGROUND

The present technology relates to non-volatile memory.

Recently, ultra high density storage devices have been proposed using a 3D stacked memory structure sometimes referred to as a bit cost scalable (BiCS) architecture. For example, a 3D NAND stackable memory device can be formed from an array of alternating conductive and dielectric layers. A memory hole is drilled in the layers to define many memory layers simultaneously. A NAND string is then formed by filling the memory hole with appropriate materials. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers.

However, there is a continuing need to reduce the size of such memory devices.

BRIEF DESCRIPTION OF THE DRAWINGS

In the drawings, like-numbered elements correspond to one another.

FIG. 13 depicts a layered semiconductor material 1300 which is obtained from the layered semiconductor material 1200 after cleaning out the memory holes in the cell areas CA3 and CA4.

FIG. 14A depicts a layered semiconductor material 1400 which is obtained from the layered semiconductor material 1350 after filling in the memory holes.

FIG. 14B depicts a cross-sectional view of the memory hole H1 of FIG. 14A.

FIG. 23B depicts contact structures of the terraced portion 2352 of the cell area CA3 of FIG. 23A.

FIG. 31E depicts one embodiment of a passive device as a resistor formed by a stack of alternating layers of a conductive material and a dielectric material.

FIG. 31F depicts one embodiment of a passive device 3158 as two resistors formed by a stack of alternating layers of a conductive material and a dielectric material.

DETAILED DESCRIPTION

A 3D stacked non-volatile memory device includes various types of circuitry for providing power and control signals in the device. Typically, the circuitry is provided under a stacked non-volatile memory cell array which is carried by the substrate, and in a peripheral area of the substrate, lateral of the stacked non-volatile memory cell array. One or more lower metal layers are provided below the stacked non-volatile memory cell array, one or more upper metal layers are provided above the stacked non-volatile memory cell array, and connections are made between the lower and upper metal layers to route the signals. In one aspect, techniques and structures are provided which allow the lower and upper metal layers to be connected in a space-efficient manner. In another aspect, passive devices such as resistors and capacitors are formed in the peripheral region in a space-efficient manner.

Figure 1A:
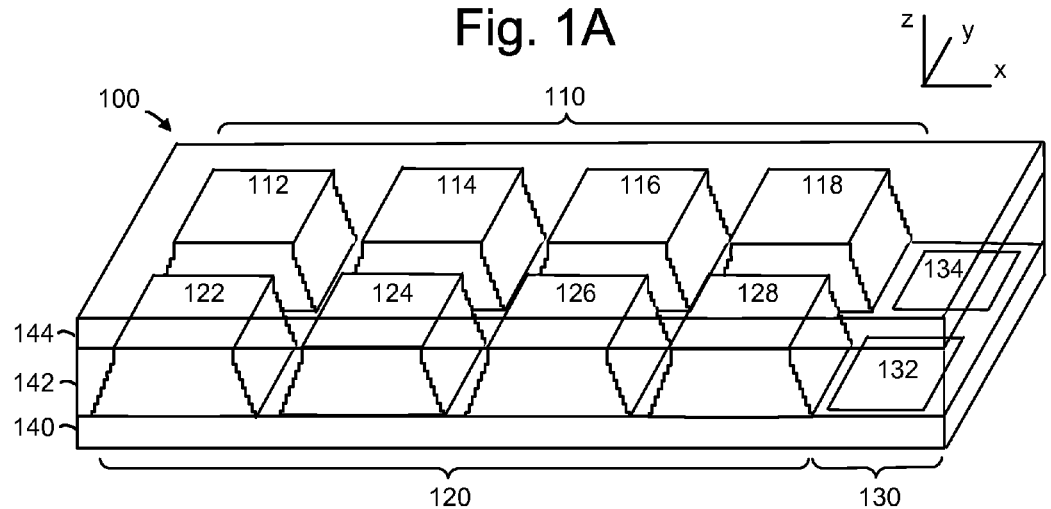
FIG. 1A is a perspective view of a 3D stacked non-volatile memory device 100 in which a plane of memory cells is arranged in separate subarrays.

FIG. 1A is a perspective view of a 3D stacked non-volatile memory device 100 in which a plane of memory cells is arranged in separate subarrays. In the memory device 100, a substrate 140 carries an example plane 110 of memory cells in subarrays 112, 114, 116 and 118, an example plane 120 of memory cells in subarrays 122, 124, 126 and 128, and a peripheral area 130 with peripheral regions 132 and 134 which include circuitry for use by the subarrays. The substrate 140 can also carry circuitry under the subarrays, along with one or more lower metal layers which are patterned in conductive paths to carry signals of the circuitry. A plane could be associated with a common substrate region such as a p-well.

If there is no peripheral circuitry under array, there is no need to form wells in the substrate. On the other hand, if some peripheral circuits are placed under the array, the configuration of wells should correspond to transistors and other elements in those circuits. For instance, NMOS transistors are typically placed in a p-well, and PMOS transistors are placed in an n-well. Some NMOS transistors can be placed directly in the silicon substrate, which is typically p-type. A triple-well could also be used, e.g., a p-well placed inside an n-well, in a p-substrate. An NMOS transistor can be placed in such triple-well. An advantage of a triple-well is that the bias can be easily supplied to the transistor body, if necessary, e.g., a p-well can be biased for an NMOS that is placed in the triple-well.

The subarrays are formed in an intermediate region 142 of the memory device. In an upper region 144 of the memory device, one or more upper metal layers are patterned in conductive paths to carry signals of the circuitry. Each subarray comprises a stacked area of memory cells, where alternating levels of the stack represent word lines. In one possible approach, each subarray has opposing tiered sides from which vertical contacts extend upward to an upper metal layer. Additionally, a gap between each subarray is a hook up area which allows vertical contacts to extend upward from the substrate to an upper metal layer. The gap is also a word line transfer area which allows word line segments in different subarrays to be connected. The space in the word line hookup and transfer area can also be used to carry signals from under to over array, by high aspect ratio vias, connecting metal wiring under array to metal wiring over array. For instance, if sense amplifier is placed under array, the space can be used to carry power signals, such as VDDSA, SRCGND (source ground), VSS and so forth.

The one or more lower metal layers extend at a height which is below a height of a bottom layer of each subarray, and the one or more upper metal layers extend at a height which is above a height of a top layer of each subarray.

In one possible approach, the length of the plane, in the x-direction, represents a direction in which signal paths to word lines extend in the one or more upper metal layers, and the width of the plane, in the y-direction, represents a direction in which bit lines extend in the one or more upper metal layers. Source lines may also extend in the x-direction. The z-direction represents a height of the memory device 100.

A drawback of this approach is the space on the memory device which is consumed between subarrays.

Figure 1B:
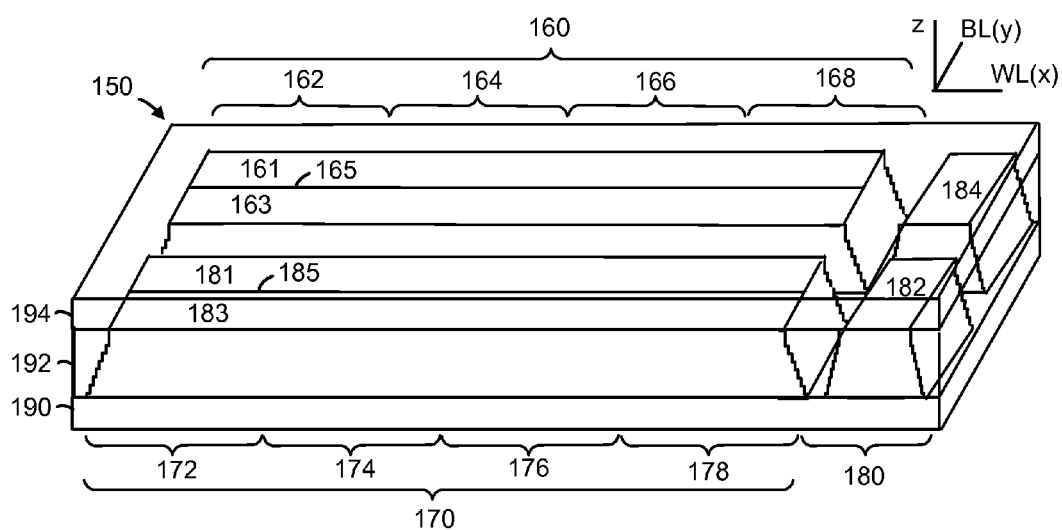
FIG. 1B is a perspective view of a 3D stacked non-volatile memory device 150 in which a plane of memory cells is arranged in contiguous subarrays.

FIG. 1B is a perspective view of a 3D stacked non-volatile memory device 150 in which a plane of memory cells is arranged in contiguous subarrays. In the memory device 150, a substrate 190 carries an example plane 170 of memory cells which can include undivided subarrays, 172, 174, 176 and 178, for instance, where space is saved due to the lack of gaps between subarrays. A subarray can be a portion of a memory array which uses common circuitry and/or control or power signals. In one approach, multiple subarrays in a plane have common word line signals, but have different sets of bit line and sense amplifier signals. A plane could alternatively have only one subarray.

Alternatively, divided subarrays as in FIG. 1A can be used with the techniques described herein. One reason to divide a plane into subarrays is to reduce capacitive loading, since a very long word line can have a high capacitance, resulting in higher capacitive loading and RC delay. Divided subarrays also provide gaps as mentioned for connections from under to over array, which can be used in addition to the interconnects and other structures discussed herein.

In another approach, the plane 170 does not include subarrays, but includes a stack of cells which use common circuitry and/or control or power signals. Similarly, an example plane 160 of memory cells includes subarrays 162, 164, 166 and 168. A peripheral area 180 includes peripheral regions 182 and 184. In practice, peripheral regions can extend on one or more sides of a 3D stacked memory array which comprises one or more planes such as planes 160 and 170. For simplicity, the peripheral area 180 is depicted on one side of the 3D stacked memory array.

The planes are formed in an intermediate region 192 of the memory device. In an upper region 194 of the memory device, one or more upper metal layers are patterned in conductive paths to carry signals of the circuitry. The upper and lower metal layers may be considered to be wiring layers. In one possible approach, each plane, rather than each subarray, has opposing tiered sides from which vertical contacts extend upward to an upper metal layer. There is no gap between subarrays which allows vertical contacts to extend upward from the substrate to an upper metal layer. Instead, one or more conductive interconnects are provided as described herein which provide an electrical connection between the one or more lower metal layers and the one or more upper metal layers. The conductive interconnects are fabricated in the stack or plane itself to connect circuitry in the substrate 190 to signal lines in the one or more upper metal layers.

Each array can further include one or more blocks, which are portions of the array arranged laterally of one another, e.g., in the bit line direction (y-direction). The blocks are insulated from one another by insulation-filled dividers/slits. For example, array 160 includes blocks 161 and 163 separated by divider 165, and array 170 includes blocks 181 and 183 separated by divider 185.

Figure 2A:
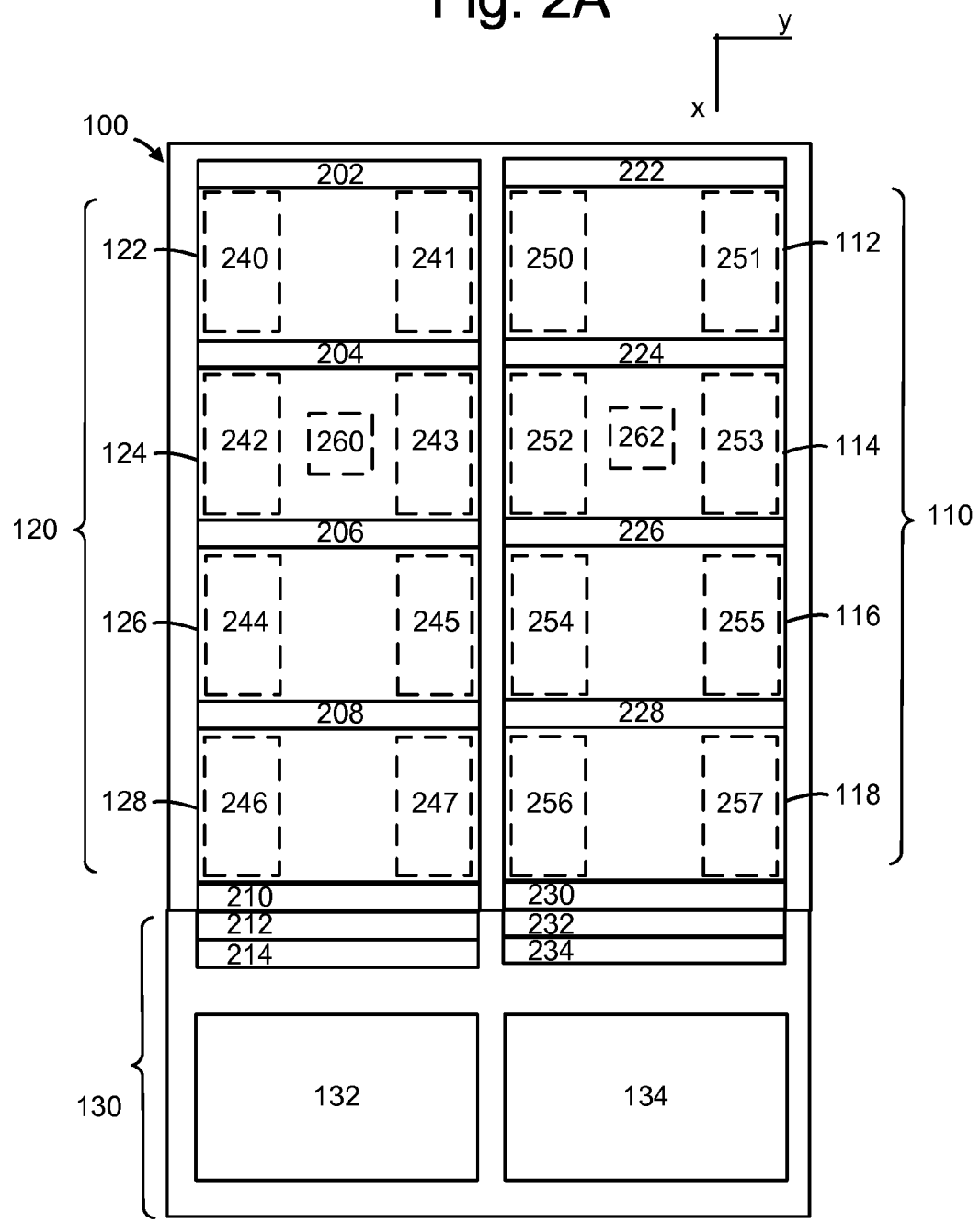
FIG. 2A depicts a top view of the 3D stacked non-volatile memory device 100 of FIG. 1A.

FIG. 2A depicts a top view of the 3D stacked non-volatile memory device 100 of FIG. 1A. Like-numbered elements correspond to one another in the different figures. Each subarray can include sense amplifier circuitry, for instance, which is used for read and verify operations of the memory cells in the subarray. The sense amplifier circuitry can include, e.g., latches, processing circuitry and bit line hookups. The sense amplifier circuitry can provide signals such as Vdd, source ground and Vss. In one approach, the sense amplifier circuitry is provided on opposing sides of each subarray, in a double-sided configuration. For example, in the plane 120, subarrays 122, 124, 126 and 128 include sense amplifier circuitry 240 and 241; 242 and 243; 244 and 245; and 246 and 247, respectively.

The plane 120 can include column circuitry 260 as well, which is under the subarray 124 in this example. Regions 202, 204, 206, 208 and 210 are hook up areas where contacts can be fabricated to extend upward to the one or more metal layers, for instance. For example, a lower metal layer such as M0 can be connected to an upper metal layer such as D2. In one approach, of the lower metal layers, M0 is below M1, and of the upper metal layers, D0 is below D1 and D1 is below D2. Regions 204, 206 and 208 are also word line transfer areas in which signal paths for word lines can be joined among the different subarrays. In this approach, a set of word lines extends in segments across the subarrays, with word line hook-up and transfer areas between the subarrays.

One advantage of separating the plane into subarrays is to provide greater flexibility to configure power busses/connections for sense amplifiers.

These regions are also gaps between the subarrays. In the peripheral area 130, a region 212 may be used for providing vertical contact structures between a source line driver in the substrate and corresponding signals paths in the one or more upper metal layers. A region 214 may be used for providing vertical contact structures between row and column core drivers and corresponding signals paths in the one or more upper metal layers. The row and column core drivers may provide signals, e.g., for source ground and a bit line driver. The region 132 may include other circuitry, e.g., for use by the plane 120.

Similarly, in the plane 110, subarrays 112, 114, 116 and 118 include sense amplifier circuitry 250 and 251; 252 and 253; 254 and 255; and 256 and 257, respectively. The plane 110 can include column circuitry 262 as well, which is under the subarray 114 in this example. Regions 222, 224, 226, 228 and 230 are hook up areas where contacts can be fabricated to extend upward to the one or more metal layers, for instance. Regions 224, 226 and 228 are also word line transfer areas in which signal paths for word lines can be joined between the different subarrays. These regions are also gaps between the subarrays.

In the peripheral area 130, a region 232 may be used for providing vertical contact structures between a source line driver in the substrate and corresponding signals paths in the one or more upper metal layers. A region 234 may be used for providing vertical contact structures between row and column core drivers and corresponding signals paths in the one or more upper metal layers. The region 134 may include other circuitry, e.g., for use by the plane 110. The regions 204, 206 and 208, and 224, 226 and 228 may consume about 10% of the area of the overall memory array area. The memory array may include, e.g., the set of one or more arrays on the memory device chip.

Although some circuitry is provided directly under the plane and subarrays, a significant amount of circuitry is provided in a peripheral region. This circuitry includes high voltage transistors. The area of the substrate directly under the plane and subarrays has not been used for this circuitry due to the difficulty in making power connections to the upper metal layers. These problems are addressed by an interconnect as described herein.

Figure 2B:
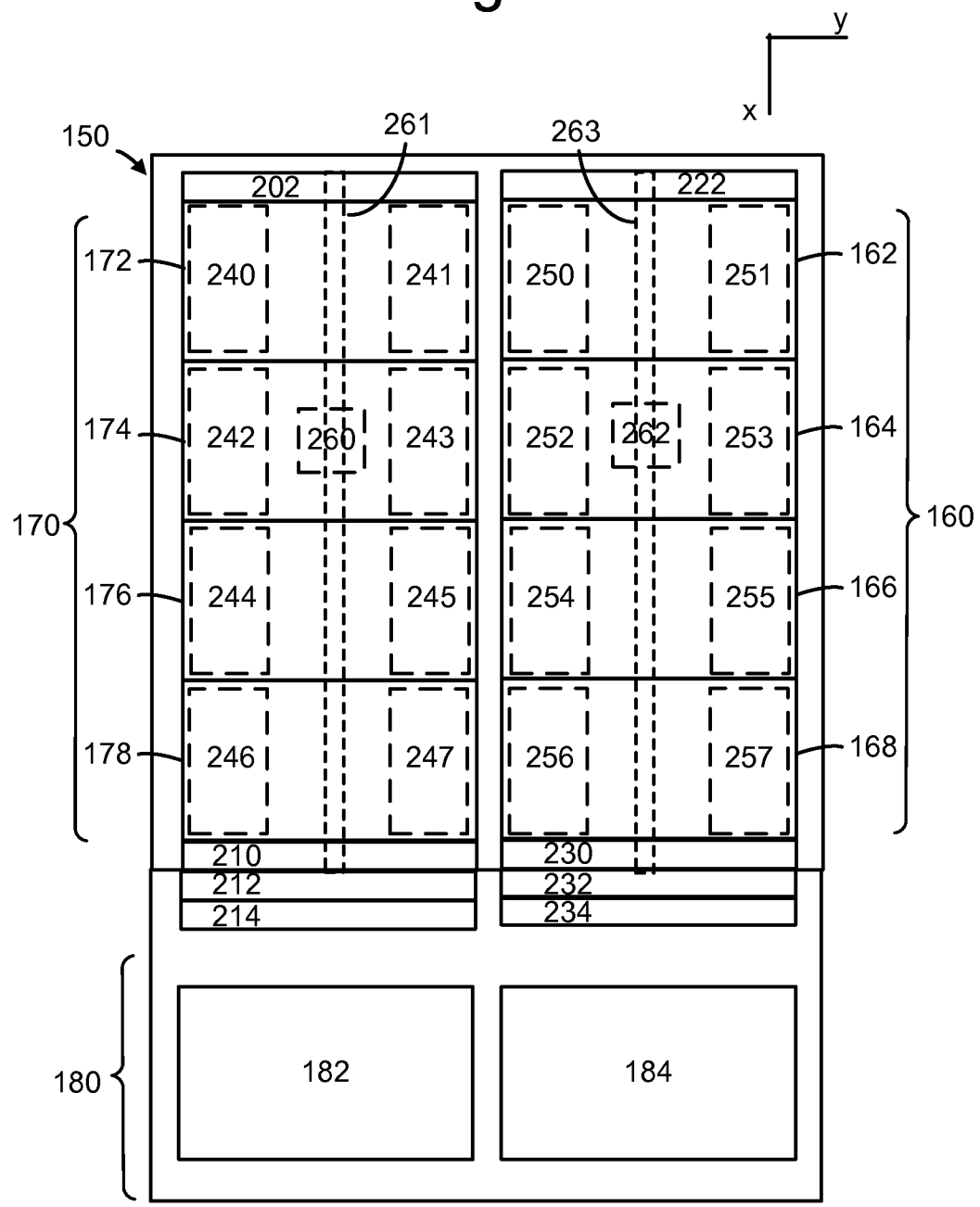
FIG. 2B depicts a top view of the 3D stacked non-volatile memory device 150 of FIG. 1B.

FIG. 2B depicts a top view of the 3D stacked non-volatile memory device 150 of FIG. 1B. The memory device 150 differs from the memory device 100 in that the regions 204, 206 and 208, and 224, 226 and 228 are not present, so that the area consumed by the memory device is reduced. Further, in the plane 170, an in-plane interconnect area 261 is provided which extends along a length of the plane, and can be located midway across the y-direction width of the plane or otherwise in the plane 170, e.g., intermediate to the edges of the plane, or at the edge of the plane. Similarly, in the plane 160, an interconnect area 263 is provided which extends along a length of the plane.

Figure 3:
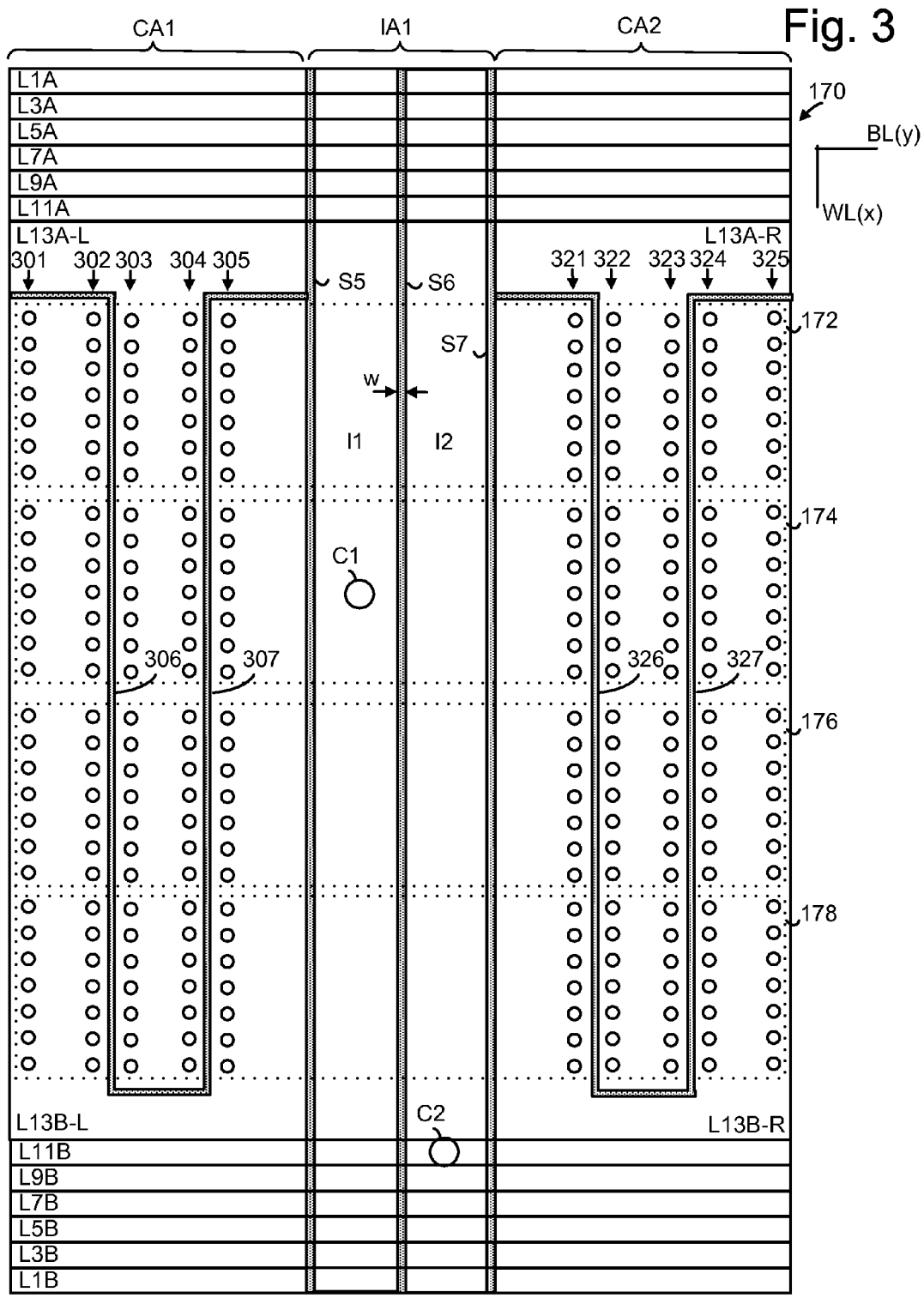
FIG. 3 depicts a top view of one embodiment of the plane 170 of the 3D stacked non-volatile memory device 150 of FIG. 1B, showing at least one interconnect area having two interconnects and at least one cell area having four subarray regions.

FIG. 3 depicts a top view of one embodiment of the plane 170 of the 3D stacked non-volatile memory device 150 of FIG. 1B, showing at least one interconnect area IA1 having two interconnects I1 and I2 (e.g., interconnect structures) and at least one cell area (memory cell areas CA1 and CA2 at left and right hand portions, respectively, of the plane) having four subarray regions 172, 174, 176 and 178. The two interconnects I1 and I2 can comprise a conductive material such as metal silicide, and are separated from one another by an insulation-filled slit S6. In one approach, the interconnects essentially consist of metal silicide. The interconnect I1 is separated from the cell area CA1 by an insulation-filled slit S5, and the interconnect I2 is separated from the cell area CA2 by an insulation-filled slit S7. An example contact structure C1, e.g., a contact plug, touches and extends upward from the interconnect I1 at a top surface of the interconnect area I1 which is not at a terraced or stepped portion of the interconnect area IA1. In contrast, an example contact structure C2 touches and extends upward from the interconnect I1 at the terraced portion of the interconnect area IA1. The contact structure can comprise, e.g., metal or another conductive material such as heavily doped polysilicon (poly).

If adjacent interconnects, e.g., I1 and I2, are biased differently, the applicable potential difference between them can be accounted for in the choice of the width of the insulation filled slit S6 used to separate them, to control leakage between them, and/or prevent dielectric breakdown. That is, the higher the potential difference between adjacent interconnects, the greater the width (w) of the slit. Thus, one of the insulation-filled slits of the at least one interconnect area has a width based on, e.g., in proportion to, a potential difference between adjacent metal silicide interconnects in the at least one interconnect area. The potential or voltage difference refers to a difference between: a voltage across one of the metal silicide interconnects, and a voltage across another, adjacent metal silicide interconnect. The voltage across one of the metal silicide interconnects may be a difference between a potential at an upper metal layer which contacts the interconnect and a potential at a lower metal layer which contacts the interconnect.

The contact structures can be placed in any convenient location on an interconnect, and can be created using a contact mask. The contact structures can comprise metal, for instance, and can extend upward from the interconnects to the one or more upper metal layers. To control contact resistance, and improve contact yield, one or more contacts such as C1 can be placed on top of an interconnect, e.g., on the flat surface of the interconnect which is not part of the tiered portion of the array, and/or one or more contacts such as C2 can be used.

Bottom portions of the interconnects can be connected to one or more lower metal layers by an appropriate contact structure, as discussed further below. Multiple interconnects can be provided which are adjacent to one another, as shown here, or non-adjacent.

The interconnect allows elimination of the transfer and hook-up areas between subarrays by providing a different and effective way for sense amplifier and power connections to be made to an upper metal layer. The interconnect is a "string" of multiple layer word lines that forms a "poly stack wire" placed, e.g., in the middle of a plane, e.g., partway across the plane, separating the plane into at least two regions, or in other areas of the chip. In one embodiment, the interconnect is formed using word line plates and in-between poly plates intrinsically connected by silicidation, thus forming and reducing the resistance of the effective multi-layer word line stack wire. The bottom of the interconnect is connected to under-array metal layers such as M1. Thus, the interconnect allows immediate connection to under the array. As an additional benefit, it allows placing high-voltage transistor circuitry with a large number of high-voltage transistors (e.g. for cell source discharge, charge pumps, etc.) directly under the array, thus reducing the required peripheral area.

It is also possible to connect multiple interconnects in parallel to further reduce resistance.

The slits can be from about tens to hundreds of nanometers in width, for instance and spaced apart by an equal or greater distance than the width, in one approach. Each slit can run the full length and height of the plane. The slits can be formed periodically and uniformly across the width of the plane. For interconnects, their width and frequency of placement can be different. Their size and density should satisfy lithography (and printability) requirements, etch capabilities, and so forth.

The plane is a stacked structure which includes alternating layers L0 to L13 of a conductive material and a dielectric material. For example, layers L1, L3, L5, L7, L9, L11 and L13 can be layers of a conductive material, and layers L0, L2, L4, L6, L8, L10, L12 and L14 (shown further below) can be layers of a dielectric material. An additional conductive layer L15 and dielectric layer L16 can also be used. L0 and L16 can be considered to be bottom and top layers of the stack, although additional layers could be provided. Further, in this example, the cell areas CA1 and CA2 have corresponding slit patterns. A slit refers, e.g., to a void which extends vertically in the stack of the plane, typically from an etch stop layer at the bottom to at least a top layer of the stack. The slit can extend down to the etch stop layer. The slit can be filled with insulation in the completed memory device. A slit can have a generally uniform cross-section or a varying cross-section, such as a cross-section which is wider at the top than the bottom. The slit pattern of cell area CA1 includes parallel slits 306 and 307, and the slit pattern of cell area CA2 includes parallel slits 326 and 327. Essentially, a single continuous slit extends in a zig-zag or comb pattern in each cell area so that the stack is divided into two portions in each cell area. For example, layer L13A-L represents a first portion of the left hand cell area CA1, layer L13B-L represents a second portion of the left hand cell area CA1, layer L13A-R represents a first portion of the right hand cell area CA2, and layer L13B-R represents a second portion of the right hand cell area CA2. This approach provides greater flexibility in controlling the memory cells.

Slits and holes are examples of voids.

Each cell area includes rows of columnar, e.g., vertical, memory holes. The memory holes extend vertically and include memory cells such as in a vertical NAND string. For example, cell area CA1 includes rows 301 to 305 of memory holes, and cell area CA2 includes rows 321 to 325 of memory holes. Each hole is represented by a circle. The memory holes can be arranged in the different subarrays 172, 174, 176 and 178, for instance. Due to the slit patterns, the rows 301, 302 and 305 are in contact with the layer L13A-L, the rows 303 and 304 are in contact with the layer L13B-L, the rows 321, 324 and 325 are in contact with the layer L13A-R, and the rows 322 and 323 are in contact with the layer L13A-L.

Figure 4:
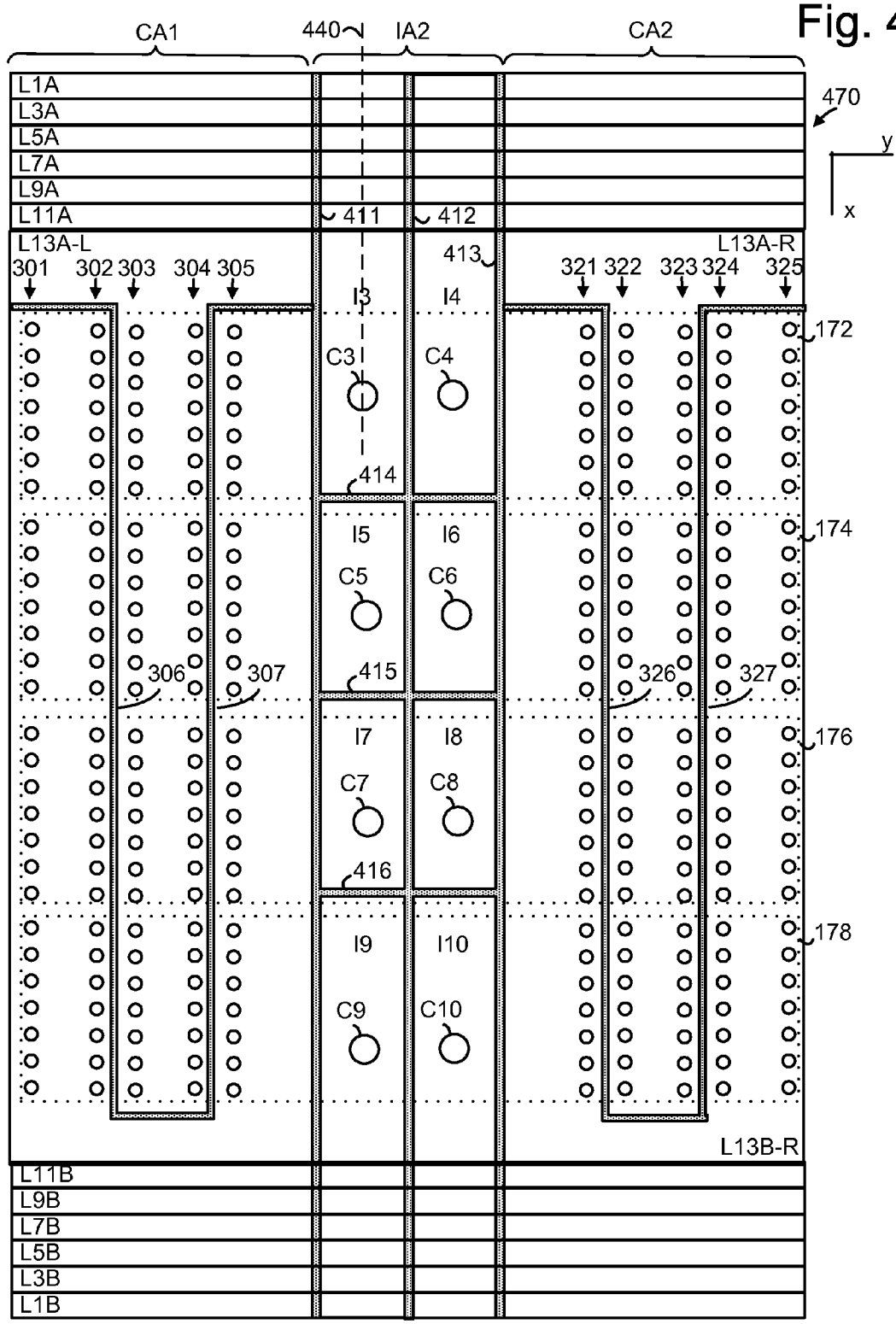
FIG. 4 depicts a top view of a plane 470 of the 3D stacked non-volatile memory device 150 of FIG. 1B, showing at least one interconnect area having eight interconnects and at least one cell area having four subarray regions.
Figure 5:
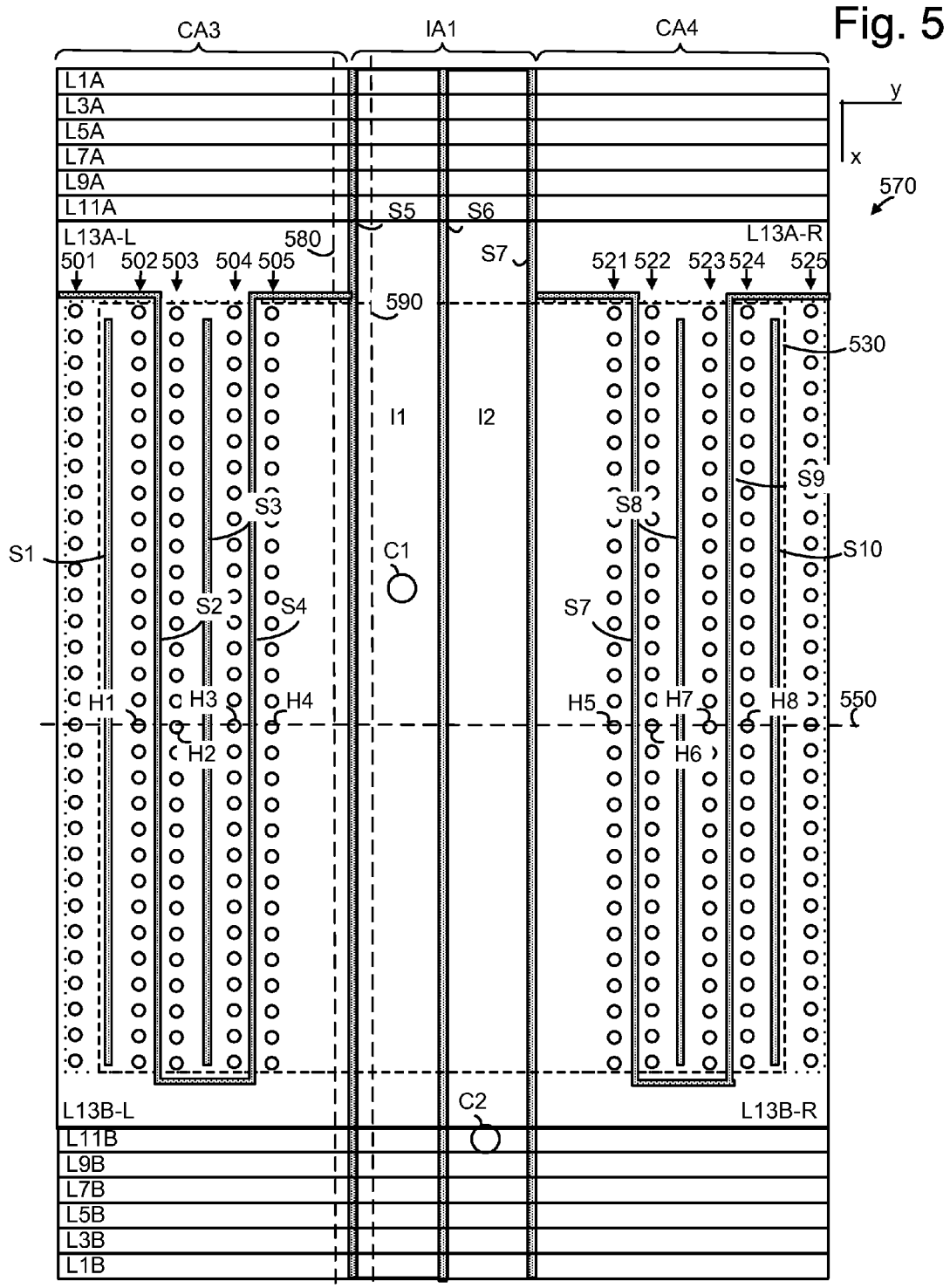
FIG. 5 depicts a top view of one embodiment of a plane 570 of the 3D stacked non-volatile memory device 150 of FIG. 1B, showing at least one interconnect area having two interconnects.

Each column of holes can be separated by a slit, e.g., the slit is placed between memory holes belonging to the same NAND or BiCS string, and between memory holes of adjacent strings, such as in FIG. 5. In one approach (see FIGS. 3 and 4), the slit is placed between memory holes of the same string, but not between memory holes of adjacent strings. The memory strings in the cell area CA1 can belong to one block while the memory strings in the cell area CA2 belong to another block. Each cell area can have separate connections in a hook up region. With a comb-like slit pattern, as shown, each block connection can be made on opposing sides (top and bottom) of a block. For example, for 25 layers of word line, there can be 25 connections in a top hook up region 25 in a bottom hook up region. As an example, a block can have, e.g., 8, 12 or 16 memory strings. Additionally, connections can be provided for select gate transistors and back gates.

The figure represents a simplification, as many more rows of memory holes will typically be used, extending to the right and left in the figure. Also, the figures are not necessarily to scale. The width of the at least one interconnect area can be relatively very small compared to a width of the plane.

FIG. 4 depicts a top view of a plane 470 of the 3D stacked non-volatile memory device 150 of FIG. 1B, showing at least one interconnect area IA2 having eight interconnects 13 to 110, and at least one cell area (CA1 and CA2) having four subarray regions. Here, insulation-filled slits 411, 412 and 413 extend parallel to one another in the x-direction, while in the transverse y-direction, insulation-filled slits 414, 415, 416 and 417 extend parallel to one another. This grid of insulation-filled slits results in the eight interconnects which are electrically isolated from one another and can therefore serve as separate conductive paths from below to above the stack. Example contacts structures C3 to C10 are provided for the interconnects 13 to 110, respectively.

The slits 411 and 412 are a pair of parallel insulation-filled slits and the slit 414 is at least one transverse insulation-filled slit which extends transversely to the pair of parallel insulation-filled slits. At least one metal silicide interconnect comprises one region 13 of metal silicide on one side of the at least one transverse insulation-filled slit, and another region 15 of metal silicide on another side of the at least one transverse insulation-filled slit. The one region of metal silicide on the one side of the at least one transverse insulation-filled slit and the another region of metal silicide on the another side of the at least one transverse insulation-filled slit, connect respective contact structures C3 and C5 of at least one lower metal layer M0, M1 to respective portions of the at least one upper metal layer. See FIG. 23C for a cross-sectional view along line 440.

There can be one or multiple interconnects extending vertically in the array, and one or multiple contacts can be provided for each interconnect.

FIG. 5 depicts a top view of one embodiment of a plane 570 of the 3D stacked non-volatile memory device 150 of FIG. 1B, showing at least one interconnect area IA1 having two interconnects I1 and I2 and at least one cell area (cell areas CA3 and CA4). This arrangement is similar to that of FIG. 3 except that one subarray of memory holes is provided. The memory holes are provided in rows 501 to 505 in the cell area CA3, and in rows 521 to 525 in the cell area CA4. The slit pattern in the cell area CA3 includes slits 51 to S4, and the slit pattern in the cell area CA4 includes slits S7 to S10.

Note that the memory holes can be in a regular grid, or the rows can be offset relative to one another, e.g., in the x direction. In on approach, the at least one interconnect area does not comprise vertical columns of NAND cells, or any memory cells.

Figure 8:
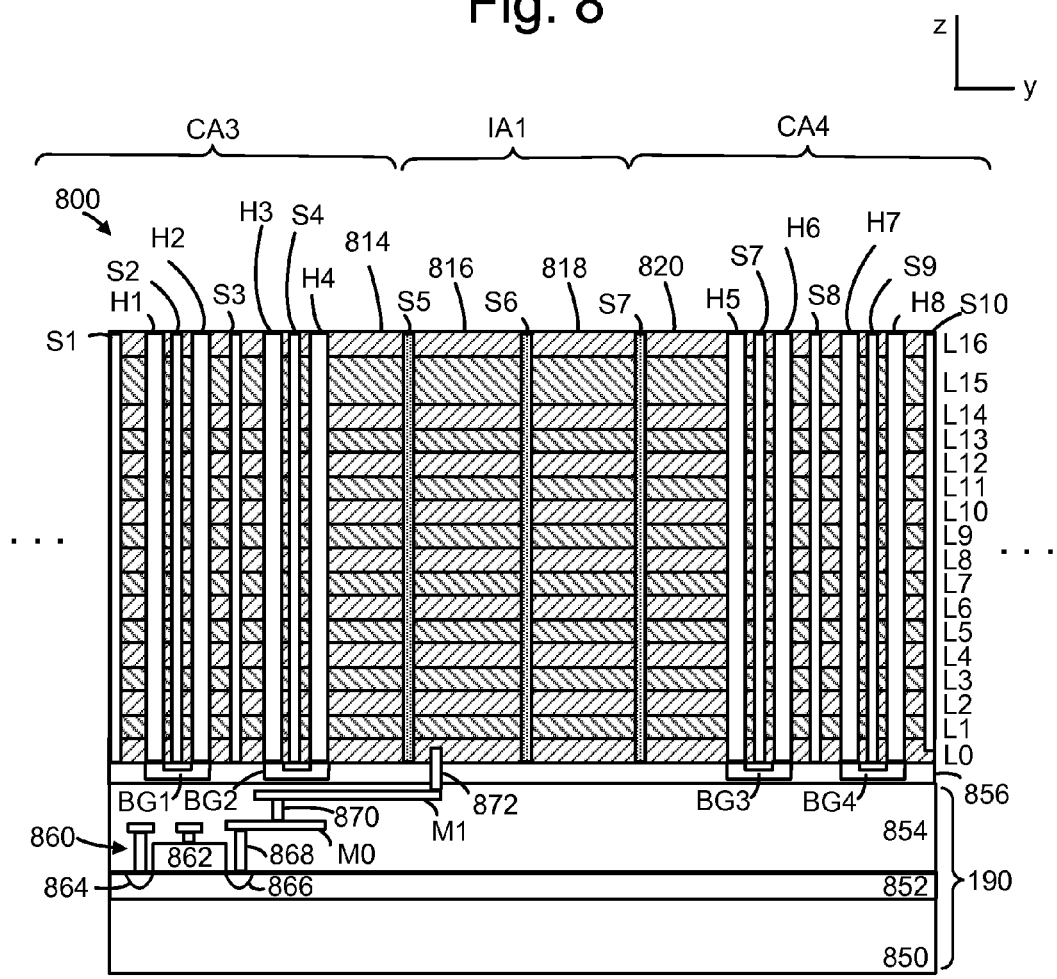
FIG. 8 depicts a layered semiconductor material 800 which is consistent with a cross-sectional view of the region 530 of the 3D stacked non-volatile memory device of FIG. 5 along the line 550, showing slits and memory holes in the cell areas CA3 and CA4, and slits in the interconnect area IA1.

A cross-sectional view of the plane 570 along line 550 is provided in FIG. 8. This cross-section includes example memory holes H1 to H4 in CA3 and H5 to H8 in CA4. A cross-sectional view of the plane 570 along line 580 is provided in FIG. 22A. This cross-section includes a portion of the cell area CA3 which does not include memory holes. A cross-sectional view of the interconnect I1 of the plane 570 along line 590 is provided in FIG. 23A.

In the slit pattern of FIG. 4, a slit is provided between every two rows of memory holes. In the slit pattern of FIG. 5, a slit is provided between every row of memory holes. In one approach, pairs of memory holes and their vertical columns of memory cells are joined, such as in a U-shaped NAND string configuration, and bisected by a slit. For example, memory holes H1 and H2 may each contain a vertical column of memory cells, where the vertical columns of memory cells are connected by a back gate below the stack, and bisected by S2. The slit S2 insulates the word line layers which include memory holes H1 and H2 from each other so that they may be separately controlled by their respective word line plates, e.g., L13B-L can provide control signals to a control gate of a memory cell associated with the memory hole H1, and L13A-L can provide control signals to a control gate of a memory cell associated with the memory hole H2. A slit thus can bisect rows of memory holes which are the two branches or legs of U-shaped NAND strings. In another case, a slit is provided between rows of memory holes of straight NAND strings. The slit pattern extends to each layer of the stack.

Figure 6:
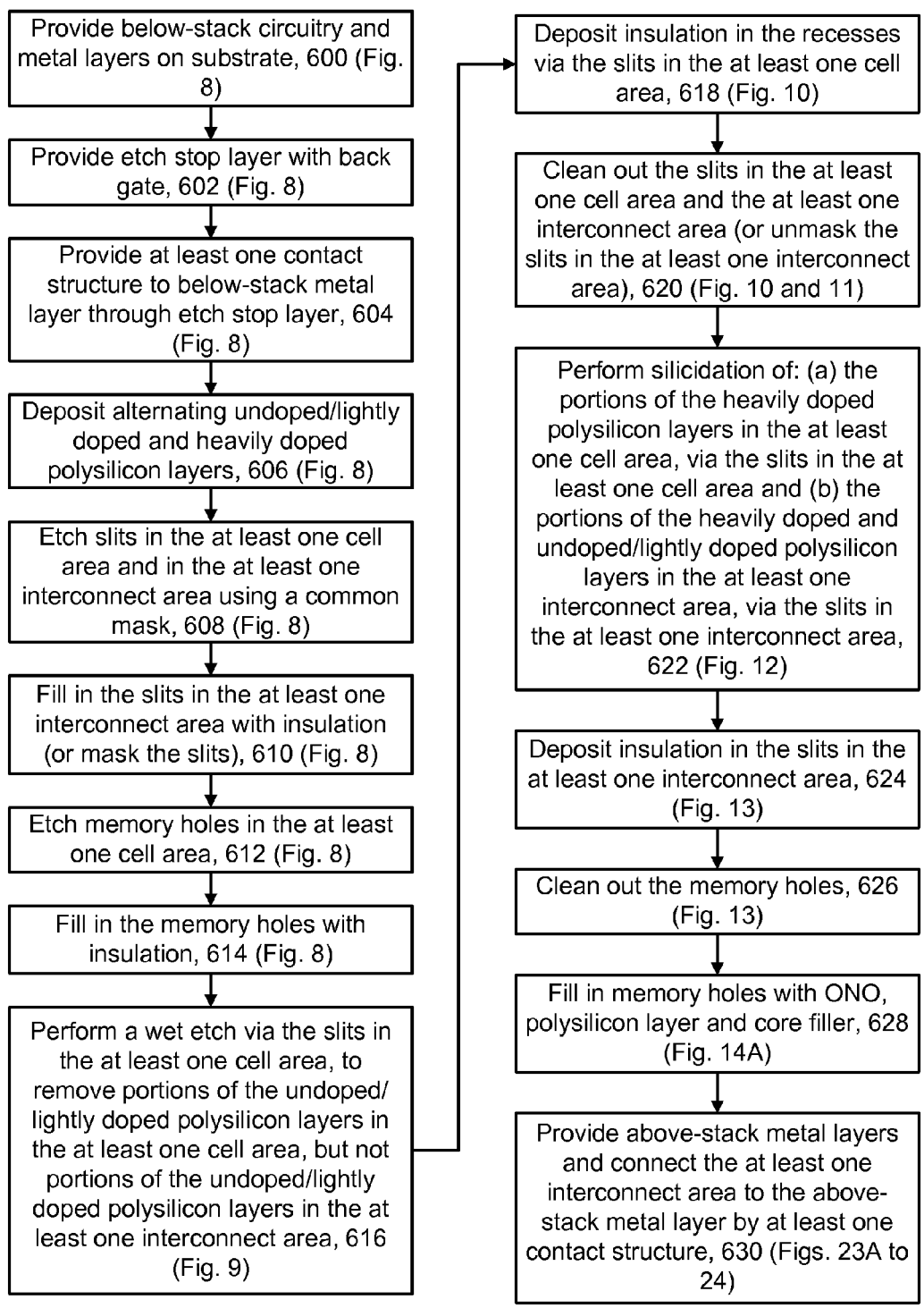
FIG. 6 depicts a method for fabricating a 3D stacked non-volatile memory device according to the structures of FIGS. 8-14B, where a wet etch is performed via slits.
Figure 9:
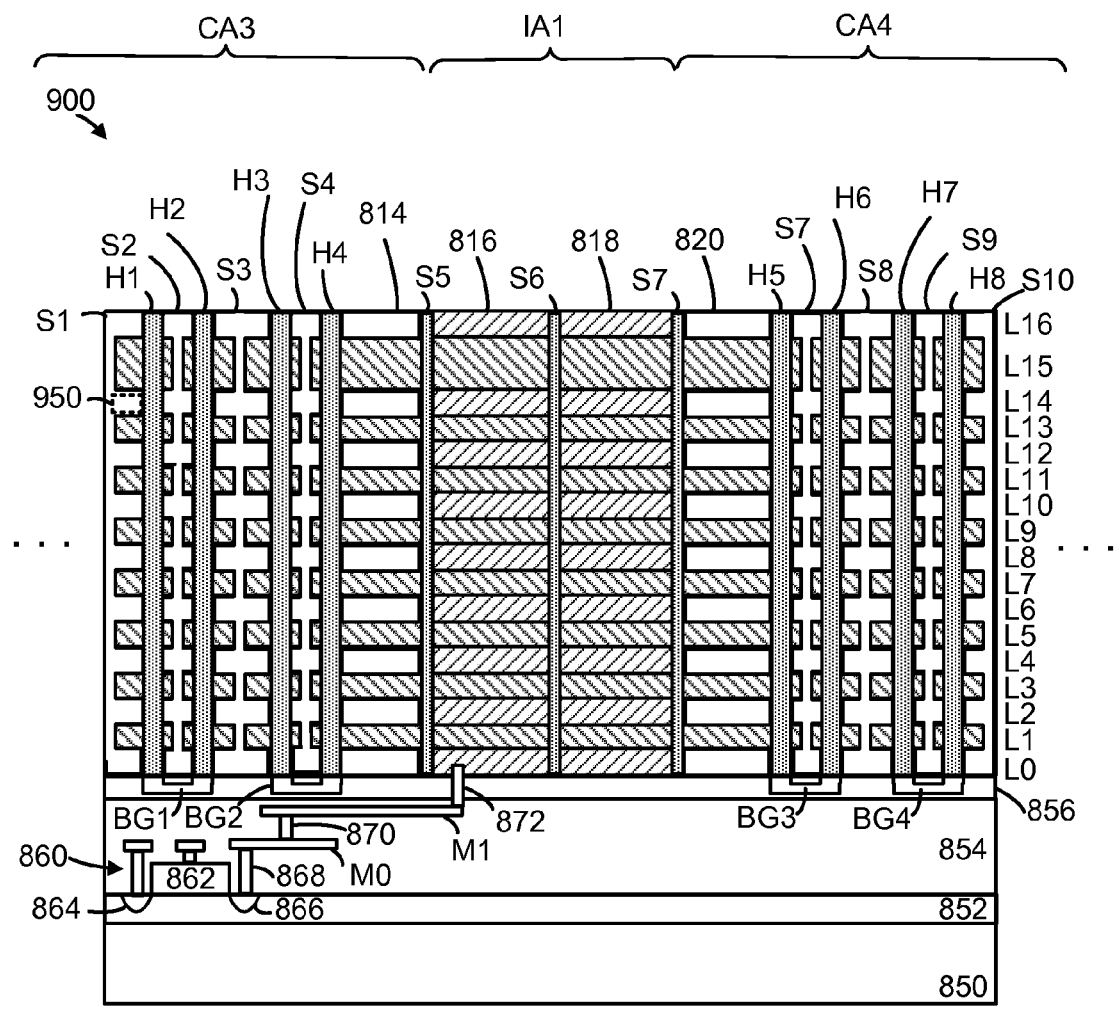
FIG. 9 depicts a layered semiconductor material 900 which is obtained from the layered semiconductor material 800 after performing a wet etch via the slits in the cell areas CA3 and CA4.
Figure 10:
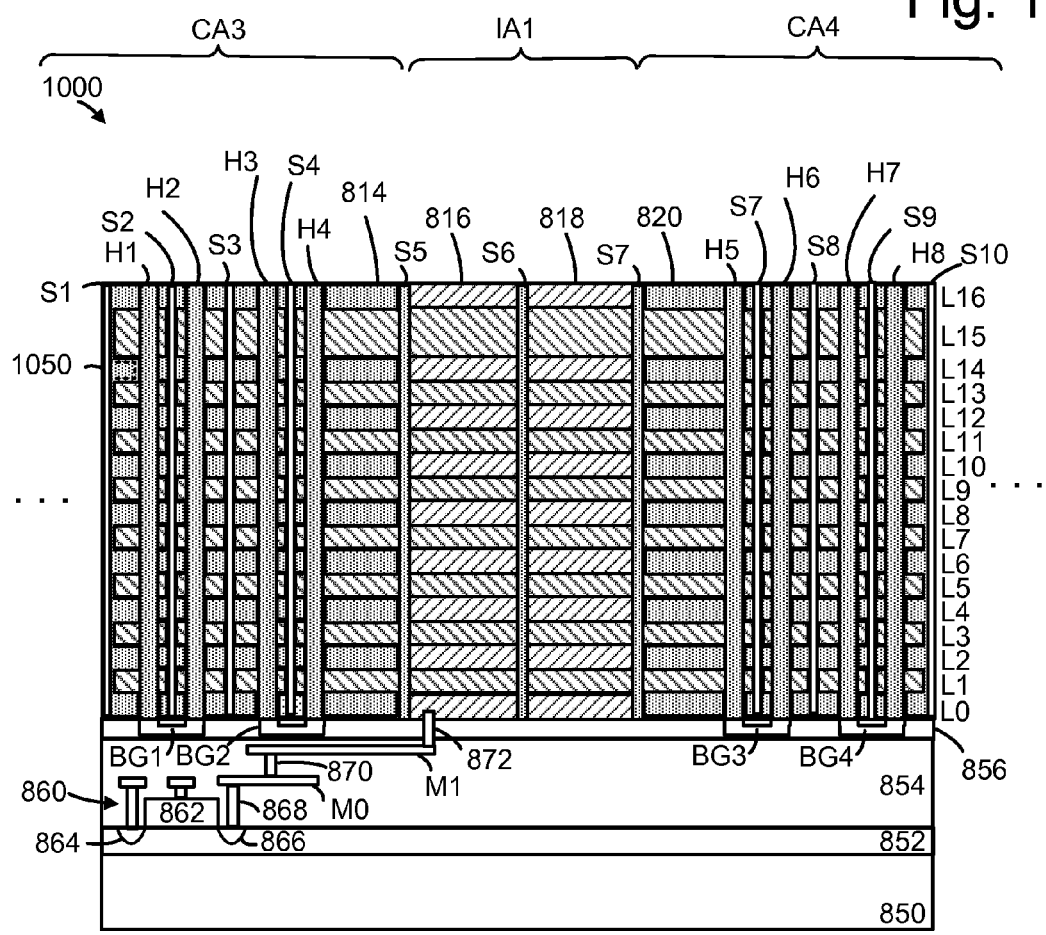
FIG. 10 depicts a layered semiconductor material 1000 which is obtained from the layered semiconductor material 900 after filling in voids with insulation via the slits in the cell areas CA3 and CA4.
Figure 11:
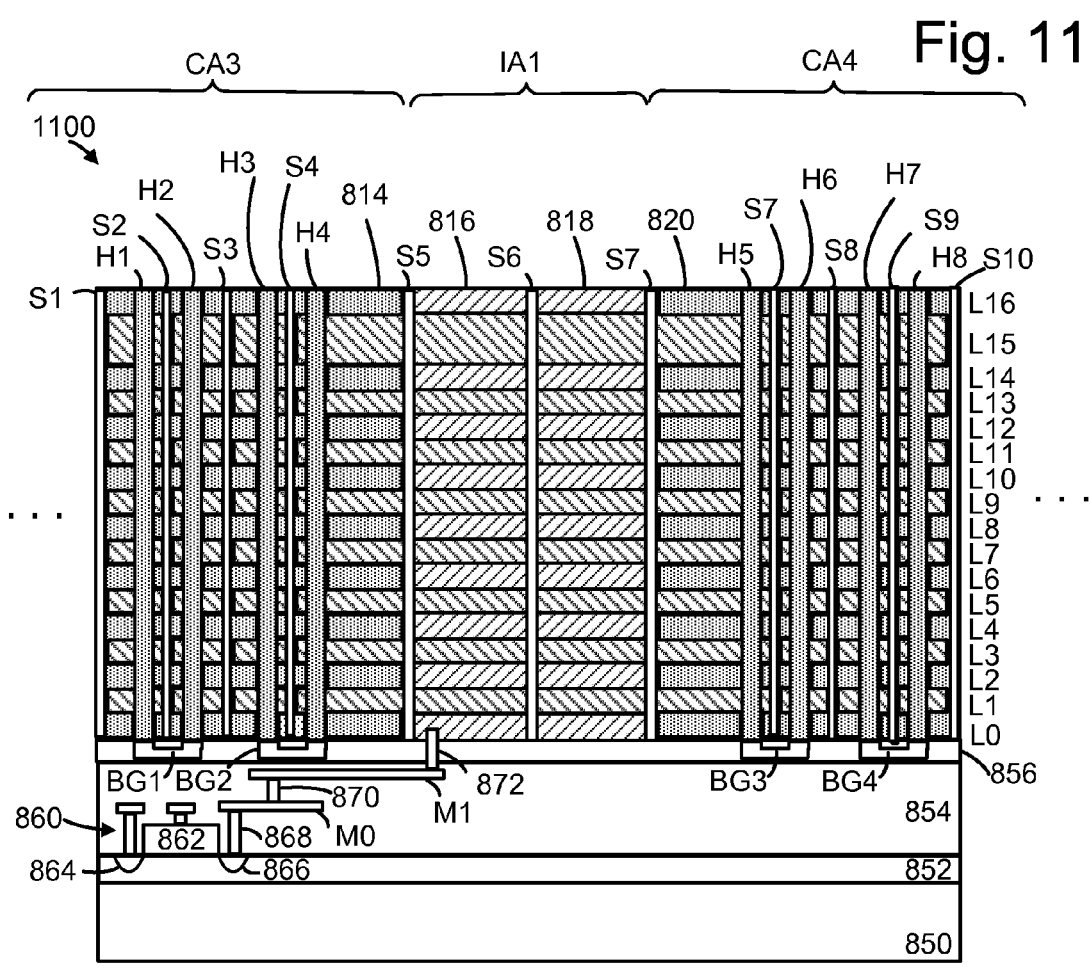
FIG. 11 depicts a layered semiconductor material 1100 which is obtained from the layered semiconductor material 1000 after cleaning out the slits in the cell areas CA3 and CA4 and in the interconnect area IA1.
Figure 12:
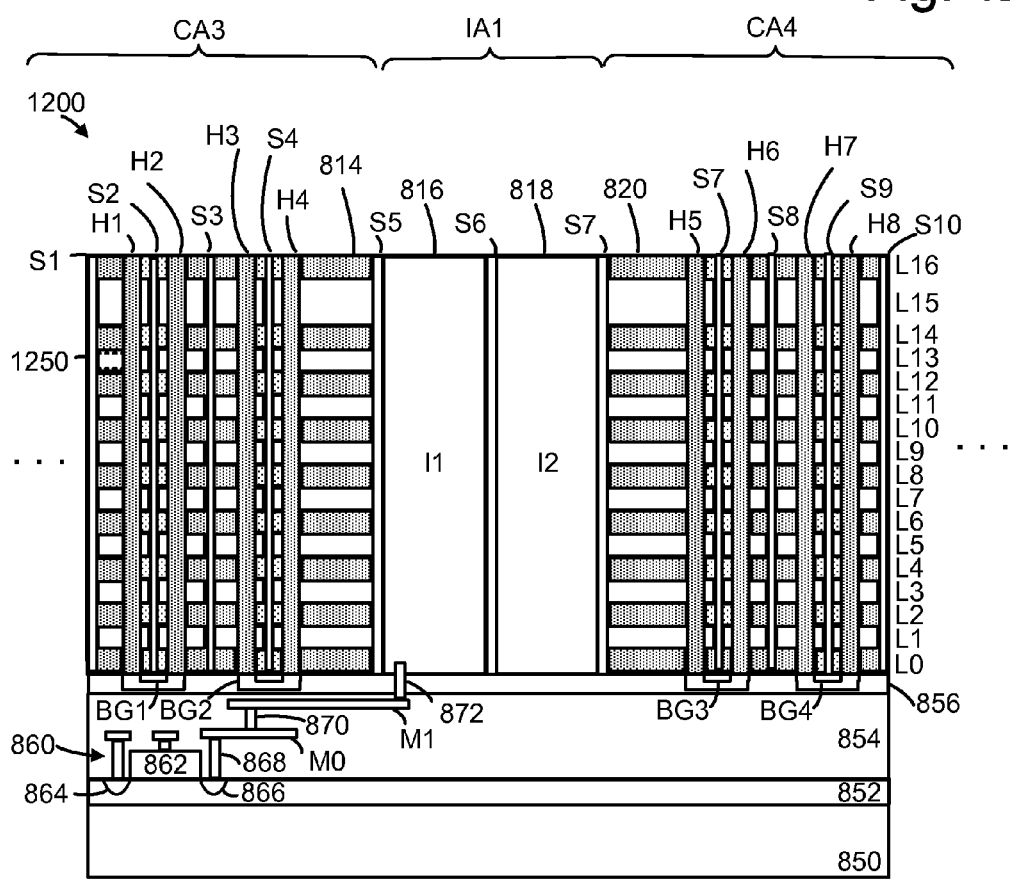
FIG. 12 depicts a layered semiconductor material 1200 which is obtained from the layered semiconductor material 1100 after performing silicidation via the slits in the cell areas CA3 and CA4, and in the interconnect area IA1.
Figure 23A:
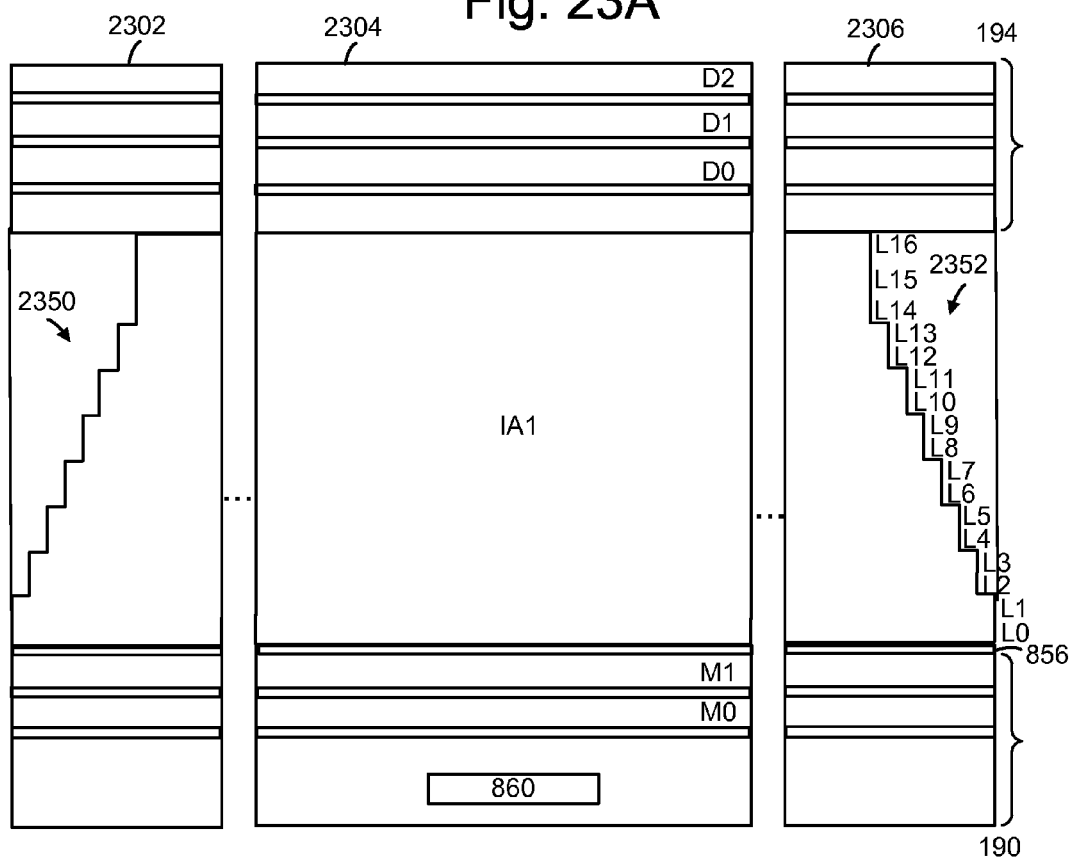
FIG. 23A depicts a cross-sectional view along line 590 of FIG. 5 of the plane 570, showing terraced portions 2350 and 2352 of the interconnect area IA1.
Figure 24:
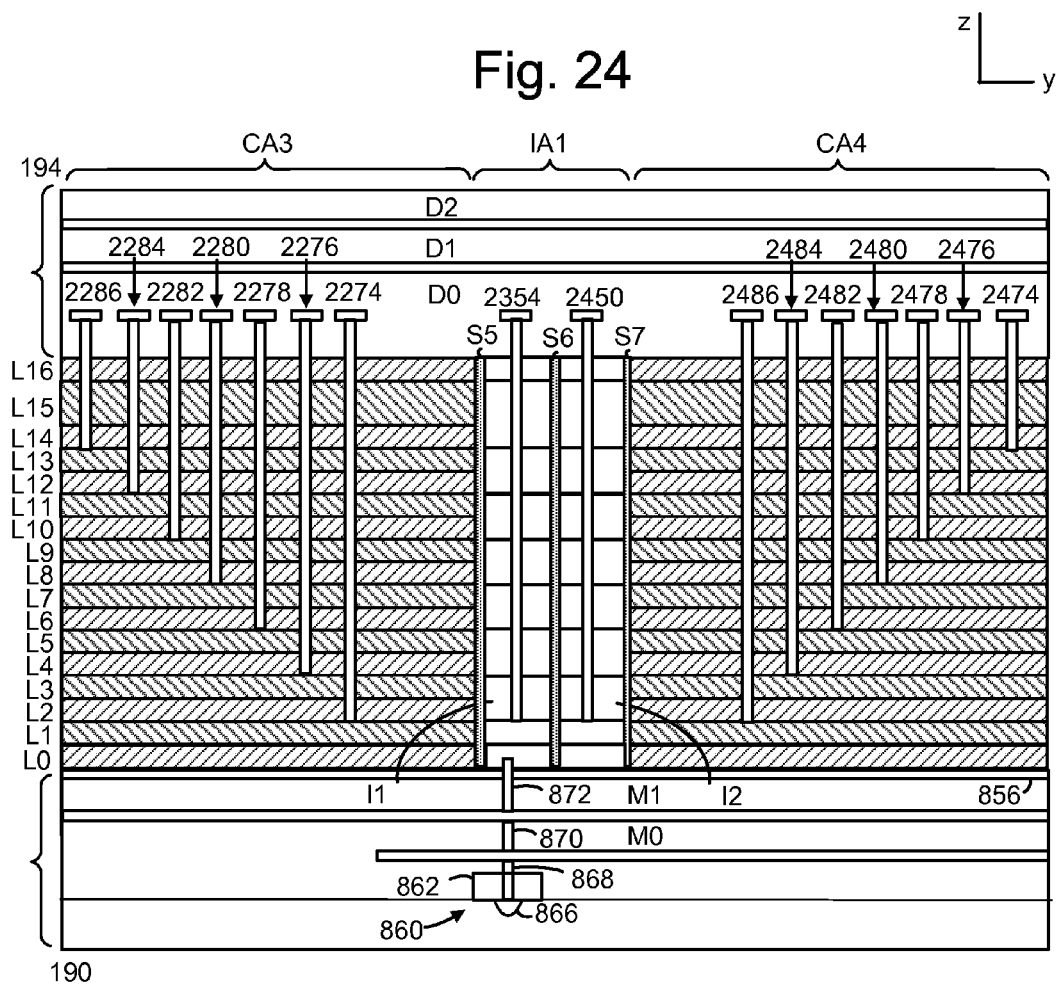
FIG. 24 depicts an end view of the plane 570 of FIG. 5, showing contact structures.

FIG. 6 depicts a method for fabricating a 3D stacked non-volatile memory device according to the structures of FIGS. 8-14B, where a wet etch is performed via slits. The steps include: Provide below-stack circuitry and metal layers on substrate, 600 (FIG. 8); Provide etch stop layer with back gate, 602 (FIG. 8); Provide at least one contact structure to below-stack metal layer through etch stop layer, 604 (FIG. 8); Deposit alternating undoped/lightly doped and heavily doped polysilicon layers, 606 (FIG. 8); Etch slits in the at least one cell area and in the at least one interconnect area using a common mask, 608 (FIG. 8); Fill in the slits in the at least one interconnect area with insulation (or mask the slits), 610 (FIG. 8); Etch memory holes in the at least one cell area, 612 (FIG. 8) (this can be a reactive ion etch in the cell areas using a memory hole mask which protects the interconnect area); Fill in the memory holes with insulation, 614 (FIG. 8); Perform a wet etch via the slits in the at least one cell area, to remove portions of the undoped/lightly doped polysilicon layers in the at least one cell area, but not portions of the undoped/lightly doped polysilicon layers in the at least one interconnect area, 616 (FIG. 9); Deposit insulation (e.g., one or more layers) in the recesses via the slits in the at least one cell area, 618 (FIG. 10); Clean out the slits in the at least one cell area and in the at least one interconnect area (or unmask the slits in the at least one interconnect area), 620 (FIGS. 10 and 11); Perform silicidation of: (a) the portions of the heavily doped polysilicon layers in the at least one cell area, and (b) the portions of the heavily doped and undoped/lightly doped polysilicon layers which are in the at least one interconnect area, 622 (FIG. 12); Deposit insulation in the slits in the at least one interconnect area, 624 (FIG. 13); Clean out the memory holes, 626 (FIG. 13); Fill in memory holes with oxide-nitride-oxide (ONO), polysilicon layer and core filler, 628 (FIG. 14); and Provide above-stack metal layers and connect the at least one interconnect area to the above-stack metal layer by at least one contact structure, 630 (FIGS. 23A, 23B and 24).

In this scheme, "wet etch through slits"—memory holes initially filled in with dielectric serve as anchors to the highly doped poly layers after portions of the undoped/lightly doped poly layers are removed.

The steps need not necessarily be performed as discrete steps in the order indicated. For example, the etching steps can be performed concurrently, at least in part. Various modifications can be made. Moreover, other steps which are known from the art of semiconductor fabrication but are not explicitly depicted here may also be performed.

Undoped or lightly doped poly may have a doping concentration of $10^{15}$ to $10^{17}$ cm-3 or less, for instance. $10^{15}$ means 10 raised to the power of 15. The term "undoped/lightly doped polysilicon" or the like denotes polysilicon which is undoped or relatively lightly doped. The term "heavily doped polysilicon" or the like denotes polysilicon which is relatively highly doped. An example of heavily doped poly is p-type doped poly with a doping concentration of $10^{20}$ to $10^{21}$ cm-3 or more. An example ratio of doping concentrations for the heavily doped poly to the lightly doped poly is therefore $10^{3}$ ($10^{20}/10^{17}$) to $10^{6}$ ($10^{21}/10^{15}$). An example p-type dopant is Boron. High doping is desirable for less word line resistance, and for better silicidation. The sheet resistance of heavily doped poly is about 500-1000 ohm/square, for instance. The sheet resistance of a partially silicided poly layer in a 3D stack is about 20-100 ohm/square—about ten times lower than for unsilicided heavily doped poly.

Undoped poly is an insulator but is not highly insulating. Pure or undoped poly has a resistivity of at least about 10 kilo-ohm·cm. Lightly doped or p type poly has a resistivity of about 1-10 ohm·cm. Highly doped or p+ type poly has a resistivity of about 0.01 ohm·cm or less. An insulator is a material with low conductivity. A dielectric is a type of insulator which can be polarized by an applied electric field. The polarizability is expressed by the dielectric constant. SiO2, SiN, or a combination of SiO2 and SiN, are examples of insulators which are also dielectrics. Generally, oxide, nitride or a combination of oxide and nitride are examples of dielectrics. Highly doped poly or metal silicide is considered to be a conductive material while undoped/lightly doped poly or a dielectric such as oxide, nitride or a combination of oxide and nitride is not.

Figure 7:
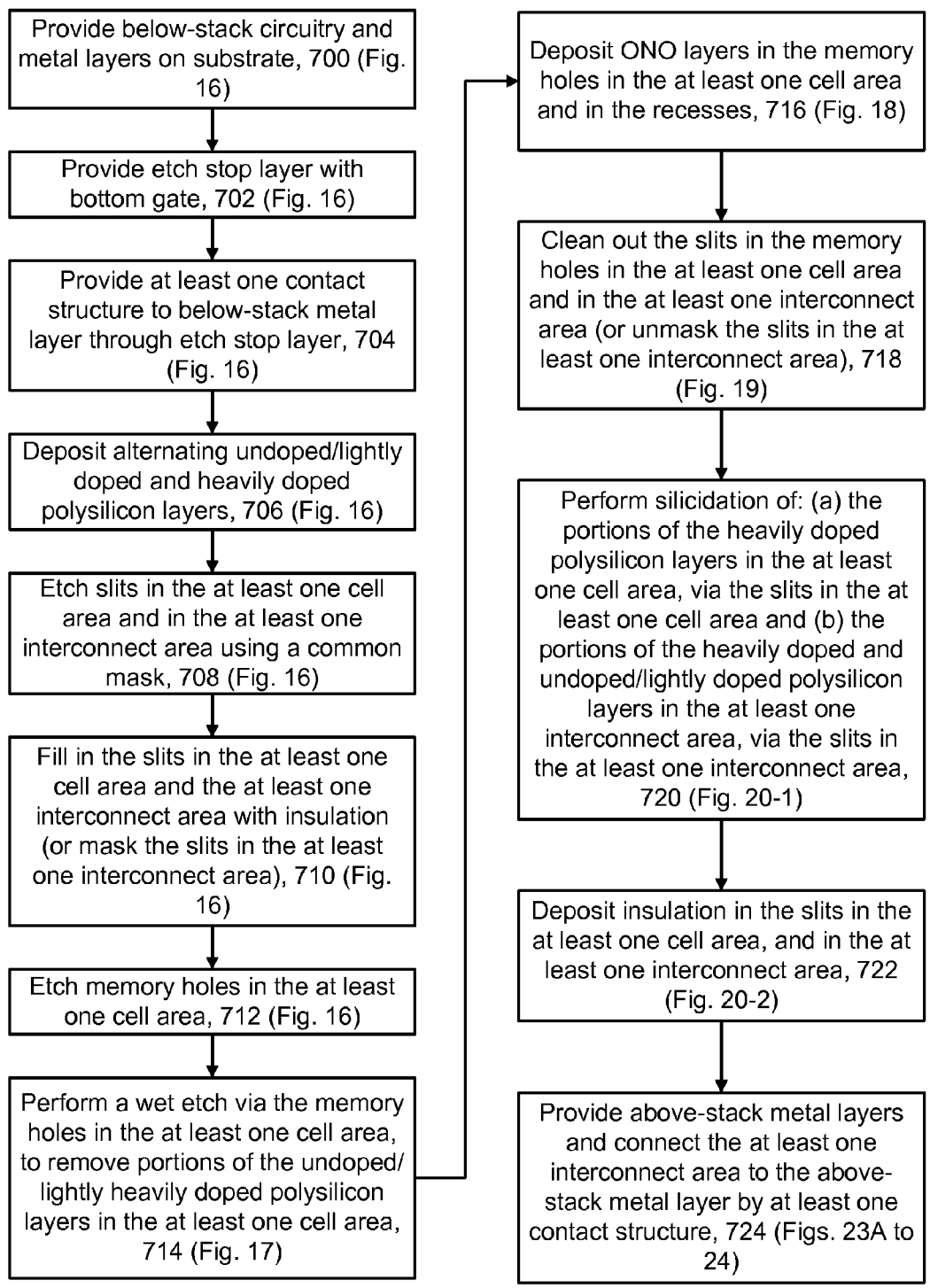
FIG. 7 depicts a method for fabricating a 3D stacked non-volatile memory device, corresponding to the structures of FIGS. 15-21A, where a wet etch is performed via memory holes.
Figure 15:
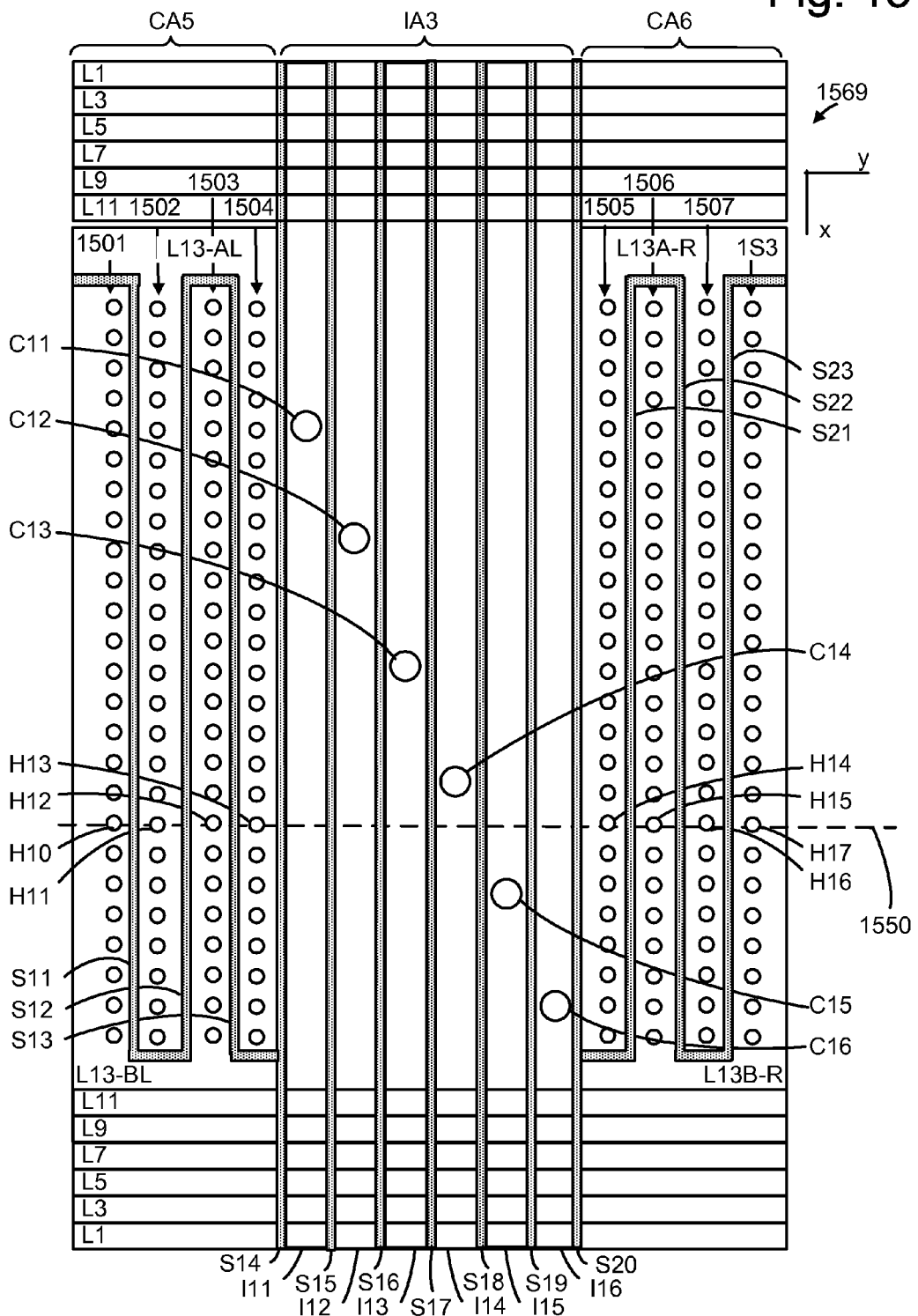
FIG. 15 depicts a top view of another embodiment of a plane 1569 of the 3D stacked non-volatile memory device 150 of FIG. 1B, showing at least one interconnect area having six interconnects and at least one cell area.
Figure 16:
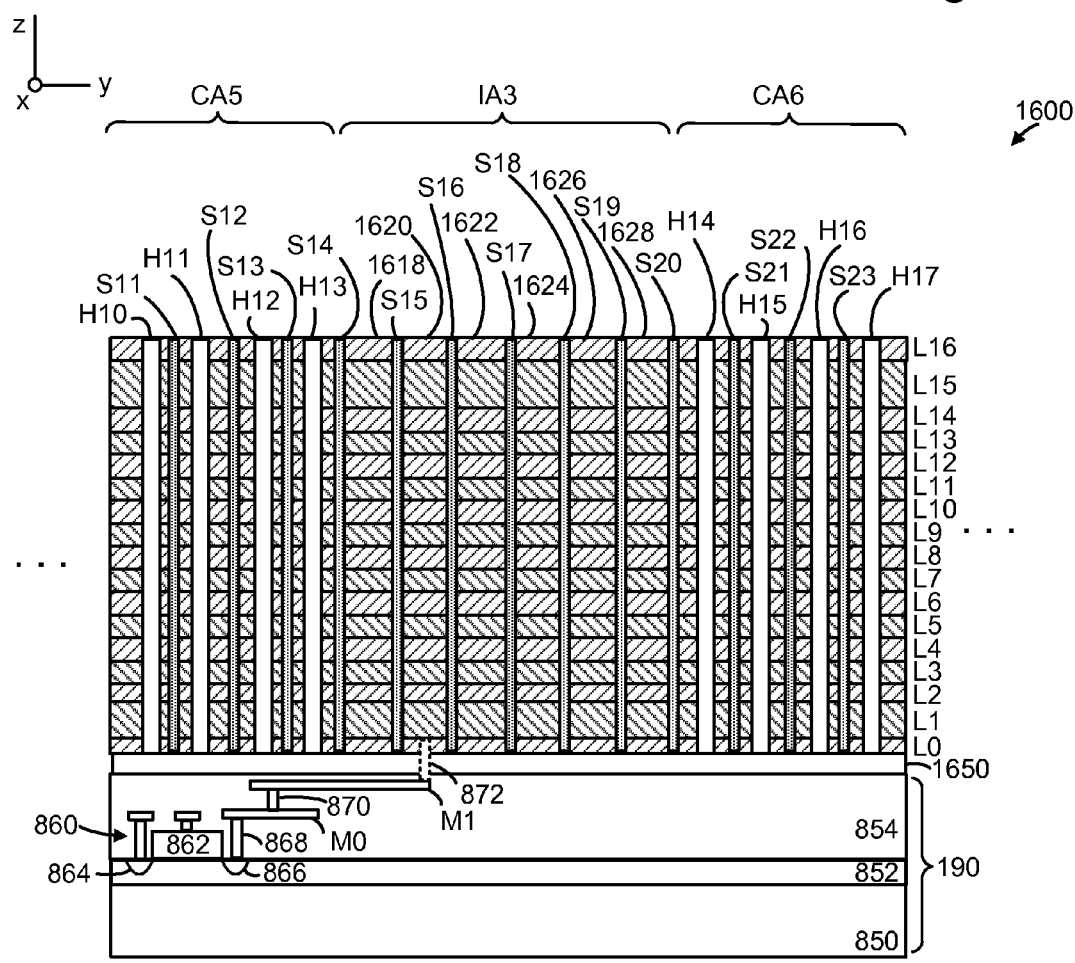
FIG. 16 depicts a layered semiconductor material 1600 which is consistent with a cross-sectional view of the plane 1569 of FIG. 15 along the line 1550, showing slits and memory holes in the cell areas CA5 and CA6, and slits in the interconnect area IA3.
Figure 17:
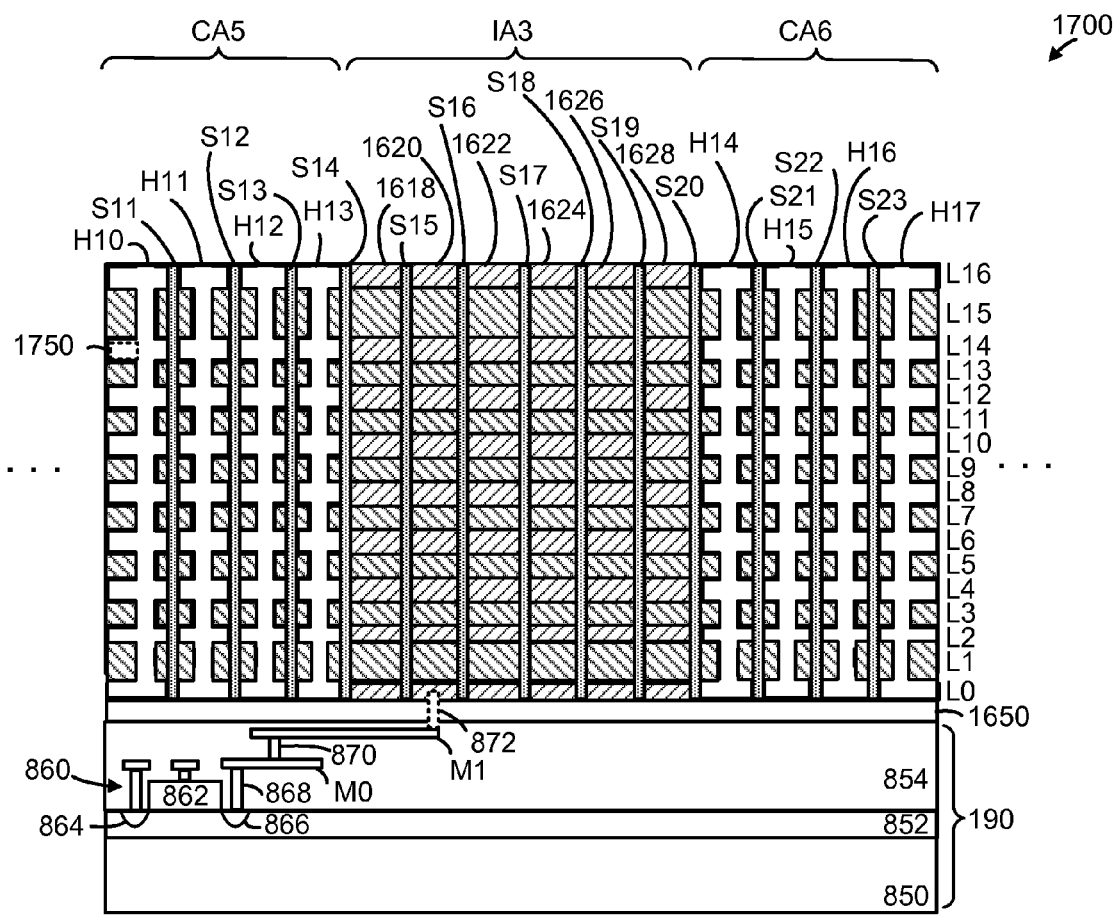
FIG. 17 depicts a layered semiconductor material 1700 which is obtained from the layered semiconductor material 1600 after performing a wet etch via the memory holes in the cell areas CA5 and CA6.
Figure 18:
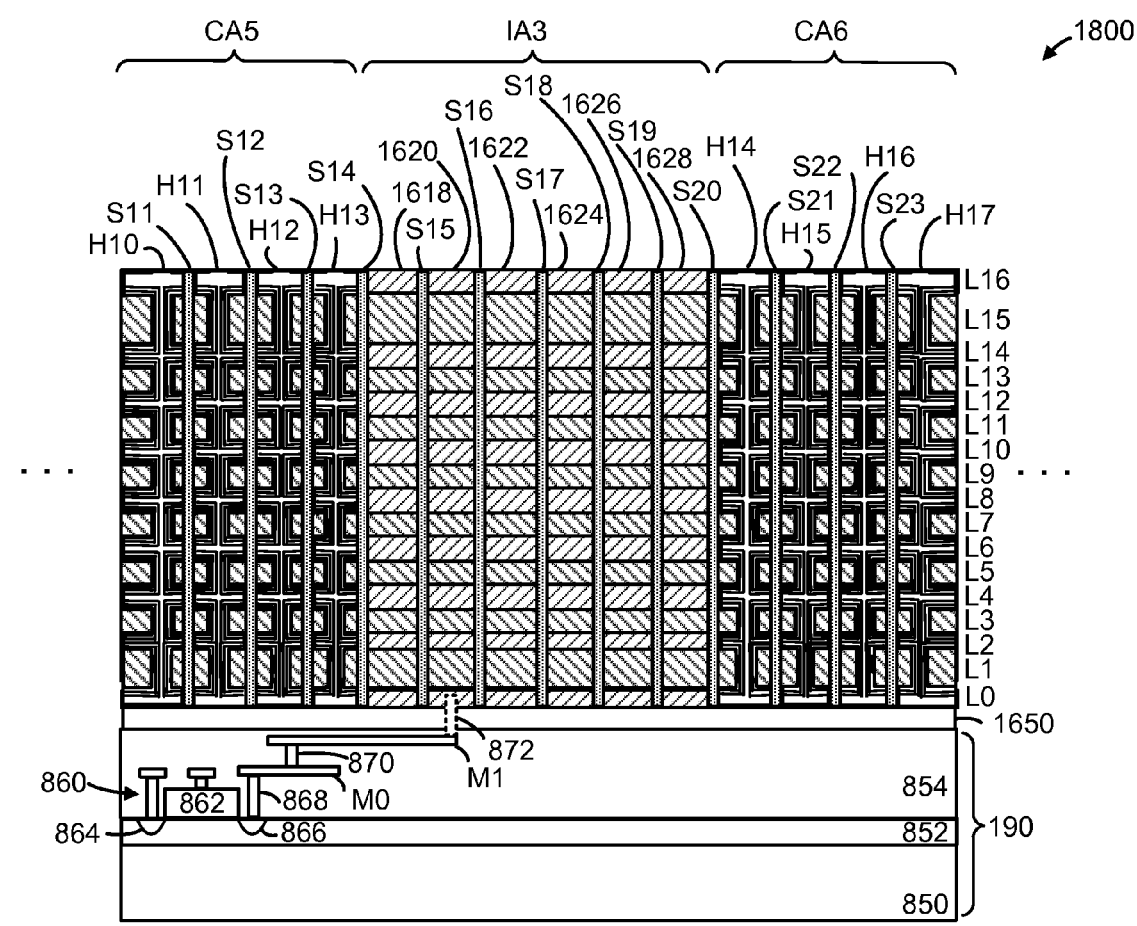
FIG. 18 depicts a layered semiconductor material 1800 which is obtained from the layered semiconductor material 1700 after filling in memory holes and recesses between heavily doped poly layers via the memory holes in the cell areas CA5 and CA6.
Figure 19:
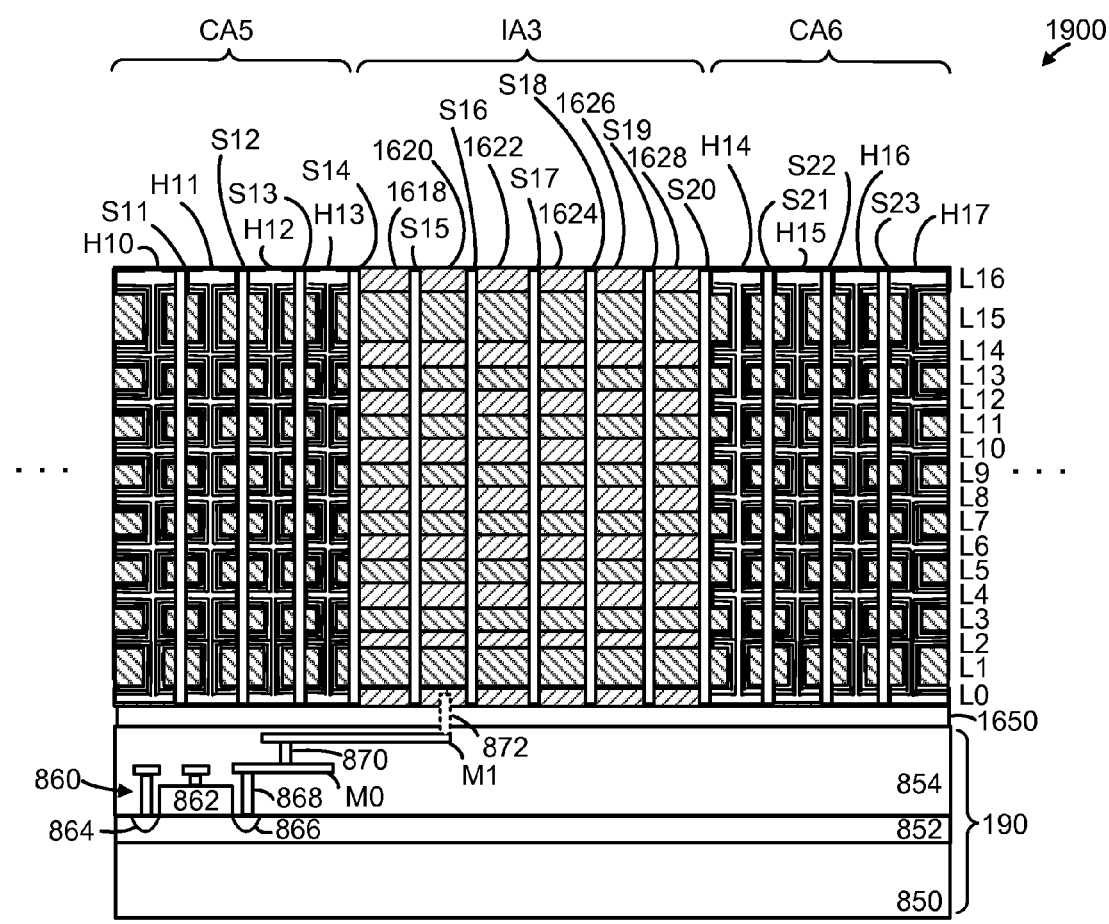
FIG. 19 depicts a layered semiconductor material 1900 which is obtained from the layered semiconductor material 1800 after cleaning out the slits in the cell areas CA5 and CA6 and the in the interconnect area IA3.

FIG. 7 depicts a method for fabricating a 3D stacked non-volatile memory device, corresponding to the structures of FIGS. 15-21A, where a wet etch is performed via memory holes. The steps include: Provide below-stack circuitry and metal layers on substrate, 700 (FIG. 16); Provide etch stop layer with bottom gate, 702 (FIG. 16); Provide at least one contact structure to below-stack metal layer through etch stop layer, 704 (FIG. 16); Deposit alternating undoped/lightly doped and heavily doped polysilicon layers, 706 (FIG. 16); Etch slits in the at least one cell area and in the at least one interconnect area using a common mask, 708 (FIG. 16); Fill in the slits in the at least one cell area and in the at least one interconnect area with insulation (or mask the slits in the at least one interconnect area), 710 (FIG. 16); Etch memory holes in the at least one cell area, 712 (FIG. 16); Perform a wet etch via the memory holes in the at least one cell area, to remove portions of the undoped/lightly doped polysilicon layers in the at least one cell area, 714 (FIG. 17); Deposit ONO layers (as a dielectric or insulation) in the memory holes in the at least one cell area and in the recesses, 716 (FIG. 18); Clean out the slits in the at least one cell area and in the at least one interconnect area (or unmask the slits in the at least one interconnect area), 718 (FIG. 19); Perform silicidation of: (a) the portions of the heavily doped polysilicon layers in the at least one cell area, via the slits in the at least one cell area and (b) the portions of the heavily doped and undoped/lightly doped polysilicon layers in the at least one interconnect area, via the slits in the at least one interconnect area 720 (FIG. 20A); Deposit insulation in the slits in the at least one cell area and in the at least one interconnect area, 722 (FIG. 20B); and Provide above-stack metal layers and connect the at least one interconnect area to the above-stack metal layer by at least one contact structure, 724 (FIGS. 23A, 23B and 24).

The steps need not necessarily be performed as discrete steps in the order indicated. For example, the etching steps can be performed concurrently, at least in part. Various modifications can be made. Moreover, other steps which are known from the art of semiconductor fabrication but are not explicitly depicted here may also be performed.

Note in in the above-mentioned processes (e.g., FIGS. 6 and 7), there is an option to deposit the dielectric between the heavily doped poly layers via the memory hole instead of via slits. However, additional cleaning is needed to remove the dielectric, which adheres to the memory hole walls, increasing costs. FIGS. 8 to 14B depict stages of one embodiment of fabrication of a layered semiconductor device which result in a 3D stacked non-volatile memory device as described in the process flowchart of FIG. 6. This process involves a wet etch via slits. In contrast, the process of FIG. 7 involves a wet etch via memory holes.

FIG. 8 depicts a layered semiconductor material 800 which is consistent with a cross-sectional view of the region 530 of the 3D stacked non-volatile memory device of FIG. 5 along the line 550, showing slits S1 to S4 and S8 to S10 and memory holes H1 to H8 in the cell areas CA3 and CA4, and slits S5 to S7 in the interconnect area IA1. At least one interconnect area IA1 is lateral of at least one cell area in the array. A slit can be a trench which may have various widths. Note that there is another mask that can define wider trenches than those used for the slits in the array. These (the mask and trench itself) are used, e.g., to separate the peripheral and array regions. In defining areas for passive devices, both can be used as applicable.

The substrate region 190 includes a semiconductor substrate such as a silicon wafer, a layer 852 in which source/drain regions 864 and 866 of a transistor gate 862 can be formed, a layer 854 which includes the transistor gate 862 and lower metal layers M0 and M1, and an etch stop layer 856 which has a composition based on the process scheme. For example, the etch stop layer can be SiO2 or nitride. The patterned back gate is used for the pipe connection of each string.

M0 can be used, e.g., for power line and global control signals, and M1 can be used, e.g., for bit line and bus signals. Other uses of M0 and M1 are provided herein as well.

The transistor gate 862 and source/drain regions 864 and 866 are part of an example transistor 860, which is an example of circuitry in the substrate which can be connected to one or more upper metal layers by an in-plane interconnect. Terminals of the circuitry 860 are connected by contact structures to portions of the M0 layer. For example, a contact structure 868 connects the source/drain region 866 to a portion of M0, a contact structure 870 connects the portion of M0 to a portion of M1, and a contact structure 872 extends upward through the etch stop layer 856 to connect the portion of M1 to L0 in the interconnect area IA1. A contact mark can be used to provide the contact structure 872. Generally, there can be one or more contacts to the bottom of one or more interconnects.

The circuitry 860 is directly below the stack, e.g., it is under the stack and within a foot print or perimeter of the stack.

The metal layers can be fabricated from a patterned metal film. For example, Aluminum can be used for the top metal layer, while the other layers are Tungsten. Potentially, Cu can be used instead of Al for upper layer, using a corresponding integration scheme. For silicidation, Ni, Ti, Co or W can used, for instance.

After the etch stop layer 856 is deposited, back gates 840, 842, 844 and 846 are provided in the etch stop layer, for instance, to join vertical columns of memory cells in a U-shaped NAND configuration. In particular, trenches are provided in portions of the layer 856 below pairs of columns of memory cells of a U-shaped NAND string. Layers of materials which are provided in the columns to form the memory cells are also provided in the trenches, and the remaining space in the trenches is filled with a semiconductor material to provide the back gates as conductive regions which connect the columns. The back gate thus connects the two columns of each U-shaped NAND string. Each NAND string has its own back gate which serves to control conductivity of the string. The layer 856 is separated (by etch) for each string. A contact to the back gate is provided in a word line hook up area, where the back gate is the lowest contact, since the back gate poly is below the word line poly stack. The slits generally do not extend down to touch the back gates. Also, the slits are placed not only between memory holes of the same NAND string, e.g., slits S2, S4, S7 and S9, but also between memory holes of adjacent NAND strings, e.g., slits S1, S3, S8 and S10.

Alternating layers of undoped/lightly doped and heavily doped polysilicon, for example, are provided as layers L0 to L16. This example results in vertical columns of six memory cells, where the heavily doped polysilicon layers are provided at L3, L5, L7, L9, L11 and L13 as control gates, at L1 as a lower select gate and at L15 as an upper select gate. This is an example, as fewer or more layers can be used. L1 is a bottom layer of doped heavily doped polysilicon. Since L1 and L15 are taller than the other heavily doped polysilicon layers in this example, the lower and upper select gates will be taller than the memory cell control gates. In one approach, the doping of the polysilicon layers is performed in situ. For example, undoped/lightly doped polysilicon for L0 is deposited (optionally while being lightly doped in situ), then polysilicon for L1 is deposited while being heavily doped, e.g., using p-type Boron, then undoped/lightly doped polysilicon for L2 is deposited, then polysilicon for L3 is deposited while being heavily doped, and so forth. L1, L3, L5, L7, L9, L11, L13 and L15 are the heavily doped layers, and L0, L2, L4, L6, L8, L10, L12, L14 and L16 are the undoped/lightly doped layers.

After the layers of undoped/lightly doped and doped polysilicon are deposited, the slits and memory holes are fabricated. The order of fabrication can vary. In one approach, slits are etched in the cell areas CA3 and CA4 and in the interconnect area IA1. For example, slits S1 to S3 can be etched in the cell area CA3, slits S5 to S7 can be etched in the interconnect area CA3, and slits S7 to S10 can be etched in the cell area CA4. Advantageously, the slits can be etched concurrently, using a common mask which covers the stack. Reactive ion etching can be used. Further, the pattern of slits in the interconnect area can correspond to, e.g., be the same as, the pattern of slits in the cell areas. The widths of the slits can be the same or different in the interconnect area and the cell areas.

To provide the memory holes in the cell areas CA3 and CA4 but not in the interconnect area IA1, the interconnect area can be masked while etching the memory holes, e.g., using reactive ion etching. Memory holes H1 to H4 can be formed in the cell area CA3, and memory holes H5 to H8 can be formed in the cell area CA4. Also, in the layered semiconductor material 800: a region 814 is between and adjacent to the memory hole H4 and the slit S5, a region 816 is between and adjacent to the slits S5 and S6, a region 818 is between and adjacent to the slits S6 and S7, and a region 820 is between and adjacent to the slit S7 and the memory hole H5.

Once the slits in the interconnect area are etched, they can be filled in with insulation, as indicated by the shading. Example insulation includes a dielectric material such as SiO2, or a combination of dielectrics, e.g. SiO2, SiN, and so forth. Alternatively or additionally, the slits in the interconnect area are protected by a masking material such as photoresist or silicon nitride. A goal is to protect the slits in the interconnect area to prevent a liquid etchant from entering the slits and removing portions of the undoped/lightly doped polysilicon layers in the interconnect area in a subsequent wet etch process.

FIG. 9 depicts a layered semiconductor material 900 which is obtained from the layered semiconductor material 800 after performing a wet etch via the slits in the cell areas. The wet etch can involve introducing an etchant via the slits of the at least one cell area, which has a higher selectivity for the undoped/lightly doped polysilicon layers, removing portions of the undoped/lightly doped polysilicon layers which are adjacent to the slits of the at least one cell area. For example, region 950 is an example portion of the undoped/lightly doped polysilicon layer L14 which is removed in the wet etch. Selectivity indicates a ratio of etch rates. The wet etch has a relatively higher selectivity (e.g., by a factor of 1000, or more generally, 100 or more) for the undoped/lightly doped polysilicon relative than for the heavily doped polysilicon.

That is, the wet etch is not relatively highly selective of the heavily doped polysilicon so that it is not substantially removed. The wet etch should remove essentially the entire undoped/lightly doped polysilicon layers in the cell areas, so that when the regions of the removed undoped/lightly doped polysilicon are replaced by dielectric, the dielectric will extend in substantially the entire layer in the cell areas. This ensures that the word line layers at different levels are isolated from one another and not shorted together. This applies regardless of the wet etch method, e.g., whether the etchant is introduced via the slits, memory holes, other holes or voids, or combinations thereof. The insulation-filled slits serve as anchors which support the heavily doped poly layers when the undoped/lightly doped poly is removed. On the other hand, the masked interconnect area is protected from the wet etch.

The silicidation of the doped poly layers in the cell area or interconnect area can result in essentially all, or a large portion, of the doped poly in the respective area being transformed to metal silicide. A word line layer which is partly metal silicide and partly doped poly will still function as a conductive layer. In fact, the resistance of partly silicided word line layer will be mostly determined by its silicided part with lower resistance In the array area, the memory holes are placed densely. A minimum density of memory holes allows essentially all undoped/lightly doped poly in the cell areas to be removed when a wet etch is performed via the memory holes. For example, the memory holes can have a width of 60-75 nm, a pitch of about 110-125 nm in the word line or x-direction, and a pitch of about 150-165 nm in the bit line or y-direction. The slits can have a width of about 40-50 nm. In other areas, such as the word line hook areas at opposing ends of the array, essentially all of the undoped/lightly doped poly can be removed as well in a wet etch. In those areas, memory holes need not be provided. However, holes referred to as replacement (or inactive) holes may be used to remove undoped/lightly doped poly. These holes can be arranged with a similar density as in the array.

The term "hole" or "columnar hole" or the like as used herein is meant to include a memory hole, replacement hole or similar vertically-extending columnar void which can be filled while still be recognizable as a hole.

For a 3D capacitor or 3D resistor, discussed further below, a sufficient density of holes may be used to remove undoped/lightly doped poly. For a 3D resistor, the hole density can be the same as in the array, since a high density of memory holes will desirably increase the resistance of the poly layers. For a 3D capacitor, a minimum hole density is desired which is still sufficiently high to remove the undoped/lightly doped poly. A lower density of holes desirably increases the effective area of capacitor plates, therefore increasing the capacitance of each layer. The optimal hole densities can be found by experimentation.

FIG. 10 depicts a layered semiconductor material 1000 which is obtained from the layered semiconductor material 900 after filling in voids with insulation via the slits in the cell areas CA3 and CA4. Insulation is provided in the slits to fill the recesses (e.g., region 1050) which were created by the wet etch, as indicated by the shading. The insulation can be a dielectric material which insulates the word line layers from one another. The insulator, which is deposited via the slits with the intention to fill in the voids between the layers of heavily doped poly will inevitably be deposited somewhat on the sidewalls of the slits. The slits in the cell area can be cleaned out to remove theses deposits. This can occur with the cleaning out of the slits in the interconnect area, or separately. See FIG. 14A for further details, showing regions 1494 and 1496 of dielectric which are deposited on the sidewalls of the slit S2, and a region 1495 of insulation which is later deposited to fill the slit S2.

In this scheme, slits are used to fill in voids between poly with insulation. Then, the slits are cleaned out (opened) before silicidation. Otherwise, the insulator on the sidewalls can prevent metal (e.g., Ni) from being deposited on poly, thereby preventing silicidation.

In one option, the slits in the interconnect area are already filled with insulation. In another option, the slits in the interconnect area are voids which were protected by a masking material, in which case the masking material is removed and the slits in the interconnect area can be left as voids. A goal is to introduce a dielectric in the recesses throughout the entire cell array areas which is not affected by a subsequent silicidation process. The dielectric material can comprise, e.g., oxide, nitride and/or combination of oxide and nitride.

FIG. 11 depicts a layered semiconductor material 1100 which is obtained from the layered semiconductor material 1000 after cleaning out the slits in the interconnect area IA1. The cleaning out of the slits can be achieved by etching such as reactive ion etching, for example. A goal is to create a narrow trench to perform silicidation in the interconnect area IA1. The slits in the cell areas CA3 and CA4 could optionally be cleaned out as well.

FIG. 12 depicts a layered semiconductor material 1200 which is obtained from the layered semiconductor material 1100 after performing silicidation via the slits in the cell areas CA3 and CA4, and via the slits in the interconnect area IA1. Silicidation is an annealing process resulting in the formation of metal-Si alloy (silicide) from the heavily doped poly (e.g., region 1250). For example, it can include depositing a metal such as Ni, Ti, Co or W in the slits in the cell area followed by annealing which transforms the affects portions of the heavily doped polysilicon layers to a metal silicide. Chemical vapor deposition (CVD) or atomic layer deposition (ALD) could be used to deposit the metal. A silicide is an alloy of silicon and metal and has the advantage of reduced resistivity compared to heavily doped polysilicon. The silicidation results in metal silicide regions in place of heavily doped poly regions in the cell area. Additionally, since the undoped/lightly doped polysilicon layers were not removed in the interconnect area, both the heavily doped and undoped/lightly doped polysilicon layers in the interconnect area are intrinsically connected by the silicidation and transformed to a monolithic block of metal silicide which serves as an interconnect between one or more lower metal layers and one or more upper metal layers. In particular, regions 816 and 818 are transformed to metal silicide interconnects I1 and I2. In one approach, the metal silicide interconnects I1 and I2 extend a height of the stack, from the etch stop layer 856 or a bottommost layer (L0) of the stack to a topmost layer (L16) of the stack.

FIG. 13 depicts a layered semiconductor material 1300 which is obtained from the layered semiconductor material 1200 after cleaning out the memory holes in the cell areas CA3 and CA4. The slits S5, S6 and S7 in the interconnect area are filled in with insulation. The memory holes H1 to H8 in the cell area are cleaned out, e.g., by etching. The slits can be protected from the etching. Additionally, the drain-side memory holes H1, H4, H5 and H8 are extended up to a bit line BL, the source-side memory holes H2 and H3 are extended up to a select line SL1, and the source-side memory holes H6 and H7 are extended up to a select line SL2. The memory holes are filled with a number of layers as detailed in FIGS. 14A and 14B.

FIG. 14A depicts a layered semiconductor material 1400 which is obtained from the layered semiconductor material 1350 after filling in the memory holes. In one approach, the memory holes H1 and H2 are filled in by depositing ONO and polysilicon layers on sidewalls of the columnar memory holes, e.g., using ALD. For example, a block or back oxide can be deposited as layer 1450 in memory hole H1, and as layer 1460 in memory hole H2. Next, a nitride such as SiN as a charge trapping layer can be deposited as layer 1451 in memory hole H1, and as layer 1461 in memory hole H2. Next, a tunnel oxide can be deposited as layer 1452 in memory hole H1, and as layer 1462 in memory hole H2. Next, a polysilicon body can be deposited as layer 1453 in memory hole H1, and as layer 1463 in memory hole H2. Next, a core filler dielectric can be deposited as region 1454 in memory hole H1, and as region 1464 in memory hole H2.

The ONO layers form a dielectric stack. The stack layers can be more complex, such as where at least one of these layers can be a combination of layers of oxide and nitride. If we consider the metal (M) silicide of the word line, and the polysilicon body (S), a MONOS stack and memory cell are formed. Alternatively, if the word line is poly (S), a SONOS stack and memory cell are formed.

An example select gate 1490 is formed by the memory hole H1 and a portion of the metal silicide layer L15 which surrounds H1, while an example memory cell 1492 is formed by the memory hole H2 and a portion of the metal silicide layer L15 which surrounds H2. Similarly, an example select gate 1491 is formed by H1 and a portion of L15 which surrounds H1, while an example memory cell 1493 is formed by H2 and a portion of L15 which surrounds H2. Additional memory cells are similarly formed along the memory holes. Recall that L12, L14 and L6 are example dielectric layers, and L13 and L15 are conductive (metal silicide) layers.

FIG. 14B depicts a cross-sectional view of the memory hole H1 of FIG. 14A. The layers can be cylindrical, for instance. Core filler region 1454 is inside the polysilicon body 1453, which is inside the tunnel oxide 1452, which is inside the nitride 1451, which is inside the block oxide. Generally, each of a tunnel layer and a blocking layer can be comprised of a stack of oxide and nitride layers to improve their respective properties affecting endurance and data retention.

FIGS. 15 to 21A depict stages of another embodiment of fabrication of a layered semiconductor device which result in a 3D stacked non-volatile memory device as described in the process flowchart of FIG. 7. This process involves a wet etch via memory holes.

FIG. 15 depicts a top view of another embodiment of a plane 1569 of the 3D stacked non-volatile memory device 150 of FIG. 1B, showing at least one interconnect area IA3 having six interconnects I11 to I16, and at least one cell area (cell areas CA5 and CA6). In this slit pattern, a slit is provided between every row of memory holes in the cell array areas. A slit comb-like structure can be provided for the word line and select gate hook up connections on opposing sides (top and bottom in layout) of each block.

For example, slits S11 to S13 are provided in the cell area CA5, between rows 1501 to 1504 of memory holes, and slits S21 to S23 are provided in the cell area CA6, between rows 1505 to 1508 of memory holes. Insulation-filled slits S14 to S20 are provided in the interconnect area IA3. Contact structures C11 to C16 are provided for the interconnects I11 to I16, respectively. A cross-sectional view of the plane 1569 along line 1550 is provided in FIG. 16. This cross-section includes example memory holes H11 to H13 and H14 to H17.

FIG. 16 depicts a layered semiconductor material 1600 which is consistent with a cross-sectional view of the plane 1569 of FIG. 15 along the line 1550, showing slits and memory holes in the cell areas CA5 and CA6, and slits in the interconnect area IA3. The substrate region 190 is repeated. In this example, the vertical columns of memory cells which will be provided in the memory holes terminate at a source line of, e.g., n+ poly 1650. For example, straight NAND strings may be fabricated in this case. While straight NAND strings are an option, U-shaped NAND strings have some advantages. Specifically, in U-shaped NAND, both select gates are on the top, one connected to a bit line, one to a source line, and each made of metal, e.g., D1 and D2, for lower resistance. The drain junctions (n+) for both select gate transistors can be the same, not subjected to a MONOS anneal cycle.

The sources lines run parallel to one another in the y-direction, may be made of n+ poly to provide a higher source line resistance, and are connected to respective source line drivers. The contact structure 872 extends upward to connect the portion of M1 to L0 in the interconnect area 1620. The contact structure 872 can be positioned between source lines so that it does not contact them, and/or an insulation may be used around the contact structure 872 so that it does not contact the source lines.

The alternating layers of undoped/lightly doped and heavily doped polysilicon are provided as before as layers L0 to L16, except that L1 is now used to provide a source-side select gate for each NAND string. L1 is shown having a slight greater height than the other layers, similar to the height of the layer L15 used for the drain-side select gate. After the layers of undoped/lightly doped and heavily doped polysilicon are deposited, the slits and memory holes are fabricated. In one approach, slits S11 to S13 can be etched in the cell area CA5, slits S14 to S20 can be etched in the interconnect area CA3, and slits S21 to S23 can be etched in the cell area CA6. Advantageously, the slits can be etched concurrently, using a common mask which covers the stack. Reactive ion etching can be used. Further, the pattern of slits in the interconnect area can correspond to, e.g., be the same as, the pattern of slits in the cell areas. The widths of the slits can be the same or different in the interconnect area and the cell areas, in one approach.

In this scheme "wet etch through memory holes", slits are formed first and filled in with SiO2 (in one example). Then memory holes are etched, and then wet etch is performed through memory holes. At that time, with undoped/lightly doped poly removed in cell areas, slits serve as anchors to poly structure. Later slits are etched to remove sacrificial fill material. Silicidation is done through the slits.

Specifically, to provide the memory holes in the cell areas CA5 and CA6 but not in the interconnect area IA3, the interconnect area can be masked while etching the memory holes, e.g., using reactive ion etching. Memory holes H10 to H13 can be formed in the cell area CA5, and memory holes H14 to H17 can be formed in the cell area CA6. Also, in the layered semiconductor material 1600: a region 1618 is between slits S14 and S15, a region 1620 is between slits S15 and S16, a region 1622 is between slits S16 and S17, a region 1624 is between slits S17 and S18, a region 1626 is between slits S18 and S19, and a region 1628 is between slits S19 and S20.

Once the slits in the interconnect area are etched, they can be filled in with insulation, as indicated by the shading in the slits. Alternatively or additionally, the slits in the interconnect area are protected by a masking material such as photoresist or silicon nitride. A goal is to protect the slits in the interconnect area to prevent a liquid etchant from entering the slits in a subsequent wet etch process.

FIG. 17 depicts a layered semiconductor material 1700 which is obtained from the layered semiconductor material 1600 after performing a wet etch via the memory holes H10 to H13 and H14 to H17 in the cell areas CA5 and CA6. The wet etch can involve introducing an etchant via the memory holes of the at least one cell area, which has a higher selectivity for the undoped/lightly doped polysilicon layers, removing the undoped/lightly doped polysilicon layers. The wet etch is not relatively highly selective of the heavily doped polysilicon so that the heavily doped polysilicon is not substantially removed. As in the case of the wet etch via the slits, essentially all of the undoped/lightly doped poly in the cell areas is removed. Region 1750 is an example region of undoped/lightly doped poly in L13 which is removed by the wet etch.

FIG. 18 depicts a layered semiconductor material 1800 which is obtained from the layered semiconductor material 1700 after filling in memory holes and recesses between heavily doped poly layers and via the memory holes in the cell areas CA5 and CA6. For example, an ONO stack can be deposited into the memory holes by CVD and/or ALD, which also fills the recesses or voids between the heavily doped poly layer or word line layers which were created by the wet etch. ONO is considered to be a dielectric material. In one option, the slits in the interconnect area are already filled with insulation. In another option, the slits in the interconnect area are voids which were protected by a masking material, in which case the masking material is removed and the slits in the interconnect area can be left as voids. A goal is to introduce an ONO material in the recesses which is not affected by a subsequent silicidation process.

FIG. 19 depicts a layered semiconductor material 1900 which is obtained from the layered semiconductor material 1800 after cleaning out the slits in the cell areas CA5 and CA6 and the in the interconnect area IA3. The cleaning out of the slits can be achieved by etching, for example.

Figure 20A:
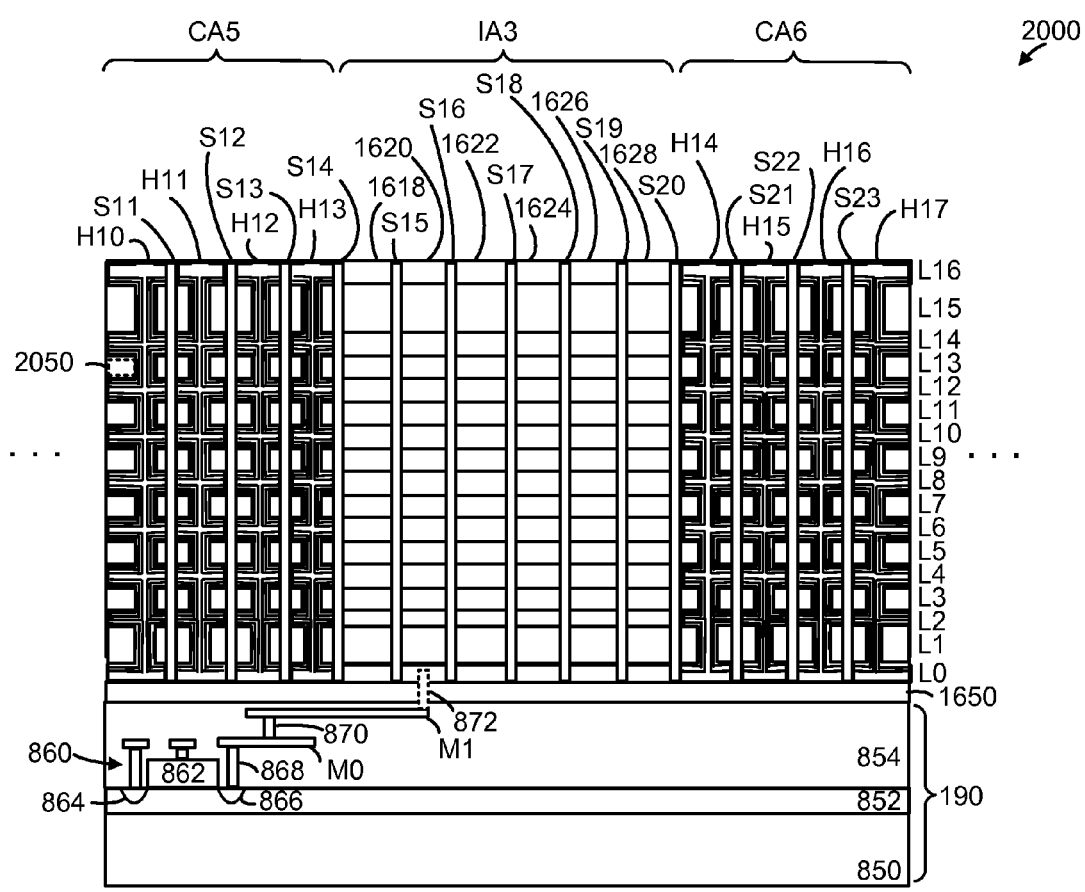
FIG. 20A depicts a layered semiconductor material 2000 which is obtained from the layered semiconductor material 1900 after performing silicidation via the slits in the cell areas CA5 and CA6 and in the interconnect area IA3.

FIG. 20A depicts a layered semiconductor material 2000 which is obtained from the layered semiconductor material 1900 after performing silicidation via the slits in the cell areas CA5 and CA6 and in the interconnect area IA3. The silicidation results in metal silicide regions (e.g., region 2050 in L13) where the heavily doped poly was previously present. As before, since the undoped/lightly doped polysilicon layers were not removed in the interconnect area, both the heavily doped and undoped/lightly doped polysilicon layers are intrinsically connected by the silicidation and transformed to a monolithic block of metal silicide which serves as an interconnect between one or more lower metal layers and one or more upper metal layers. In particular, regions 1618, 1620, 1622, 1624, 1626 and 1628 are transformed to metal silicide interconnects I11, I12, I13, I14, I15 and I16 (FIG. 15), respectively. In one approach, the metal silicide interconnects extend a height of the stack.

Figure 20B:
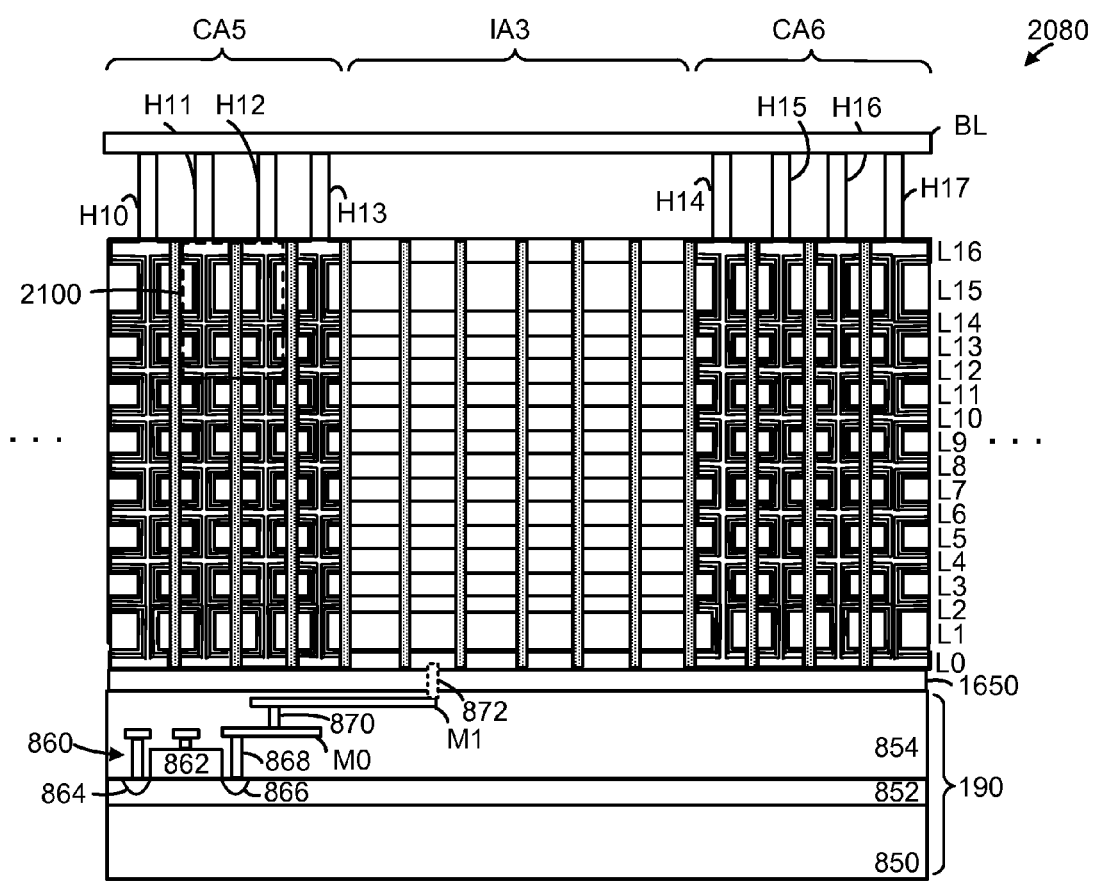
FIG. 20B depicts a layered semiconductor material 2080 which is obtained from the layered semiconductor material 2000 after depositing insulation in the slits in the interconnect area IA3.

FIG. 20B depicts a layered semiconductor material 2080 which is obtained from the layered semiconductor material 2000 after depositing insulation in the slits in S11 to S13 and S21 to S23 in the cell area CA5, slits S14 to S20 in the interconnect area IA3 and slits S20 to S23 in the cell area CA6. Additionally, the memory holes H10 to H16 are extended up to a bit line BL which runs parallel to the source line 1650 in this example.

Figure 21A:
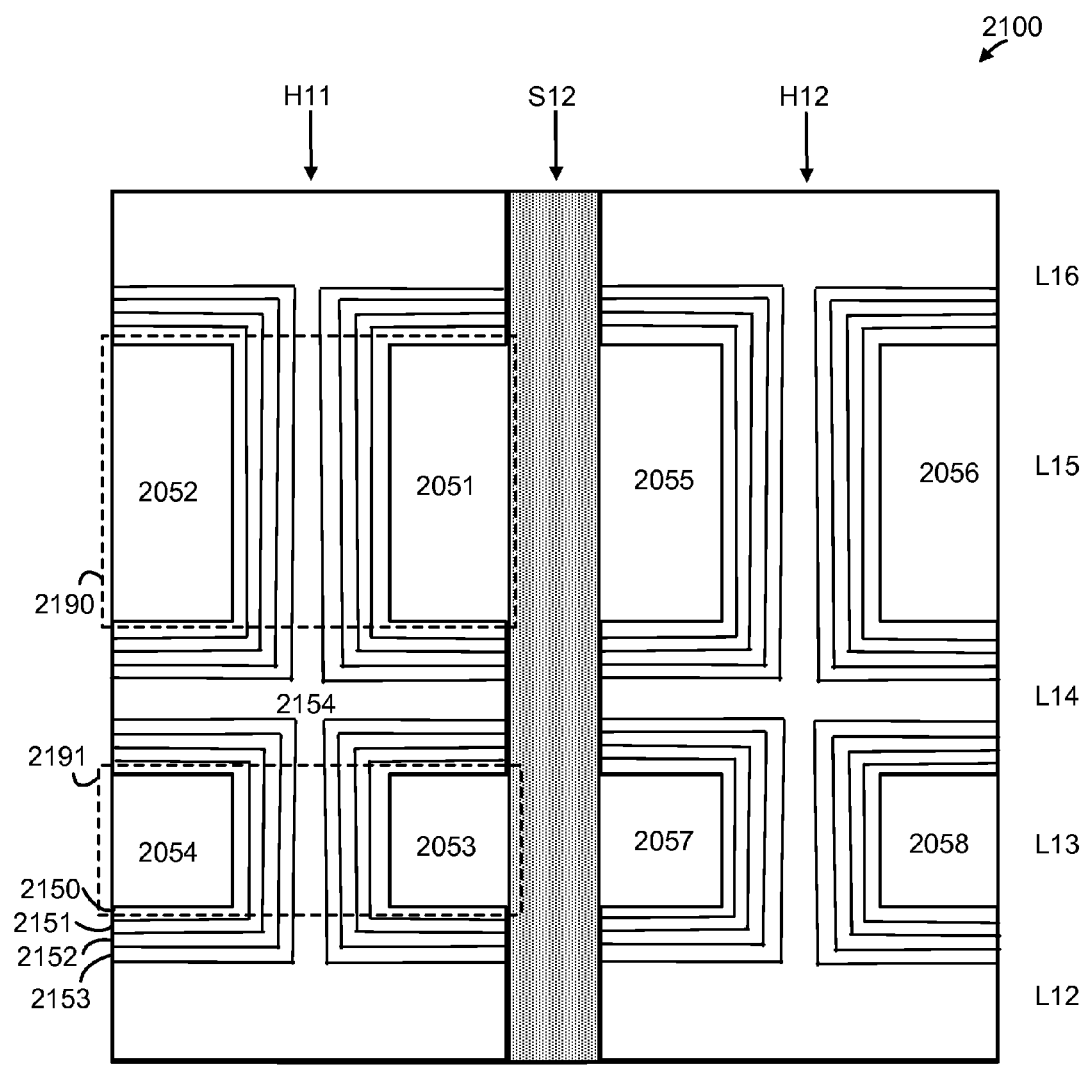
FIG. 21A depicts details of region 2100 in FIG. 20B.

FIG. 21A depicts details of region 2100 in FIG. 20B. For memory hole H11, regions 2051 and 2052 are metal silicide regions at L15, and regions 2052 and 2054 are metal silicide regions at L13. For memory hole H12, regions 2055 and 2056 are metal silicide regions at L15 and regions 2057 and 2058 are metal silicide regions at L13. Recall that L12, L14 and L16 are the dielectric layers and L13 and L15 are the conductive layers.

In one approach, the memory holes H11 and H12 are filled in by depositing ONO layers. For example, in memory hole H11, a block oxide can be deposited as layer 2150. Next, a nitride such as SiN as a charge trapping layer can be deposited as layer 2151. Next, a tunnel oxide can be deposited as layer 2152. Next, a polysilicon body can be deposited as layer 2153 in memory hole H11. Next, a core filler dielectric can be deposited as region 2154. The layers can be cylindrical, for instance, similar to FIG. 14B. Core filler region 2154 is inside the polysilicon body 2153, which is inside the tunnel oxide 2152, which is inside the nitride 2151, which is inside the block oxide 2150.

In the memory hole H11, a select gate 2190 and example memory cell 2191 are formed. Additional memory cells are similarly formed along the memory holes.

Figure 22A:
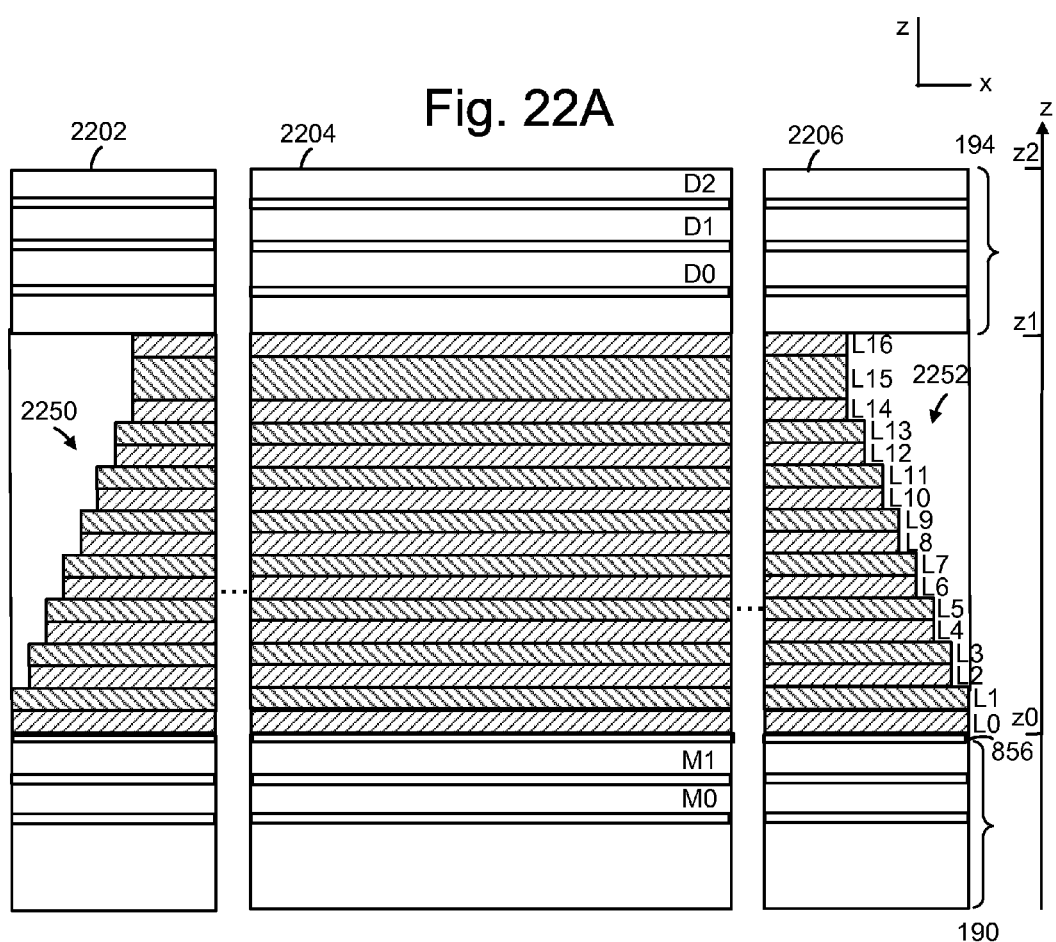
FIG. 22A depicts a cross-sectional view along line 580 of FIG. 5 of the plane 570, showing terraced portions 2250 and 2252 of the cell area CA3.

FIG. 22A depicts a cross-sectional view along line 580 of FIG. 5 of the plane 570, showing terraced portions 2250 and 2252 of the cell area CA3. For example, the terraced portions 2250 and 2252 may be at opposing first 2202 and second 2206 sides of the memory device 150. An intermediate region 2204 extends between the opposing sides. The terrace has steps at transitions between L1 and L2, L3 and L4, L5 and L6, L7 and L8, L9 and L10, L11 and L12, and L13 and L14.

Note that the z-axis denotes height, where z0 is a height of a top of the substrate 190, z1 is a height of a top of the stack and the bottom of the upper region 194 and z2 is a height of a top of the upper region 194.

Figure 22B:
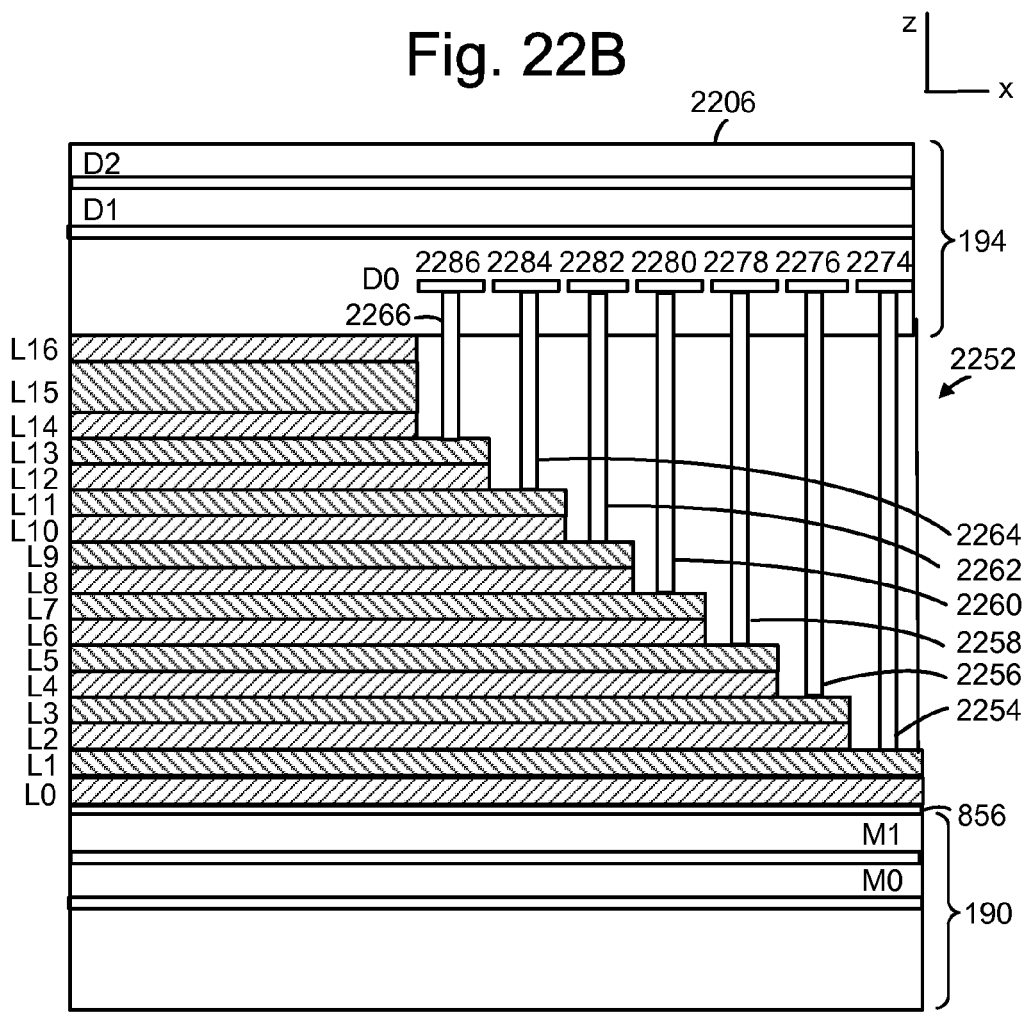
FIG. 22B depicts contact structures of the terraced portion 2252 of the cell area CA3 of FIG. 22A.

FIG. 22B depicts contact structures of the terraced portion 2252 of the cell area CA3 of FIG. 22A. Contact structures 2254, 2256, 2258, 2260, 2262, 2264 and 2266 extend upward from L1, L3, L5, L7, L9, L11 and L13, respectively, to portions 2274, 2276, 2278, 2280, 2282, 2284 and 2286, respectively, of an upper metal layer D0. D1 and D2 are example additional upper metal layers above D0. Additional contact structures among the upper metal layers can also be provided.

Figure 22C:
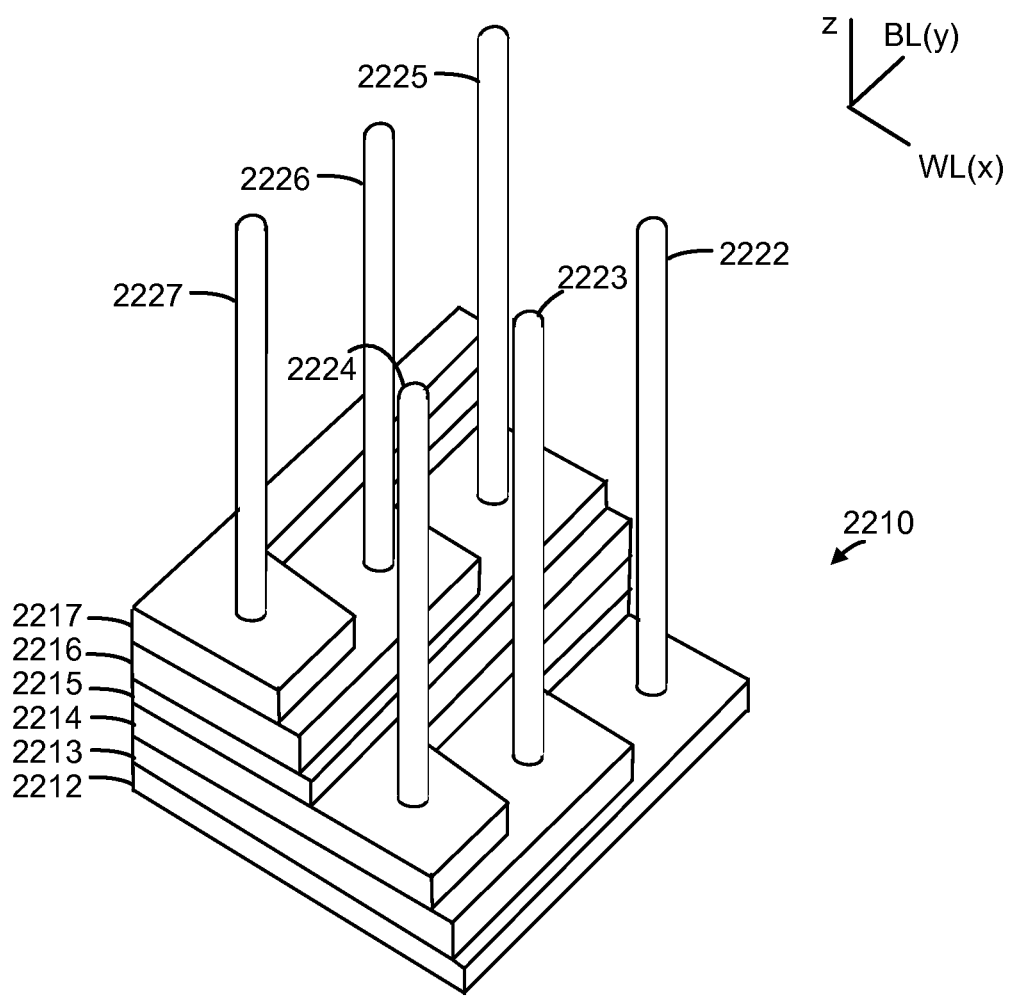
FIG. 22C depicts an example alternative terraced portion of a cell area with contact structures.

FIG. 22C depicts an example alternative terraced portion 2210 of a cell area with contact structures. This terraced portion includes a terrace or stair steps which are etched in both the x and y directions. The terraced portion thus extends in two perpendicular directions. As an example, each conductive layer 2212 to 2217 (such as a metal silicide word line layer) can be connected to a respective portion of an upper metal layer (not shown) via a respective contact pillar 2222 to 2227, respectively. The dielectric layers are between the conductive layers but are not depicted for simplicity. Moreover, the terraced portion may be used for one block, while an adjacent block has a similar but mirror image terraced portion. The blocks can be separated by an insulation-filled slit, as mentioned. This type of terrace configuration can similarly be provided in any of the other examples.

FIG. 23A depicts a cross-sectional view along line 590 of FIG. 5 of the plane 570, showing terraced portions 2350 and 2352 of the interconnect area IA1. The interconnect I1 of the interconnect area IA1 is depicted. For example, the terraced portions 2350 and 2352 may be at opposing first 2302 and second 2306 sides of the memory device 150 (corresponding to sides 2202 and 2206, respectively, in FIG. 22A). An intermediate region 2304 extends between the opposing sides. As in FIG. 22A, the terrace has steps at transitions between L1 and L2, L3 and L4, L5 and L6, L7 and L8, L9 and L10, L11 and L12, and L13 and L14. Example circuitry 860 is also depicted in a simplified form. The circuitry 860 could also be present in the view of FIG. 22A but is not depicted there for simplicity. The circuitry 860 is depicted in the view of FIG. 23A because of its functional relationship to the interconnect area.

FIG. 23B depicts contact structures of the terraced portion 2352 of the cell area CA3 of FIG. 23A. In one approach, a contact structure 2358 extends from L1 at the terraced portion 2352. In one approach, a contact structure 2356 extends from L16 at a top of the interconnect I1, within a perimeter of the stack. The contact structure 2358 extends to a portion 2354 of D0. Additional contact structures among the upper metal layers can also be provided.

In the substrate 190, the contact structure 868, 870 and 872 connect the circuitry 860 to a bottom portion of the interconnect I1, e.g., at L0. Thus, in one approach, a conductive path is made from the circuitry to the bottom portion of the interconnect I1, to the contact structure 2358 to D0. In another approach, a conductive path is made from the circuitry to the bottom portion of the interconnect, through the interconnect to the top of the interconnect, and through the contact structure 2356 to D0. A region 2355 represents dielectric in the completed memory device.

Figure 23C:
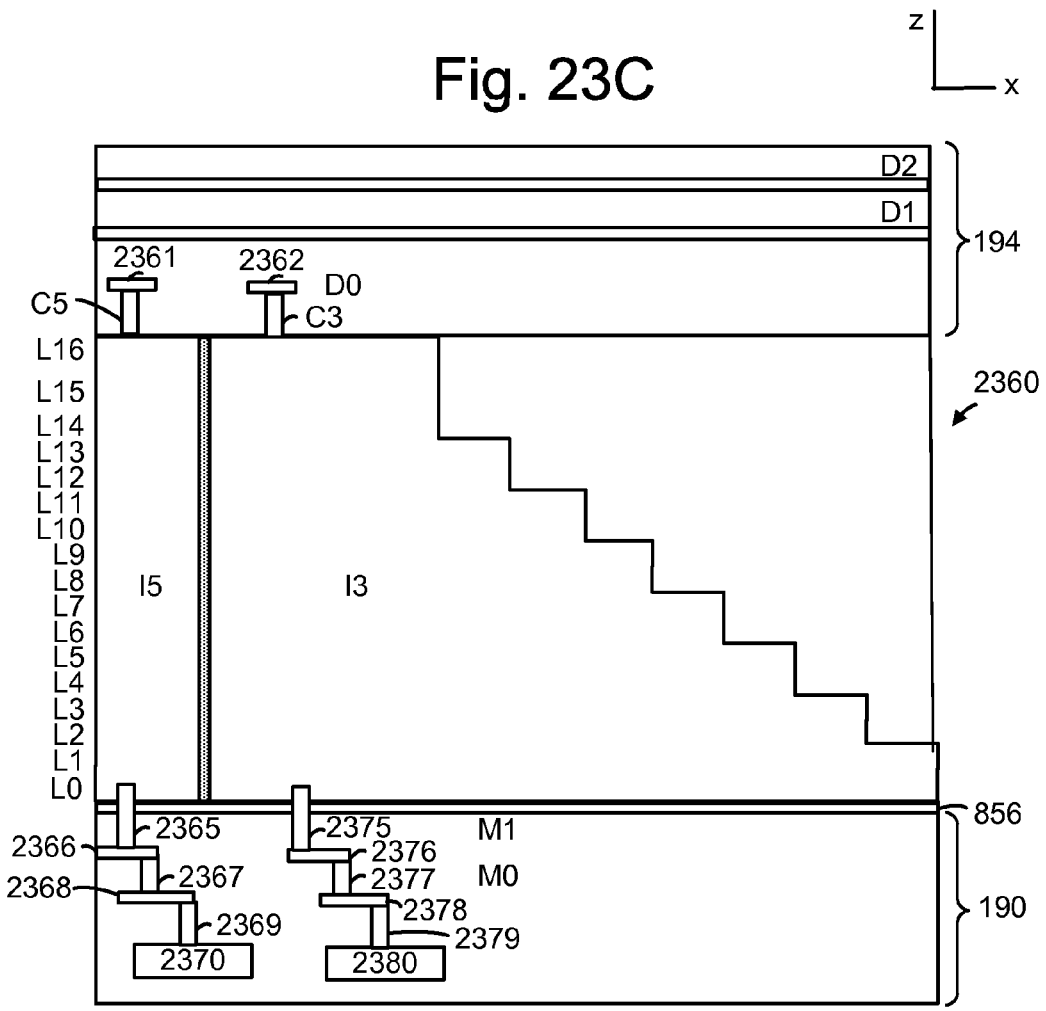
FIG. 23C depicts a cross-sectional view along line 440 of a portion of the plane 470 of FIG. 4.

FIG. 23C depicts a cross-sectional view along line 440 of a portion of the plane 470 of FIG. 4. The interconnect I3 connects circuitry 2380 to a portion 2362 of the upper metal layer D0 using the below-stack contact structures 2375, 2377 and 2379 and portions 2376 and 2378 of the lower metal layers M0 and M1, and the above-stack contact structure C3. The interconnect I5 connects circuitry 2370 to a portion 2361 of the upper metal layer D0 using the below-stack contact structures 2365, 2367 and 2369 and portions 2366 and 2368 of the lower metal layers M0 and M1, and the above-stack contact structure C5.

FIG. 24 depicts an end view of the plane 570 of FIG. 5, showing contact structures. In the cell area CA3, the contact structures which extend to the portions 2274, 2276, 2278, 2280, 2282, 2284 and 2286 of D0 are repeated from FIG. 22B. In the interconnect area IA1, the contact structure which extends to the portion 2354 of D0 is repeated from FIG. 23B. Additionally, in the cell area CA4, a number of contact structures which extend to portions 2474, 2476, 2478, 2480, 2482, 2484 and 2486 of D0 are depicted. In this example, separate contact structures are used in the separate cell areas.

Figure 25:
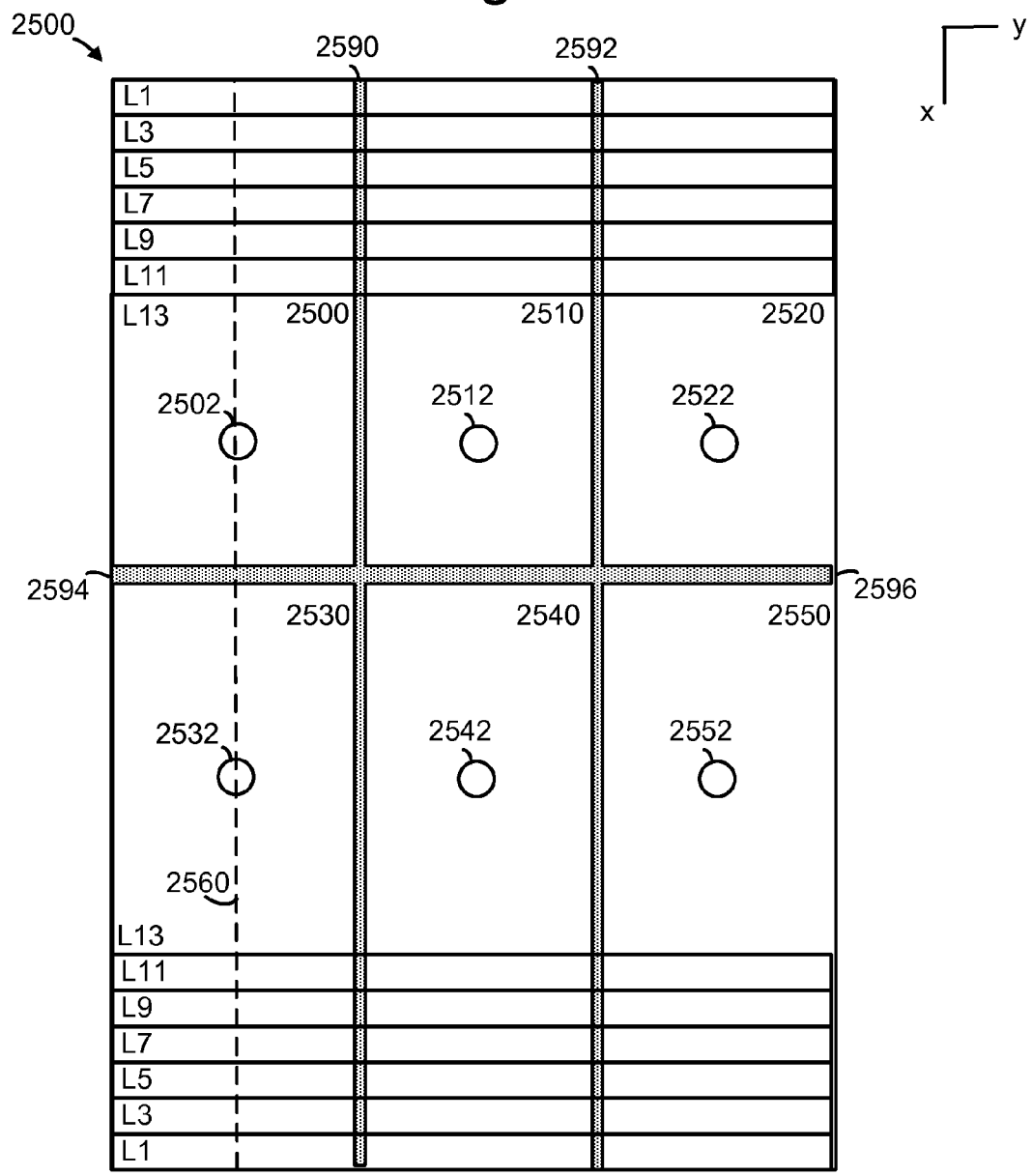
FIG. 25 depicts a top view of a peripheral region of a substrate which includes stacked interconnects 2500.

FIG. 25 depicts a top view of a peripheral region of a substrate which includes stacked interconnects 2500. In this aspect, the capability to interconnect a lower metal layer with an upper metal layer is provided at a location on the substrate which is lateral of a 3D stacked non-volatile memory cell array comprising one or more planes such as planes 160 and 170 of FIG. 1B. The stacked interconnects 2500 can be provided in the peripheral region 182 and/or 184, for instance. Moreover, this feature can be provided regardless of the presence of an in-plane interconnect. Although, the fabrication of a peripheral interconnect can occur concurrently, at least in part, and using common process steps, with the fabrication of an in-plane interconnect, so that efficiencies are achieved.

In this example, insulation-filled slits 2590, 2592, 2594 and 2596 are used to divide the stack into six portions, including interconnects 2500, 2510, 2520, 2530, 2540 and 2550, having associated contact structures 2502, 2512, 2522, 2532, 2542 and 2552, respectively. The fabrication of the interconnects in the peripheral region can proceed essentially in the same way as for the in-plane interconnects. The interconnects can be made of metal silicide, for instance. The pattern and size of the slits can be selected to ensure effective silicidation.

Figure 26A:
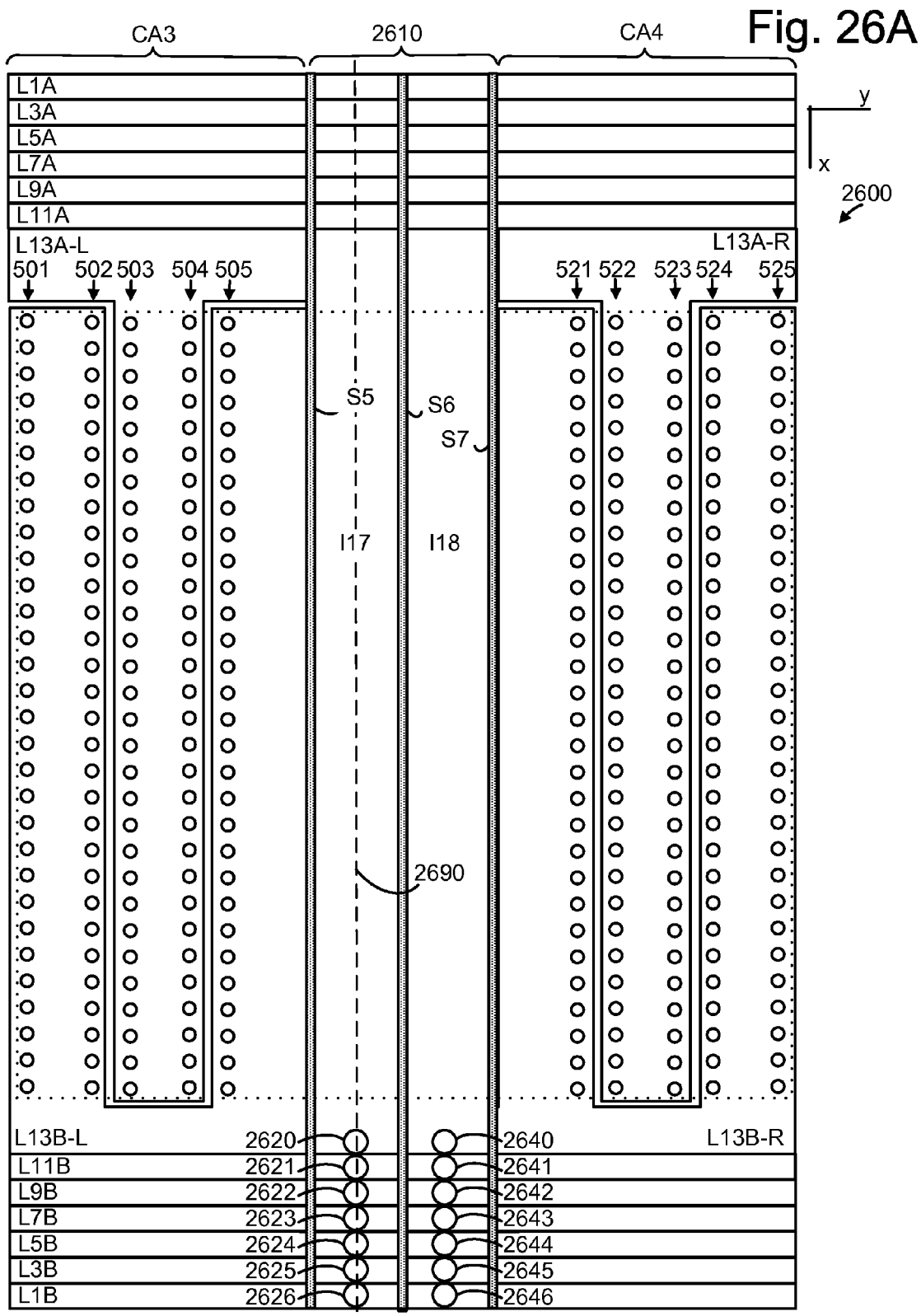
FIG. 26A depicts a top view of another embodiment of the plane 570 of FIG. 5 as plane 2600.

FIG. 26A depicts a top view of another embodiment of the plane 570 of FIG. 5 as plane 2600. In this approach, an interconnect which is not metal silicide is used. Specifically, the interconnect area 2610 uses the alternating layers of undoped/lightly doped and doped polysilicon as the cell areas CA3 and CA4 to provide conductive interconnects 117 and 118. The interconnect 117 has its heavily doped polysilicon layers connected in parallel by contact structures 2620 to 2626 to one or more upper metal layers. Similarly, the interconnect 118 has its heavily doped polysilicon layers connected in parallel by contact structures 2640 to 2646 to one or more upper metal layers. This approach can provide an interconnect with a relatively low resistance due to the relatively low resistance of the heavily doped polysilicon layers. An advantage is that silicidation need not be performed.

In another approach, instead of depositing alternating layers of undoped/lightly doped and heavily doped poly and performing steps to replace the undoped/lightly doped poly with dielectric, it is possible to directly deposit alternating layers of dielectric such as SiO2 and heavily doped poly. In another option, it is possible to directly deposit alternating layers of metal and dielectric, where silicidation is not used to provide the metal. The conductive word line layers (e.g., heavily doped poly or metal) are then connected in parallel as described.

Figure 26B:
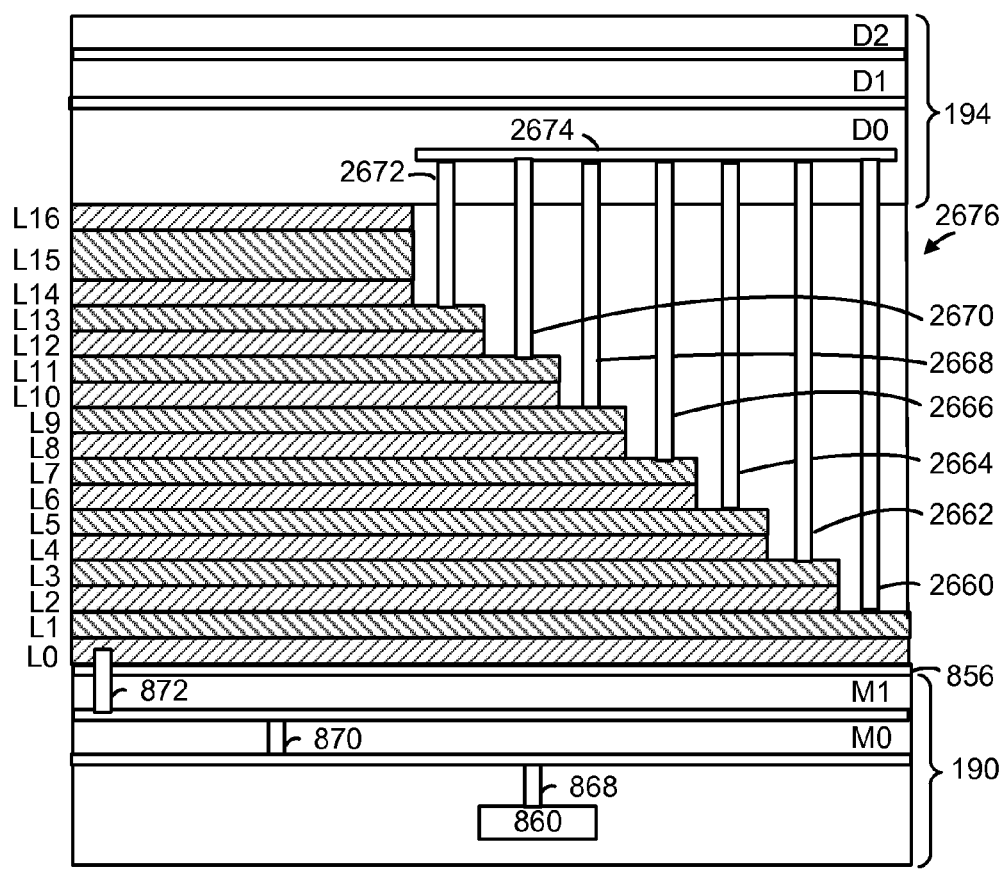
FIG. 26B depicts a cross-sectional view along line 2690 of FIG. 26A, showing heavily doped polysilicon layers connected in parallel.

FIG. 26B depicts a cross-sectional view along line 2690 of FIG. 26A, showing heavily doped polysilicon layers connected in parallel. At a side 2676 of the plane 2600, contact structures 2660, 2662, 2664, 2666, 2668, 2670 and 2672 extend from L1, L3, L5, L7, L9, L11 and L13, respectively, to the upper metal layer 2674. The layers L1, L3, L5, L7, L9, L11 and L13 of heavily doped polysilicon are therefore connected in parallel. In one approach, a conductive path is made from the circuitry 860 to the bottom layer L0 of the stack, and to the upper metal layer 2882 via the other heavily doped polysilicon layers L3, L5, L7, L9, L11 and L13. Thus, a signal can be sent from the circuit 860 through multiple layers of parallel wires (e.g., made of heavily doped silicided poly or metal if the layers are used for word lines) to another part of the chip, where this interconnect wire has similar connections as discussed to the top (over array metal) or bottom (under array metal).

Figure 27A:
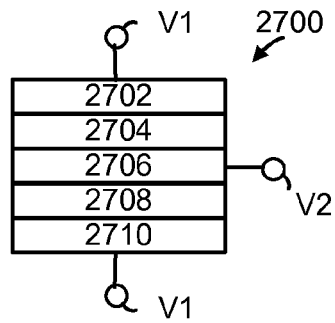
FIG. 27A depicts a capacitor in a 2D memory device.

FIG. 27A depicts a capacitor in a 2D memory device. Passive circuit elements such as capacitors and resistors are necessary for most integrated circuits, including high density memory. For instance, an example capacitor 2700 in a 2D NAND memory device can have two capacitors connected in parallel. A capacitor comprises two conductive plates separated by a dielectric layer. One capacitor can be formed by a floating gate polysilicon layer 2706 and an n+ diffusion layer 2710 in the silicon substrate as the conductive plates, and a tunnel oxide layer 2708 as the dielectric. A second capacitor can be formed by a control gate polysilicon layer 2702 and the floating gate polysilicon layer 2706 as the conductive plates, and an intermediate ONO (inter-poly dielectric) layer 2704 as the dielectric. V1 and V2 are voltages at respective terminals of the capacitor. These capacitor layers are available as horizontal layers which are deposited during the fabrication process. The total capacitance for a given area of the substrate is the sum of the individual capacitances. Specifically, during the fabrication of these layers for a memory cell, the same layers can be provided laterally of the memory cell such as in a peripheral region and used to provide a passive circuit element. The portions of the layers in the peripheral region can be at the same or a different height above the substrate as the corresponding portions of the layers of the memory cells.

Figure 27B:
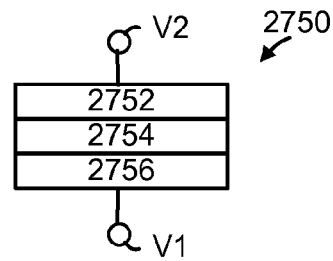
FIG. 27B depicts a capacitor in a 3D memory device.

However, in a 3D memory device such as 3D NAND, the ONO layer 2704 is not available because it is deposited as a vertical layer on the memory hole sidewalls (see FIGS. 14A and 21A). Thus, a portion of the layer does not extend into the peripheral region. Instead, a 3D NAND device could use a single low-voltage gate oxide capacitor (FIG. 27B). However, the capacitance per unit area of the low voltage gate oxide capacitor is less than that of an ONO capacitor in a 2D floating gate NAND device comprised of tunnel and ONO capacitors in parallel, e.g., half as much, resulting in excessive use of the substrate area.

Moreover, the 2D NAND device can use the floating gate polysilicon layer as a resistor, but this layer also is not available in the peripheral area of a 3D memory device. Or, a poly and/or well resistor can be used. In either case, the resistance per unit area which can be achieved in the peripheral area of a 3D memory device is relatively small, resulting in excessive use of the substrate area.

These problems are compounded by the need for higher voltages which require larger transistors and passive elements. Reducing the peripheral area would help reduce overall chip size. The passive circuit elements described can be used in different type of 3D memory device including NAND and resistive RAM (ReRAM). Further, the passive circuit elements can be used in different type of chips, such as logic chips and memory chips.

An example application of a capacitor is in a charge pump circuit which boosts an external voltage such as 3 V to a high programming voltage such as 15 to 25 V.

FIG. 27B depicts a capacitor in a 3D memory device. The capacitor 2750 includes a low-voltage gate oxide layer 2754 as a dielectric layer between a word line polysilicon layer 2752 and an n+ diffusion layer 2756 as the conductive plates. V1 and V2 are voltages at respective terminals of the capacitor.

Figure 28A:
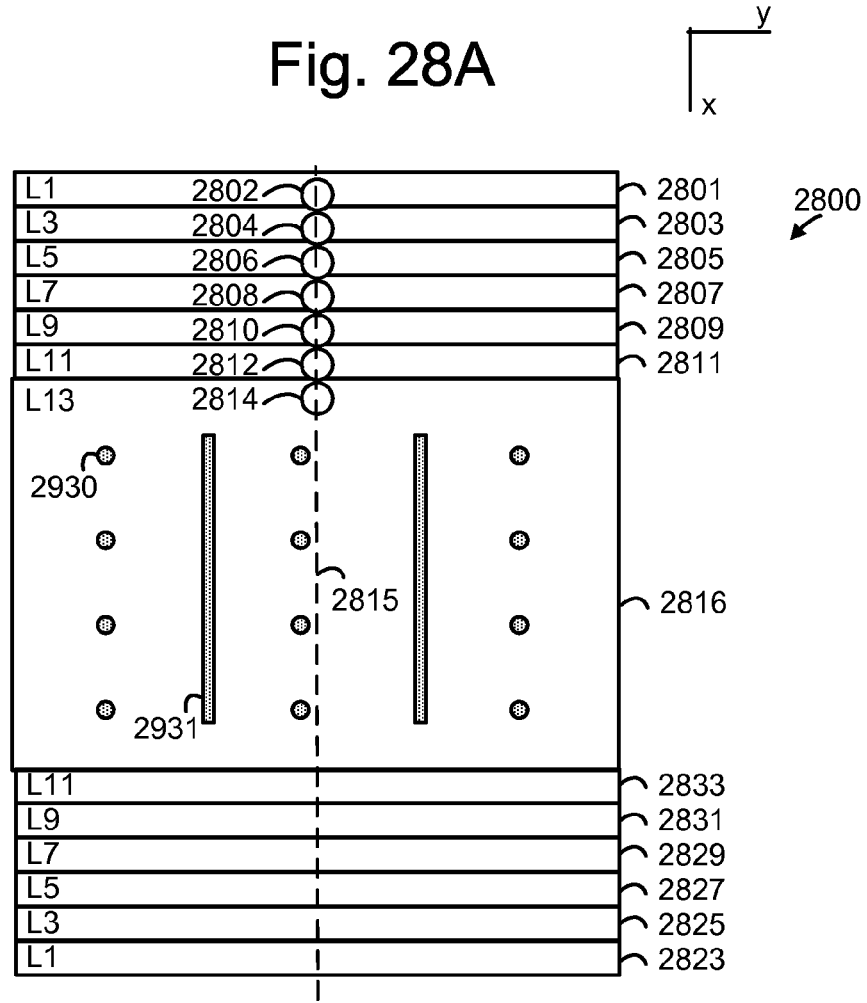
FIG. 28A depicts a top view of one embodiment of a passive device as a capacitor in the peripheral region 182 of the 3D stacked non-volatile memory device 150 of FIG. 1B.

FIG. 28A depicts a top view of one embodiment of a passive device 2800 as a capacitor in the peripheral region 182 of the 3D stacked non-volatile memory device 150 of FIG. 1B. A space-efficient passive device can be provided by taking advantage of a stacked structure of alternating layers of a conductive material (such as heavily doped polysilicon, which is optionally silicided to transform it to metal silicide) and a dielectric (such as SiO2, deposited in place of removed undoped/lightly doped poly). Each dielectric layer could comprise a single dielectric material, or multiple layers of dielectric materials, in this and other embodiments. Every other conductive layer can be connected in parallel, e.g., odd layers to one potential and even layers to another potential, so that multiple layer capacitors are connected in parallel. The multiple conductive layers of the odd layers are effectively one conductive plane of an overall capacitor, and the multiple conductive layers of the even layers are effectively another conductive plane of an overall capacitor. The total capacitance will therefore be the sum of the individual capacitances. Due to the vertical arrangement of the stack, a very high capacitance per unit area of the substrate can be achieved.

Here, a stacked passive device structure 2800 includes layers L1, L3, L5, L7, L9, L11 and L13 of a conductive material such as heavily doped polysilicon or metal silicide. The terraced ends are formed so that the conductive layers are accessible to contacts. The intervening layers of dielectric (not shown here) are L2, L4, L6, L8, L10 and L12 (see FIGS. 29A, 30A and 31A to 31E). L0 is also a dielectric layer. The passive device structure 2800 has opposing tiered sides at the top and bottom of the figure. Specifically, one side has tiers or steps 2801, 2803, 2805, 2807, 2809, 2811 and 2816 at L1, L3, L5, L7, L9, L11 and L13, respectively. In this example, contact structures are provided on one side of the stack, but other variations are possible. For example, contact structures 2802, 2804, 2806, 2808, 2810, 2812 and 2814 are provided on tiers 2801, 2803, 2805, 2807, 2809, 2811 and 2816, respectively. Another side of the stack includes tiers 2823, 2825, 2827, 2829, 2831 and 2833 at L1, L3, L5, L7, L9, L11 and L13, respectively.

The stacked passive device structure can include a number of holes (e.g., 2930) and/or slits (e.g., 2931). For either a capacitor or resistor, the holes and/or slits are provided to allow a wet etch process to remove the undoped/lightly doped polysilicon layer, to perform subsequent deposition of a dielectric, and to optionally perform subsequent silicidation of the heavily doped polysilicon, similar to the processing of the memory array as discussed previously. Subsequently, the holes and/or slits are filled with insulation. The holes in the passive device can be provided using the same memory hole mask and process step used for the memory array, in one approach. For a capacitor, the hole pattern density can be a minimum to avoid unnecessarily reducing the capacitor plate area (capacitance is proportional to area holes reduce the area), but the hole pattern density should be sufficient to remove the undoped/lightly doped polysilicon. For a resistor, holes and/or slits can also be used to remove the undoped/lightly doped polysilicon. However, a high density hole pattern can be used, such as the same pattern as in the memory array, to increase resistance. Silicidation need not be performed for the heavily doped polysilicon in the resistor (since silicidation decreases resistance).

The use of holes and slits in the passive device allows the introduction of a wet etchant, a dielectric and a metal for silicidation, while also allowing close integration with the fabrication of the memory array. However, other types of vertical voids can be used alternatively or additionally. In one approach, the holes are used to introduce the wet etchant, and the slits are filled with insulation to provide support for the device when the undoped/lightly doped poly is removed. In one approach, the slits are used to introduce the wet etchant, and the memory holes are filled with insulation to provide support for the device when the undoped/lightly doped poly is removed.

The holes in the passive device need not be used to create memory cells. The holes can be replacement holes, e.g., simply holes or vertical voids or columns which are filled with insulation in the completed device.

In the memory array and the passive device, the holes may have a generally square cross-section when first drawn. After lithography, they become more like circles and after an etch, more like cylinders. Also, when a wet etch is used, essentially all of the undoped/lightly doped polysilicon layer is removed in the capacitor and resistor embodiments to avoid short circuits between the conductive plates.

Figure 29A:
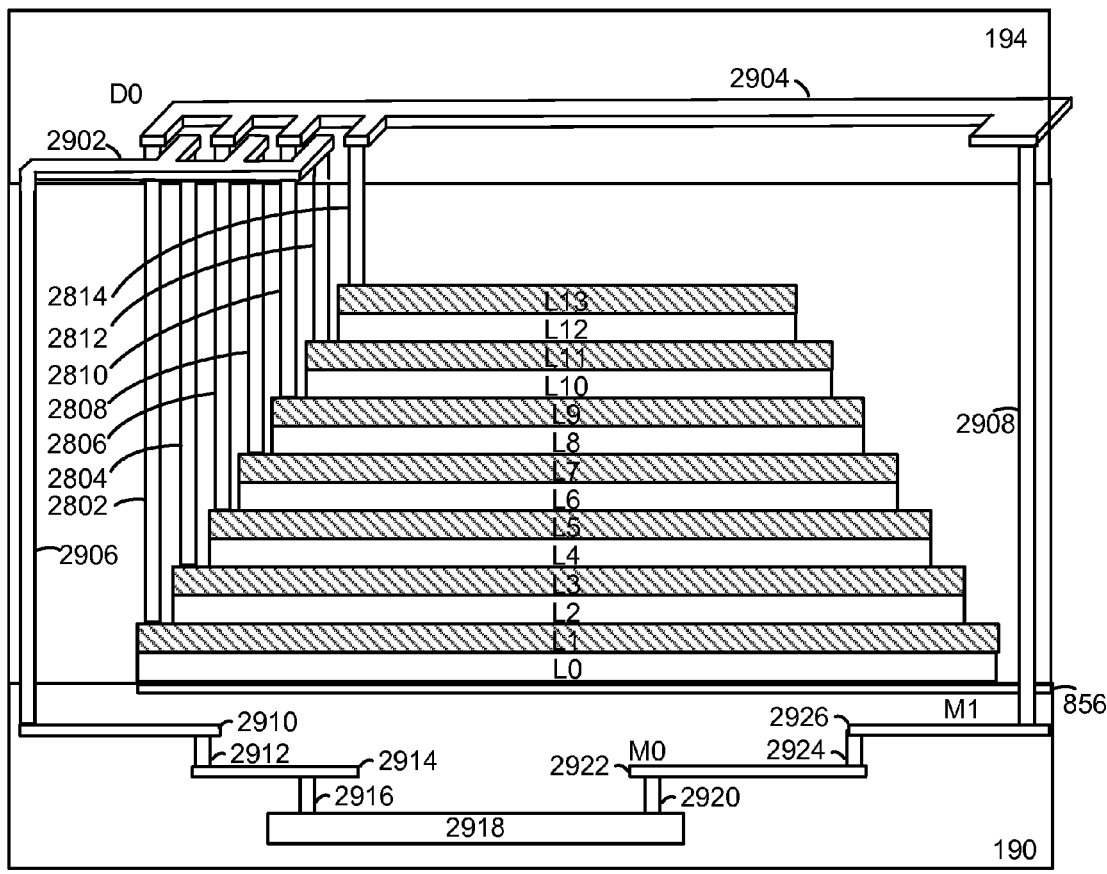
FIG. 29A depicts a cross-sectional view of the passive device 2800 of FIG. 28A along line 2815 as a capacitor.

See FIG. 29A for a cross-sectional view along line 2815.

Figure 28B:
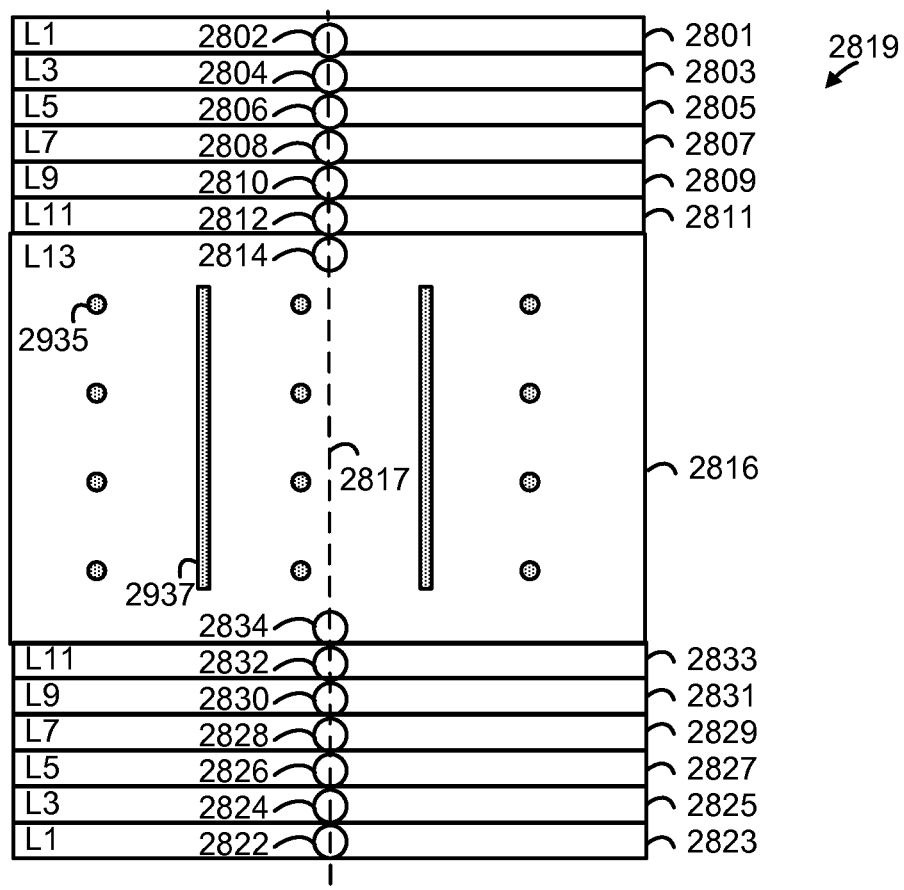
FIG. 28B depicts a top view of another embodiment of a passive device as a resistor in the peripheral region 182 of the 3D stacked non-volatile memory device 150 of FIG. 1B.

FIG. 28B depicts a top view of another embodiment of a passive device 2819 as a resistor in the peripheral region 182 of the 3D stacked non-volatile memory device 150 of FIG. 1B. For a 3D resistor, the conductive layers (e.g., L1, L3, L5, L7, L9, L11 and L13) are connected in series, end to end, to increase resistance per unit area. In this device, additional contact structures 2822, 2824, 2826, 2828, 2830, 2832 and 2834 are provided on tiers 2823, 2825, 2827, 2829, 2831 and 2833 at L1, L3, L5, L7, L9, L11 and L13, respectively. The stacked passive device structure can include a number of holes (e.g., 2935) and slits (e.g., 2937). The dielectric layers (e.g., L0, L2, L4, L6, L8, L10 and L12, not shown here) alternate with the conductive layers. See FIG. 30A for a cross-sectional view along line 2817. Note that the terraced ends are formed so that the conductive layers are accessible to contacts.

Figure 28C:
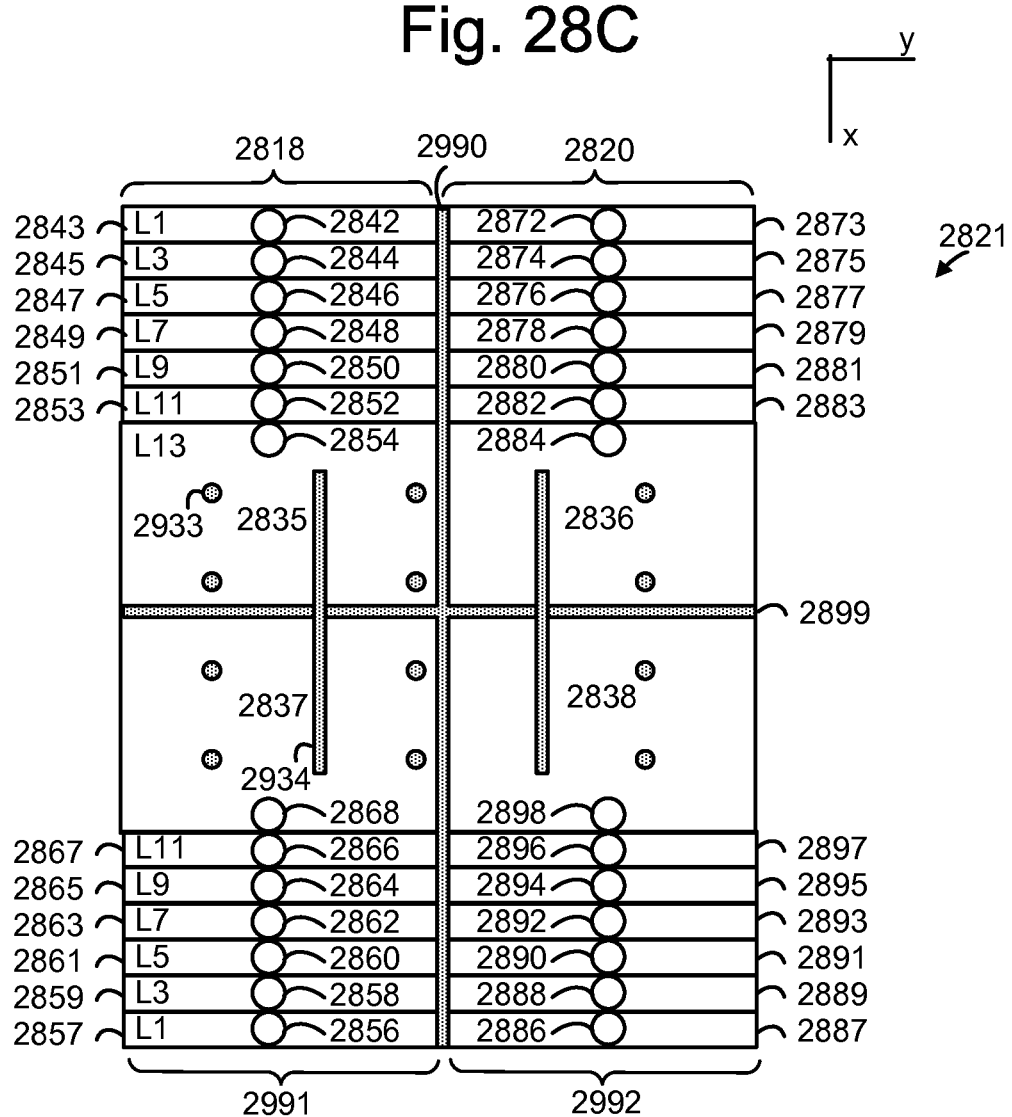
FIG. 28C depicts a top view of another embodiment of a passive device as multiple capacitors in the peripheral region 182 of the 3D stacked non-volatile memory device 150 of FIG. 1B.

FIG. 28C depicts a top view of another embodiment of a passive device 2821 as multiple capacitors in the peripheral region 182 of the 3D stacked non-volatile memory device 150 of FIG. 1B. Insulation-filled slits 2990 and 2899 are provided which divided the stack into four passive devices 2818, 2820, 2991 and 2992. The passive device 2818 includes tiers 2843, 2845, 2847, 2849, 2851, 2853 and 2835 at conductive layers L1, L3, L5, L7, L9, L11 and L13, respectively, and contact structures 2842, 2844, 2846, 2848, 2850, 2852 and 2854, respectively. Here and elsewhere, contacts can be provided using the same method, integration scheme, terrace structure, design rules, and so forth as for memory array connections to word line layers.

The passive device 2820 includes tiers 2873, 2875, 2877, 2879, 2881, 2883 and 2836 at L1, L3, L5, L7, L9, L11 and L13, respectively, and contact structures 2872, 2874, 2876, 2878, 2880, 2882 and 2884, respectively.

The passive device 2991 includes tiers 2857, 2859, 2861, 2863, 2865, 2867 and 2837 at L1, L3, L5, L7, L9, L11 and L13, respectively, and contact structures 2856, 2858, 2860, 2862, 2864, 2866 and 2868, respectively.

The passive device 2838 includes tiers 2887, 2889, 2891, 2893, 2895, 2897 and 2899 at L1, L3, L5, L7, L9, L11 and L13, respectively, and contact structures 2886, 2888, 2890, 2892, 2894, 2896 and 2898, respectively.

This approach allows multiple passive devices to be constructed from a common stack. The stacked passive device structure can include a number of holes (e.g., 2933) and slits (e.g., 2899 and 2934).

FIG. 29A depicts a cross-sectional view of the passive device 2800 of FIG. 28A as a capacitor along line 2815 (portions of the upper metal layer are shown in perspective). The contact structures 2802, 2806, 2810 and 2814 extend vertically upward from conductive layers L1, L5, L9 and L13, respectively, to a first common portion 2904 of an upper metal layer D0, so that L1, L5, L9 and L13 are conductive plates of a capacitor which are connected in parallel. The contact structures 2804, 2808 and 2812 extend vertically upward from conductive layers L3, L7 and L11, respectively, to a different, second common portion 2902 of the upper metal layer D0, so that L3, L7 and L11 are conductive plates of a capacitor which are connected in parallel. The first 2904 and second 2902 common portions of the upper metal layers may be terminals of a capacitor which can be connected to any desired circuitry. This is one possible implementation, as layouts of one or more metal layers for connections to capacitor plates can vary in many different ways.

In one possible approach, the terminals are connected to circuitry 2918 in the substrate 190. For example, the first common portion 2904 of the upper metal layer D0 can be connected to the circuitry 2918 using a contact structure 2908, a portion 2926 of M1, a contact structure 2924, a portion 2922 of M0 and a contact structure 2920. Similarly, the second common portion 2902 of the upper metal layer D0 can be connected to the circuitry 2918 using a contact structure 2906, a portion 2910 of M1, a contact structure 2912, a portion 2914 of M0 and a contact structure 2916. This is an example only. The circuitry can be, but need not, be located directly under the passive device 2800.

The contact structures can be formed by extending at least one of the contact structures (e.g., 2802) from one layer (e.g., L1) of the layers of conductive material to a portion 2904 of the at least one upper metal layer, and extending at least another of the contact structures (e.g., 2806) from another layer (e.g., L5) of the layers of conductive material to the portion 2904 of the at least one upper metal layer. The forming of the contact structures can comprise extending at least an additional contact structure (e.g., 2804) of the contact structures from an additional layer (e.g., L3) of the layers of conductive material to another portion 2902 of the at least one upper metal layer, and extending at least a further contact structure (e.g., 2808) of the contact structures from a further layer (e.g., L7) of the layers of conductive material to the another portion 2902 of the at least one upper metal layer.

Figure 29B:
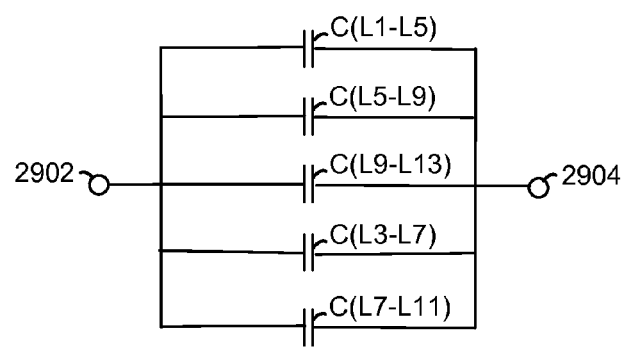
FIG. 29B depicts a circuit diagram of a capacitor corresponding to FIG. 29A.

FIG. 29B depicts a circuit diagram of a capacitor corresponding to FIG. 29A. A capacitance C(L1-L5) is provided by conductive plates L1 and L5, a capacitance C(L5-L9) is provided by conductive plates L5 and L9, a capacitance C(L9-L13) is provided by conductive plates L9 and L13, a capacitance C(L3-L7) is provided by conductive plates L3 and L7, and a capacitance C(L7-L11) is provided by conductive plates L7 and L11. The total capacitance is therefore C(L1-L5)+C(L5-L9)+C(L9-L13)+C(L3-L7)+C(L7-L11). The capacitor has a capacitance which is a function of overlapping areas of the plates, separation distances between the plates, and a dielectric constant of the dielectric material. For example, for a parallel plate capacitor, Capacitance=k×∈0× area/separation, or C=k∈0A/d, where: k is the relative dielectric permittivity of dielectric, ∈0 is the permittivity of space (vacuum) 8.854e-12 F/m, A is the capacitor area, and d is the separation between plates or the dielectric thickness.

In one example, depending on circuit implementation needs, by proper connection of the plates, we can use a part of layers or all layers for a capacitor, to obtain different capacitances for a capacitor device (from the same 3D capacitor structure) for different circuit elements, depending how many layers are used.

Figure 30A:
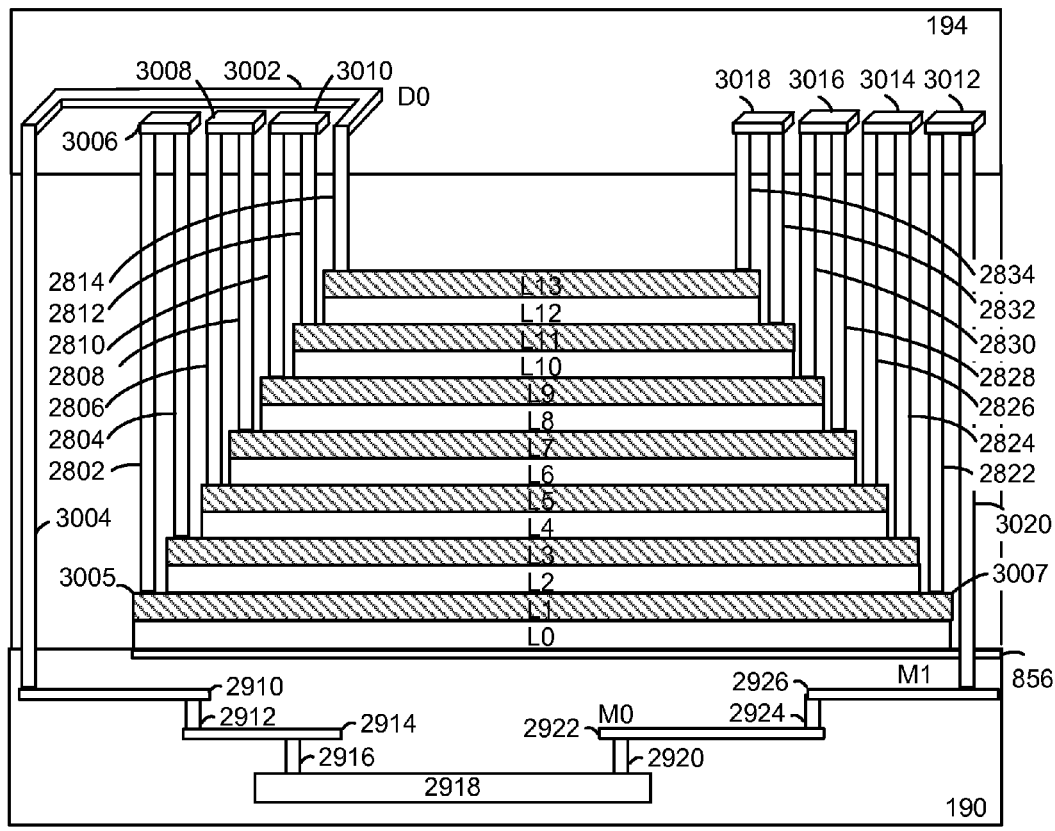
FIG. 30A depicts a cross-sectional view of the passive device 2819 of FIG. 28B along line 2817 as a resistor.

FIG. 30A depicts a cross-sectional view of the passive device 2819 of FIG. 28B along line 2817 as a resistor (portions of the upper metal layer are shown in perspective). To provide a resistor, the conductive layers (comprising heavily doped poly or metal silicide) are connected serially, end to end, so that a conductive path travels a length of each conductive layer. The length here is a distance in the x direction, from tiered end to tiered end of the stack. Generally, resistance is proportional to the length of a conductor, and the length is a wire dimension in the direction of current. Each conductive layer becomes a resistive component in a resistor whose resistance is a function of a sum of the resistances of the respective conductive layers. In one approach, at one of the terraced sides of the passive device, the contact structures 2802 and 2804 extend vertically upward from L1 and L3, respectively, to a first portion 3006 of D0, the contact structures 2806 and 2808 extend vertically upward from L5 and L7, respectively, to a second portion 3008 of D0, the contact structures 2810 and 2812 extend vertically upward from L9 and L11, respectively, to a third portion 3010 of D0, and the contact structure 2814 extends vertically upward from L13 to a fourth portion 3002 of D0.

Here and elsewhere, D0 can be used to connect to an individual layer. D0 can also be used to connect several layers (e.g., plates of a capacitor, or of a resistor). In some implementations, D0 connects to the upper metal D1, and D1 is used to connect several layers and carry signals. Actual implementation details can depend on layout circuit convenience/feasibility.

In one example, depending on circuit implementation needs, by proper connection of the plates, a part of one or more layers, or all of one or more conductive layers, can be used to provide different resistances for a resistor device (from the same 3D resistor structure) for different circuit elements, depending how many layers are used. For example, a part of one or more layers can be used to provide a lower resistance, while all of one or more conductive layers can be used to provide a higher resistance. See, e.g., FIG. 31F which shows two resistors formed from different sets of conductive layers.

On another of the terraced sides of the passive device, the contact structure 2822 extends vertically upward from L1 to a fifth portion 3012 of D0, the contact structures 2824 and 2826 extend vertically upward from L3 and L5, respectively, to a sixth portion 3014 of D0, the contact structures 2828 and 2830 extend vertically upward from L7 and L9, respectively, to a seventh portion 3016 of D0, and the contact structures 2832 and 2834 extend vertically upward from L11 and L13, respectively, to an eighth portion 3018 of D0.

The contact structures can be provided close to the lateral end of the conductive layers so that the full resistance of the conductive layer is realized. For example, regions 3005 and 3007 represent opposing ends or sides of the conductive layer L1.

The fifth 3012 and eighth 3018 portions (or the fourth portion 3002, connected to the eight portion 3018) of D0 may be terminals of a resistor which can be connected to any desired circuitry. In one possible approach, the terminals are connected to circuitry 2918 in the substrate 190. For example, the fifth portion 3012 of D0 can be connected to the circuitry 2918 using a contact structure 3020 which extends down to the portion 2926 of M1, discussed previously. The fourth portion 3002 of D0 can be connected to the circuitry 2918 using a contact structure 3004 which extends down to the portion 2910 of M1, discussed previously.

In a capacitor or resistor, it is also possible to connect a lower metal layer portion to L1 by using a contact structure which extends through the etch stop layer 856, as discussed previously.

As a variation, the shape of the conductive layer can be modified, e.g., to have a serpentine shape, with a goal of increasing the resistance. There are a variety of possible implementations of shapes and connections. Also, the back gate can be used as a resistor. A back gate plate can be added to the conductive word line plates to form a multi-layer resistor. A back gate layer can be used as an individual resistor, or as a part of 3D resistor. Similarly, select gate poly plates can also be used for a resistor, either separately, or as a part of 3D stacked resistor.

The stack has opposing first 3101 (FIG. 31F) and second 3103 sides, and the forming a plurality of contact structures comprises: extending at least one of the contact structures (e.g., 2802) at the first side from one layer (e.g., L1) of the layers of conductive material to a portion (e.g., 3006) of the at least one upper metal layer, extending at least another of the contact structures (e.g., 2804) at the first side from another layer (e.g., L3) of the layers of conductive material to the portion (e.g., 3006) of the at least one upper metal layer, extending at least one of the contact structures (e.g., 2824) at the second side from the another layer (e.g., L3) of the layers of conductive material to another portion (e.g., 3014) of the at least one upper metal layer, and extending at least another of the contact structures (e.g., 2826) at the second side from an additional layer (e.g., L5) of the layers of conductive material to the another portion (e.g., 3014) of the at least one upper metal layer, where the another layer (e.g., L3) is above the one layer (e.g., L1) and the additional layer (e.g., L5) is above the another layer (e.g., L3).

Figure 30B:
FIG. 30B depicts a circuit diagram of a resistor corresponding to FIG. 30A.

FIG. 30B depicts a circuit diagram of a resistor corresponding to FIG. 30A. A series chain of resistances R(L1), R(L3), R(L5), R(L7), R(L9), R(L11) and R(L13) is provided by the conductive layer L1, L3, L5, L7, L9, L11 and L13, respectively.

Figure 31A:
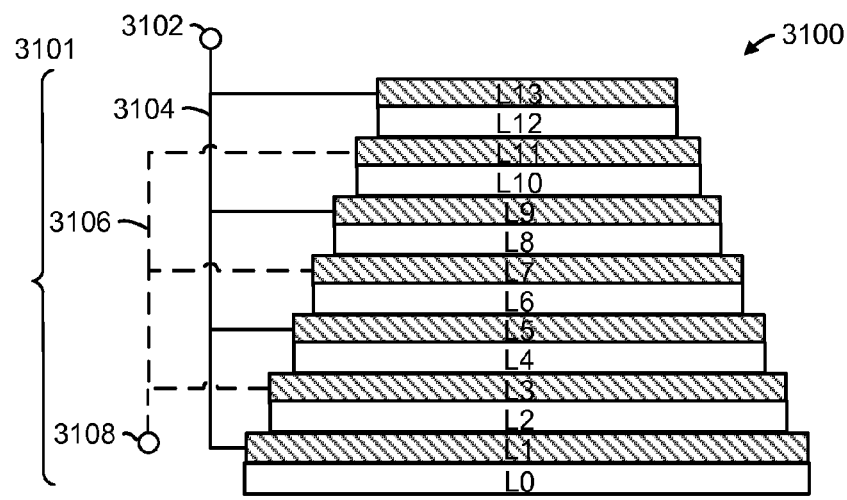
FIG. 31A depicts one embodiment of a passive device as a capacitor formed by a stack of alternating layers of a conductive material and a dielectric material, with contacts on a first side of the stack.

FIG. 31A depicts one embodiment of a passive device as a capacitor formed by a stack of alternating layers of a conductive material and a dielectric material, with contacts on a first side of the stack. This corresponds to the arrangement of FIG. 29A. Having the contact structures on one side is useful, for instance, to provide an efficient layout, or when only one terraced side of the passive device is exposed, as in the embodiment of FIG. 28C. A passive device 3100 has terminals 3102 and 3108, and includes, on one side 3101, a conductive path 3104 which connects L1, L5, L9 and L13, and a conductive path 3106 which connects L3, L7 and L11. The conductive paths can be formed, e.g., by contact structures, and upper and lower metal layer structures.

Figure 31B:
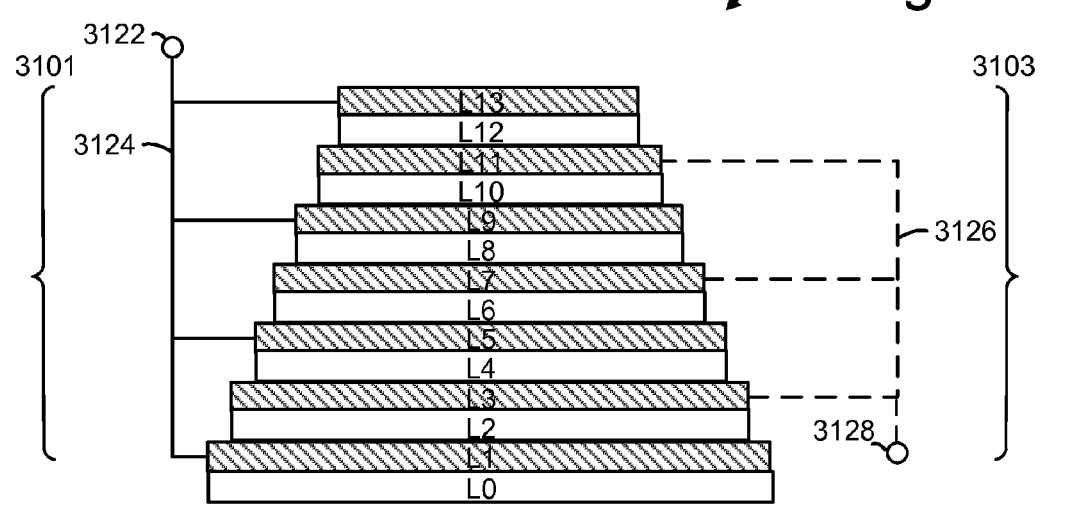
FIG. 31B depicts one embodiment of a passive device as a capacitor formed by a stack of alternating layers of a conductive material and a dielectric material, with contacts on opposing first and second sides of the stack.

FIG. 31B depicts one embodiment of a passive device 3120 as a capacitor formed by a stack of alternating layers of a conductive material and a dielectric material, with contacts on opposing first and second sides of the stack. The passive device has terminals 3122 and 3128 and includes, on one side 3101, a conductive path 3124 which connects L1, L5, L9 and L13, and on another side 3103, a conductive path 3106 which connects L3, L7 and L11.

Figure 31C:
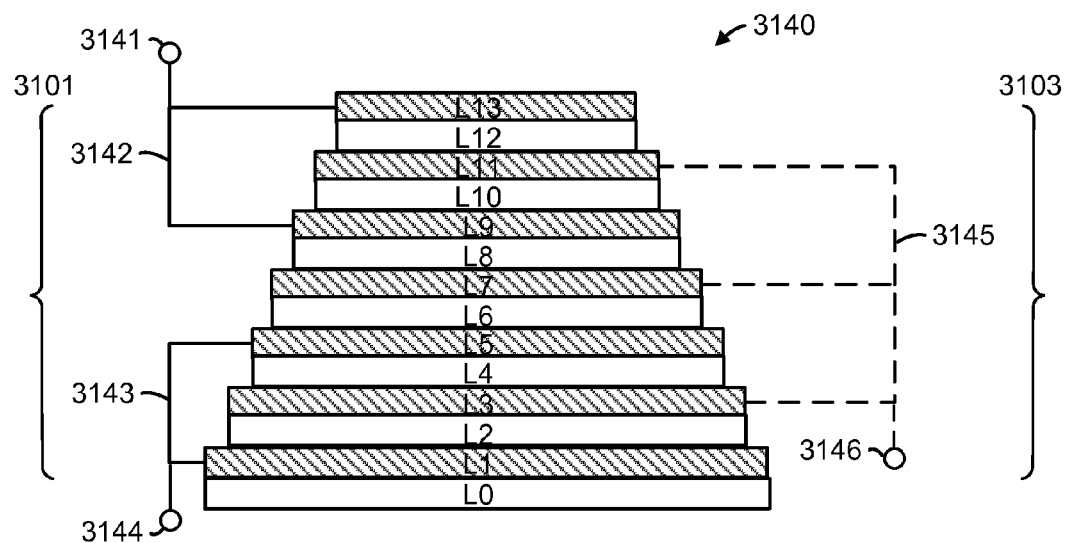
FIG. 31C depicts one embodiment of a passive device as first and second capacitors formed by a stack of alternating layers of a conductive material and a dielectric material.

FIG. 31C depicts one embodiment of a passive device 3140 as first and second capacitors formed by a stack of alternating layers of a conductive material and a dielectric material. This is an example of having multiple passive devices in one stack. A first capacitor has terminals 3141 and 3146, and is formed by L9 and L13, connected by a conductive path 3142, and L3, L7 and L11, connected by a conductive path 3145 (at the opposing side 3103 of the device). A second capacitor has terminals 3144 and 3146, and is formed by L1 and L5, connected by a conductive path 3143, and L3, L7 and L11, connected by a conductive path 3145.

Figure 31D:
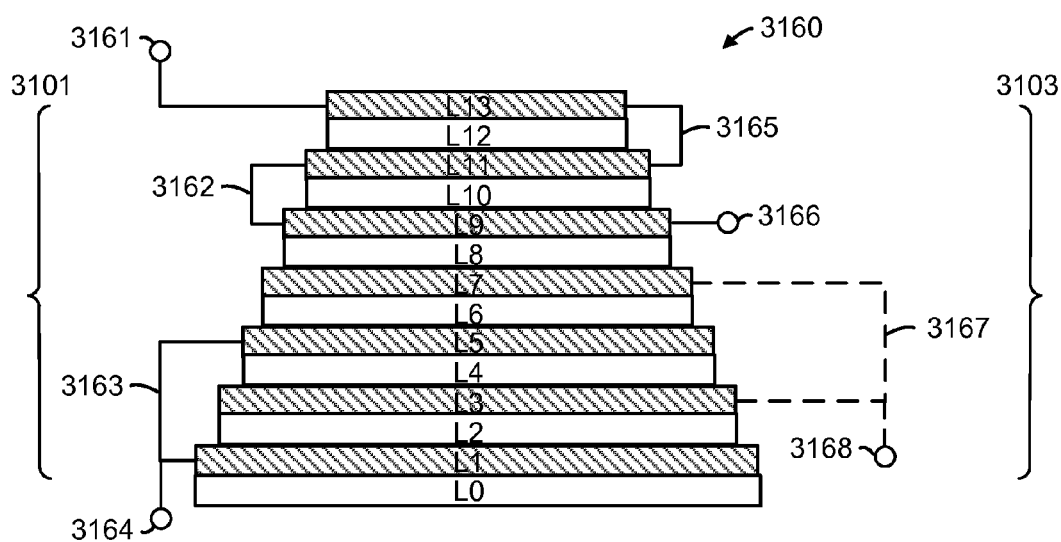
FIG. 31D depicts one embodiment of a passive device which includes a resistor above a capacitor, formed by a stack of alternating layers of a conductive material and a dielectric material.

FIG. 31D depicts one embodiment of a passive device 3160 which includes a resistor above a capacitor, formed by a stack of alternating layers of a conductive material and a dielectric material. A resistor has terminals 3161 and 3166 and is formed by resistive components (e.g., conductive plates) L9, L11 and L13, connected serially by conductive paths 3162 and 3165. A capacitor has terminals 3164 and 3168 and includes conductive plates L1 and L5 connected by a conductive path 3163, and conductive plates L3 and L7 connected by a conductive path 3167. This approach allows two types of passive devices to be fabricated in the same area of the substrate, providing flexibility and space-efficiency. For example, a resistor and a capacitor can be vertically arranged.

The alternating layers can comprise at least first (e.g., L1, L3, L5 and L7) and second (e.g., L9, L11 and L13) sets of the alternating layers. Forming the plurality of contact structures comprises forming a first set of contact structures (3163, 3167) associated with the first set of the alternating layers, and a second set of contact structures (3162, 3165) associated with the second set of the alternating layers. The layers of conductive material in the first set of the alternating layers can be connected to one another in parallel by the first set of contact structures, and the layers of conductive material in the second set of the alternating layers can be connected to one another serially by the second set of contact structures, separate from the first set of the alternating layers.

FIG. 31E depicts one embodiment of a passive device 3170 as a resistor formed by a stack of alternating layers of a conductive material and a dielectric material. This corresponds to the resistor of FIG. 30A. A resistor has terminals 3171 and 3178, and includes resistive components (e.g., conductive plates) L1, L3, L5, L7, L9, L11 and L13 connected serially, end to end, by conductive paths 3172 to 3177.

In a further option, a "vertical" resistor can be comprised of a stack of undoped/lightly doped poly and heavily doped poly which is not silicided, with contacts provided on the bottom and top of the stack. Multiples of such vertical resistors can be connected in series, to achieve a high resistivity.

FIG. 31F depicts one embodiment of a passive device 3158 as two resistors formed by a stack of alternating layers of a conductive material and a dielectric material. One resistor R1 has terminals 3181 and 3184, and includes resistive components (e.g., conductive plates) L9, L11 and L13 connected serially by conductive paths 3182 and 3183. Another resistor R2 has terminals 3185 and 3189, and includes resistive component L1, L3, L5 and L7 connected serially by conductive paths 3186, 3187 and 3188. This approach allows multiple resistor devices to be fabricated in the same area of the substrate and vertically arranged. In this example, R2>R1 since R2 includes four conductive players instead of three. That is, R2/R1=4/3. Optionally, when the conductive layers are heavily doped poly, the amount of doping can be adjusted to adjust the amount of resistance (e.g., higher doping=lower resistance), when one or more resistors are formed in a stack.

The alternating layers can comprise at least first (e.g., L1, L3, L5 and L7) and second (e.g., L9, L11 and L13) sets of the alternating layers. Forming the plurality of contact structures comprises forming a first set of contact structures (3186 to 3188) associated with the first set of the alternating layers, and a second set of contact structures (3182, 3183) associated with the second set of the alternating layers. The layers of conductive material in the first set of the alternating layers can be connected to one another serially by the first set of contact structures, and the layers of conductive material in the second set of the alternating layers can be connected to one another serially by the second set of contact structures, separate from the first set of the alternating layers.

Figure 32A:
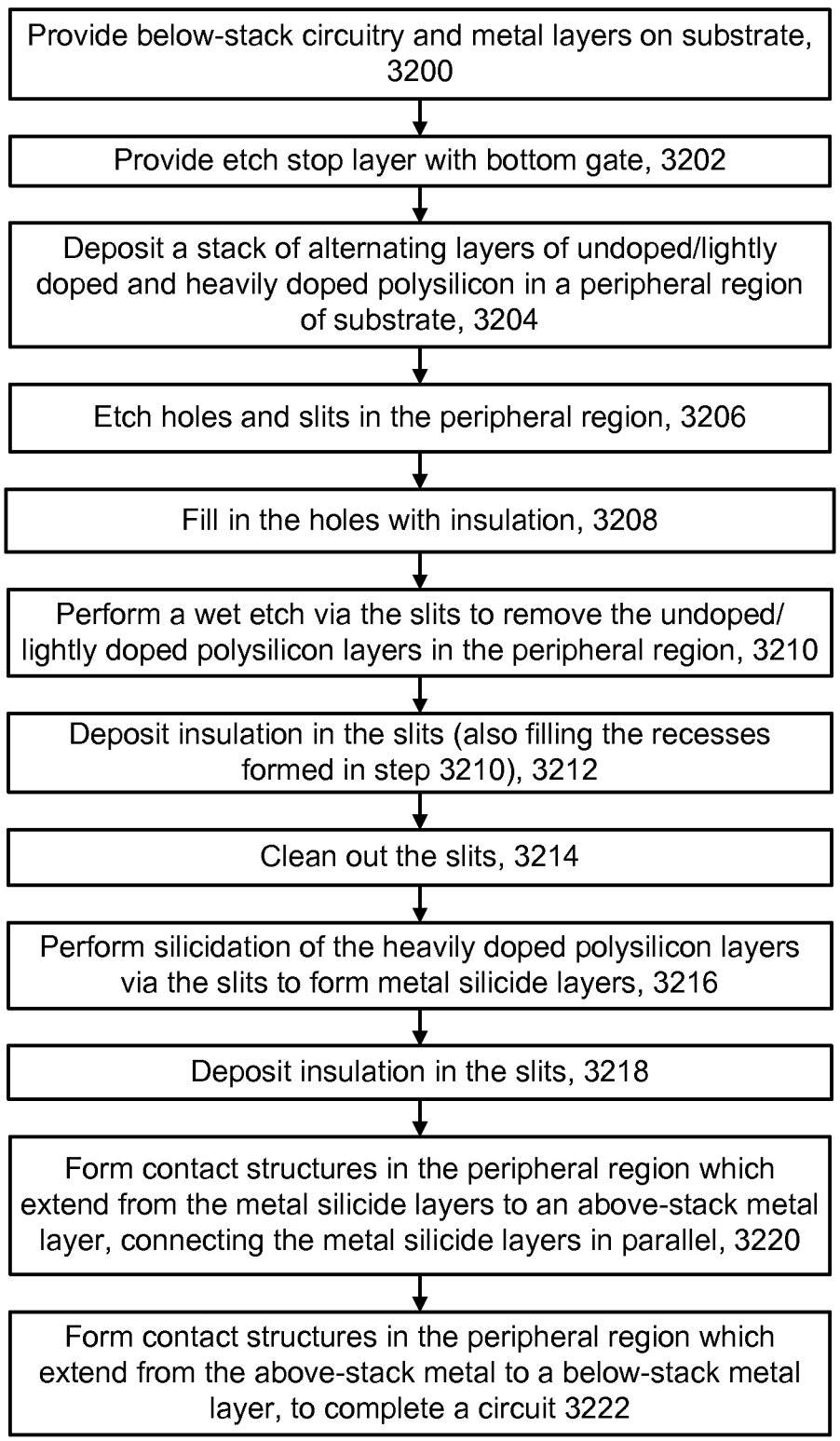
FIG. 32A depicts a method for fabricating a passive device as a capacitor in a peripheral region of a 3D stacked non-volatile memory device according to the structures of FIGS. 28A to 31E, where a wet etch is performed via slits.

FIG. 32A depicts a method for fabricating a passive device as a capacitor in a peripheral region of a 3D stacked non-volatile memory device according to the structures of FIGS. 28A to 31E, where a wet etch is performed via slits.

The steps include: Provide below-stack circuitry and metal layers on substrate, 3200; Provide etch stop layer with bottom gate, 3202; Deposit a stack of alternating layers of undoped/lightly doped and heavily doped polysilicon in a peripheral region of substrate, 3204; Etch holes and slits in the peripheral region, 3206; Fill in the holes with insulation, 3208; Perform a wet etch via the slits to remove the undoped/lightly doped polysilicon layers in the peripheral region, 3210; Deposit insulation in the slits, (also filling the recesses formed in step 3210) 3212; Clean out the slits, 3214; Perform silicidation of the heavily doped polysilicon layers via the slits to form metal silicide layers, 3216; Deposit insulation in the slits, 3218; Form contact structures in the peripheral region which extend from the metal silicide layers to an above-stack metal layer, connecting the metal silicide layers in parallel, 3220; and Form contact structures in the peripheral region which extend from the above-stack metal to a below-stack metal layer, to complete a circuit 3222. In step 3212, the insulation deposited in the slits extends horizontally to fill the recesses formed in step 3210.

Moreover, a number of the processes for fabricating the passive device can be carried out concurrently, at least in part, with the analogous processes for fabricating a 3D stacked memory array.

This approach uses replacement holes to anchor the heavily doped poly layers when the undoped/lightly doped poly layers are removed. The slits are used for wet etch and undoped/lightly doped poly removal. Insulation deposited into the slits is also deposited in between the heavily doped poly layers. The slits are then cleaned up and silicidation is performed.

In another possible approach, after the wet etch via the slits and removal of the undoped/lightly doped poly layers, silicidation is performed right away, e.g. by Ni CVD. In this approach, the silicidation affects not only the vertical edges of heavily doped poly layers, but also extends laterally along heavily doped poly boundaries and voids left after undoped/lightly doped poly removal. This is desirable for a capacitor because of the lower resistance of the poly plates. This is not desirable for a resistor where a higher resistance is sought. After silicidation, the slits and voids between the heavily doped poly (now metal silicide) layers are filled in with an insulator.

Figure 32B:
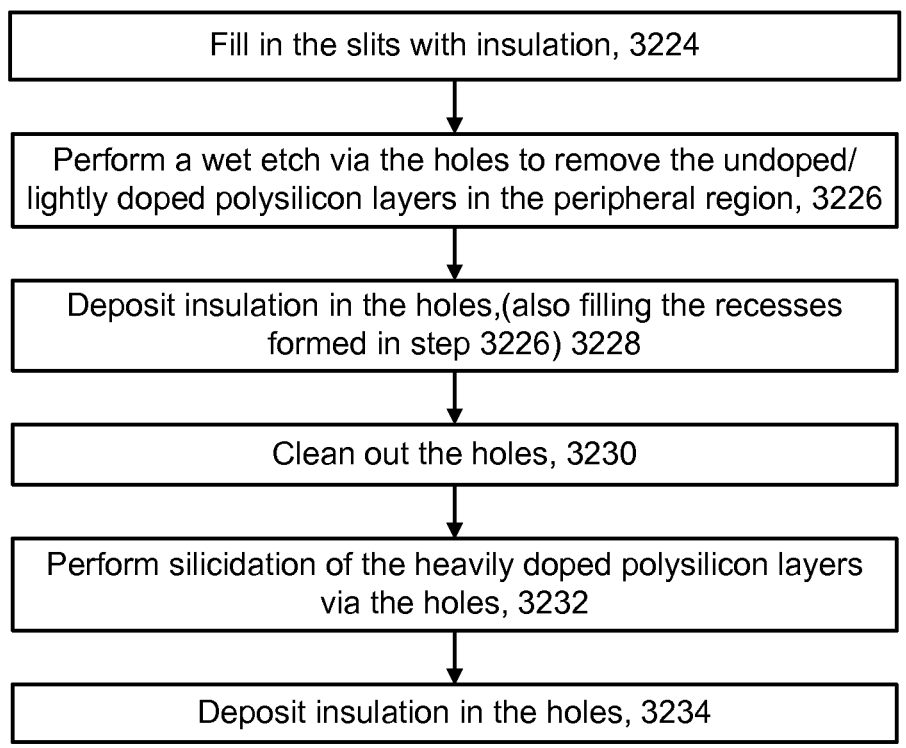
FIG. 32B depicts a method for fabricating a passive device as a capacitor in a peripheral region of a 3D stacked non-volatile memory device according to the structures of FIGS. 28A to 31E, where a wet etch is performed via holes.

FIG. 32B depicts a method for fabricating a passive device as a capacitor in a peripheral region of a 3D stacked non-volatile memory device according to the structures of FIGS. 28A to 31E, where a wet etch is performed via holes. These steps are an alternative to steps 3208 to 3218 of FIG. 32A. The steps include: Fill in the slits with insulation, 3224; Perform a wet etch via the holes to remove the undoped/lightly doped polysilicon layers in the peripheral region, 3226; Deposit insulation in the memory holes (also filling the recesses formed in step 3226), 3228; Clean out the holes, 3230; Perform silicidation of the heavily doped polysilicon layers via the holes, 3232; and Deposit insulation in the holes, 3234. In step 3228, the dielectric deposited in the holes extends horizontally or laterally to fill the recesses formed in step 3226.

In another possible approach, once insulation is deposited in the holes, the same process which is used in the memory array can be performed. That is, ONO insulation layers can be deposited in the replacement holes and, at the same time, extend between the poly layers. Then, the slits are opened, and silicidation is done via the slits. Then, insulator is put into the slits. This approach allows the same process step of depositing ONO insulation to be performed concurrently in both the memory array area and in one or more peripheral areas.

Figure 33A:
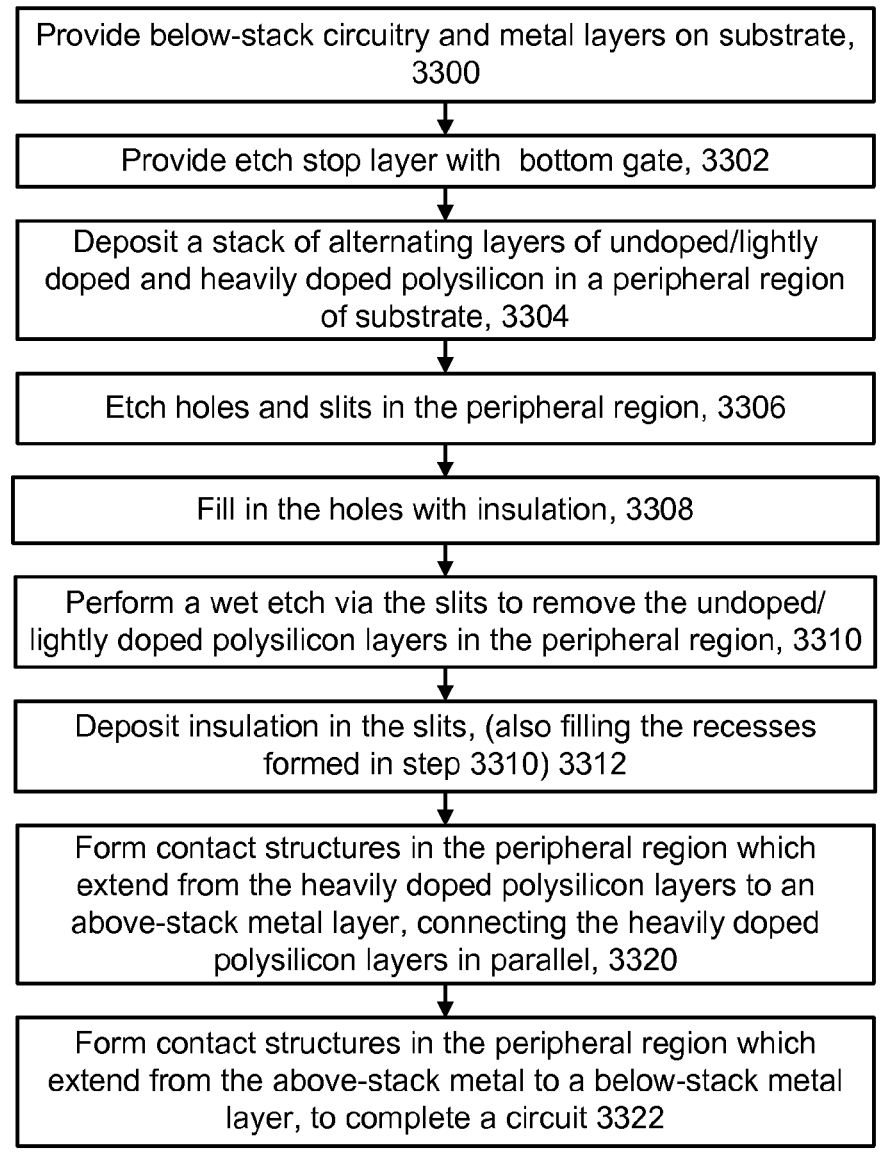
FIG. 33A depicts a method for fabricating a passive device as a resistor in a peripheral region of a 3D stacked non-volatile memory device according to the structures of FIGS. 28A to 31E, where a wet etch is performed via slits.

FIG. 33A depicts a method for fabricating a passive device as a resistor in a peripheral region of a 3D stacked non-volatile memory device according to the structures of FIGS. 28A to 31E, where a wet etch is performed via slits. The steps include: Provide below-stack circuitry and metal layers on substrate, 3300; Provide etch stop layer with bottom gate, 3302; Deposit a stack of alternating layers of undoped/lightly doped and heavily doped polysilicon in a peripheral region of substrate, 3304; Etch holes and slits in the peripheral region, 3306; Fill in the holes with insulation, 3308; Perform a wet etch via the slits to remove the undoped/lightly doped polysilicon layers in the peripheral region, 3310; Deposit insulation in the slits (also filling in the recesses formed in step 3310), 3312; Form contact structures in the peripheral region which extend from the heavily doped polysilicon layers to an above-stack metal layer, connecting the heavily doped polysilicon layers in parallel, 3320; and Form contact structures in the peripheral region which extend from the above-stack metal to a below-stack metal layer, to complete a circuit 3322. In step 3312, the insulation deposited in the slits extends horizontally or laterally to fill the recesses formed in step 3310.

Figure 33B:
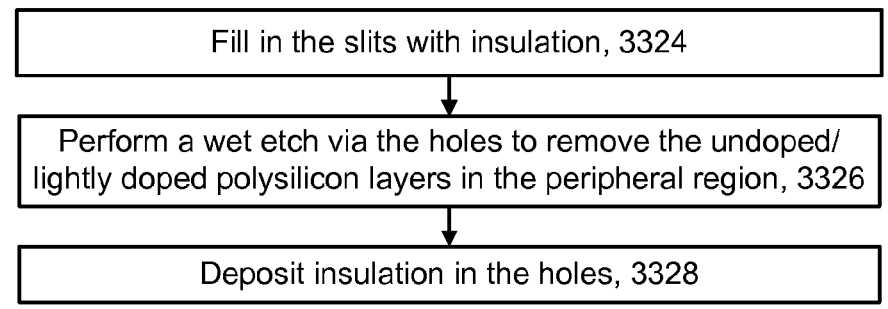
FIG. 33B depicts a method for fabricating a passive device as a resistor in a peripheral region of a 3D stacked non-volatile memory device according to the structures of FIGS. 28A to 31E, where a wet etch is performed via holes.

FIG. 33B depicts a method for fabricating a passive device as a resistor in a peripheral region of a 3D stacked non-volatile memory device according to the structures of FIGS. 28A to 31E, where a wet etch is performed via holes. These steps an alternative to steps 3308 to 3312 of FIG. 33A. The steps include: Fill in the slits with insulation, 3324; Perform a wet etch via the holes to remove the undoped/lightly doped polysilicon layers in the peripheral region, 3326; and Deposit insulation in the holes, 3328. In step 3328, the insulation deposited in the holes extends horizontally to fill the recesses formed in step 3326.

Thus, the layers of the passive device can be formed during the normal memory array process flow for forming word line planes. The number of layers of the passive device can correspond to that of the memory array. Contact structures on one or both sides of the passive device can be used. Contact structures on one side uses less area. Connections to the word line planes can be done using the same process flow (terrace formation) as for the memory array word line connection hook-up. Or, when the passive device consumes a larger area, connections can be made using one side stepping (one tiered side of the stack) for all layers. Moreover, the slit mask can be modified to form the multiple word line plate-based capacitor. The poly etch mark for the contact area formation, and the mark for the upper metal layers D0 and D1, can be modified for word line plate connections for capacitors. The same word line hook-up terrace process can be used for contacting the poly layers. Other implementations possible.

Thus, the same memory hole mask (or hole replacement mask) and slit mask can be used to form a passive device (capacitor and/or resistor) in the periphery, using the same process as in the array (terrace) to make connections to passive devices. For connections, the same D0, D1 masks, terrace contact mask and other contact masks (e.g. to connect from over to under array e.g. D0 to M1)—all masks modified—can be used to make connections and carry signals to/from a passive device. Optionally, as mentioned, for a resistor, the conductive layers can remain as heavily doped poly layers and need not be silicided. As mentioned, the higher resistance of heavily doped compared to metal silicide in a conductive layer is an advantage for a resistor, while the lower resistance of metal silicide compared to heavily doped poly in a conductive layer is an advantage for a capacitor.

In one embodiment, a 3D stacked non-volatile memory device includes: (a) a substrate; (b) a stacked non-volatile memory cell array carried by the substrate, the stacked non-volatile memory cell array comprising: (i) at least one cell area comprising rows of vertical columns of NAND cells, the rows of vertical columns of NAND cells extend between insulation-filled slits of the at least one cell area, and (ii) at least one interconnect area, lateral of the at least one cell area, comprising at least one metal silicide interconnect extending between insulation-filled slits of the at least one interconnect area, the at least one interconnect area does not comprise vertical columns of NAND cells; (c) at least one lower metal layer carried by the substrate, below the stacked non-volatile memory cell array; and (d) at least one upper metal layer, above the stacked non-volatile memory cell array, the at least one metal silicide interconnect is electrically connected to at least one contact structure of the at least one lower metal layer, and to at least one contact structure of the at least one upper metal layer, the at least one contact structure of the at least one lower metal layer is directly below the stacked non-volatile memory cell array.

In another embodiment, a 3D stacked non-volatile memory device includes: (a) a substrate; (b) a stacked non-volatile memory cell array carried by the substrate, the stacked non-volatile memory cell array comprising at least one cell area comprising rows of vertical columns of NAND cells, the rows of vertical columns of NAND cells extend between insulation-filled slits of the at least one cell area; (c) at least one peripheral area of the substrate, lateral of the stacked non-volatile memory cell array, the at least one peripheral area comprising at least one metal silicide interconnect extending between insulation-filled slits of the at least one peripheral area, the at least one peripheral area does not comprise vertical columns of NAND cells; (d) at least one lower metal layer carried by the substrate, below the at least one peripheral area; and (e) at least one upper metal layer, above the at least one peripheral area, the at least one metal silicide interconnect is electrically connected to at least one contact structure of the at least one lower metal layer, and to at least one contact structure of the at least one upper metal layer, the at least one contact structure of the at least one lower metal layer is directly below the at least one peripheral area.

In another embodiment, a 3D stacked non-volatile memory device includes: (a) a substrate; (b) a stacked non-volatile memory cell array carried by the substrate, the stacked non-volatile memory cell array comprising: (i) at least one cell area comprising rows of vertical columns of NAND cells, the rows of vertical columns of NAND cells extend between insulation-filled slits of the at least one cell area, and (ii) at least one interconnect area, lateral of the at least one cell area, comprising alternating stacked layers of insulation and heavily doped polysilicon, between insulation-filled slits of the at least one interconnect area, the alternating stacked layers extend upward from a bottom layer of heavily doped polysilicon and include at least one other layer of heavily doped polysilicon, the at least one interconnect area does not comprise vertical columns of NAND cells; (c) at least one lower metal layer carried by the substrate, below the stacked non-volatile memory cell array; and (d) at least one upper metal layer, above the stacked non-volatile memory cell array, the bottom layer of heavily doped polysilicon and the at least one other layer of heavily doped polysilicon are connected in parallel to the at least one upper metal layer.

In another embodiment, a peripheral area of a 3D stacked non-volatile memory device includes: (a) a substrate; (b) a stack of alternating undoped/lightly doped and heavily doped polysilicon layers on the substrate in at least one peripheral area of the substrate, lateral of at least one cell area of the substrate, the alternating stacked layers extend upward from a bottom layer of heavily doped polysilicon and include at least one other layer of heavily doped polysilicon, the at least one peripheral area does not comprise vertical columns of NAND cells; (c) at least one below-stack metal layer carried by the substrate, below the stack; (d) at least one contact structure of the at least one lower metal layer, extending up to the bottom layer of heavily doped polysilicon; (e) at least one above-stack metal layer, above the stack; (f) at least one contact structure extending from the bottom layer of heavily doped polysilicon to the at least one above-stack metal layer; and (g) at least one contact structure extending from the at least one other layer of heavily doped polysilicon to the at least one above-stack metal layer, the bottom layer of heavily doped polysilicon is connected in parallel with the at least one other layer of heavily doped polysilicon to the at least one above-stack metal layer by the at least one contact structure extending from the bottom layer of heavily doped polysilicon to the at least one above-stack metal layer and the at least one contact structure extending from the at least one other layer of heavily doped polysilicon to the at least one above-stack metal layer.

The foregoing detailed description of the technology herein has been presented for purposes of illustration and description. It is not intended to be exhaustive or to limit the technology to the precise form disclosed. Many modifications and variations are possible in light of the above teaching. The described embodiments were chosen to best explain the principles of the technology and its practical application to thereby enable others skilled in the art to best utilize the technology in various embodiments and with various modifications as are suited to the particular use contemplated. It is intended that the scope of the technology be defined by the claims appended hereto.

What is claimed is:

1. A 3D stacked non-volatile memory device, comprising:
   a substrate;
   a stacked non-volatile memory cell array carried by the substrate, the stacked non-volatile memory cell array comprising:
   alternating stacked layers of dielectric and conductive material, the alternating stacked layers comprising a topmost layer and a bottommost layer,
   first and second cell areas,
   the first and second cell areas comprising rows of vertical columns, the vertical columns comprise NAND cells and extend through the alternating stacked layers of dielectric and conductive material, and
   at least one interconnect area which is adjacent to and between the first and second cell areas, the at least one interconnect area comprising first and second insulation-filled slits which run a full length and height of the stacked non-volatile memory cell array and at least one metal silicide interconnect between the first and second insulation-filled slits, the at least one metal silicide interconnect extends through the alternating stacked layers of dielectric and conductive material, from the bottommost layer to the topmost layer and does not comprise vertical columns of NAND cells, the first insulation-filled slit is adjacent to the first cell area, the second insulation-filled slit is adjacent to the second cell area, and the at least one metal silicide interconnect is adjacent to at least one of the first or second insulation-filled slits;

at least one lower metal layer carried by the substrate, below the stacked non-volatile memory cell array; and at least one upper metal layer, above the stacked non-volatile memory cell array, the at least one metal silicide interconnect is electrically connected to at least one contact structure of the at least one lower metal layer, and to at least one contact structure of the at least one upper metal layer, and the at least one contact structure of the at least one lower metal layer is directly below the stacked non-volatile memory cell array.

2. The 3D stacked non-volatile memory device of claim 1, wherein:
the at least one metal silicide interconnect is adjacent to both of the first and second insulation-filled slits.

3. The 3D stacked non-volatile memory device of claim 1, wherein:
each vertical column is in a straight NAND string; and
the first and second cell areas comprise insulation-filled slits which extend between each row of vertical columns.

4. The 3D stacked non-volatile memory device of claim 1, wherein:
pairs of the vertical columns are in U-shaped NAND strings; and
the first and second cell areas comprise insulation-filled slits which extend between rows of vertical columns of straight NAND strings which are in a common U-shaped NAND string.

5. The 3D stacked non-volatile memory device of claim 1, further comprising:
circuitry carried by the substrate, directly below the stacked non-volatile memory cell array, the at least one metal silicide interconnect electrically connects the circuitry to the at least one upper metal layer.

6. The 3D stacked non-volatile memory device of claim 1, wherein:
the first and second insulation-filled slits of the at least one interconnect area are parallel to one another.

7. The 3D stacked non-volatile memory device of claim 1, wherein:
the first and second areas are on opposing sides of the at least one interconnect area.

8. The 3D stacked non-volatile memory device of claim 1, wherein:
the stacked non-volatile memory cell array is arranged in a plurality of subarrays in a plane without word line hookup and transfer areas between the subarrays.

9. The 3D stacked non-volatile memory device of claim 1, further comprising:
circuitry comprising a high-voltage transistor for a charge pump, cell source discharge or other power circuitry, the circuitry is carried by the substrate directly below the stacked non-volatile memory cell array, and is electrically connected to the at least one upper metal layer by the at least one metal silicide interconnect.

10. The 3D stacked non-volatile memory device of claim 1, wherein:
the at least one metal silicide interconnect comprises a terraced portion by which the at least one metal silicide interconnect is electrically connected to the at least one contact structure of the at least one upper metal layer.

11. The 3D stacked non-volatile memory device of claim 6, wherein:
the at least one interconnect area comprises a third insulation-filled slit which runs a full length and height of the stacked non-volatile memory cell array, the third insulation-filled slit is between and parallel with the first and second insulation-filled slits;
the at least one metal silicide interconnect comprises first and second regions of metal silicide;
the first region of metal silicide extends between the first and second insulation-filled slits and is adjacent to the first insulation-filled slit;
the second region of metal silicide extends between the second and third insulation-filled slits and is adjacent to the second insulation-filled slit;
the first and second regions of metal silicide are insulated from one another by the third insulation-filled slit; and
each of the first and second regions of metal silicide is electrically connected to a respective contact structure of the at least one lower metal layer, and to a respective contact structure of the at least one upper metal layer.

12. The 3D stacked non-volatile memory device of claim 6, wherein:
the at least one interconnect area comprises a transverse insulation-filled slit which runs a full height of the stacked non-volatile memory cell array, the transverse insulation-filled slit extends transversely to the first and second insulation-filled slits; and
the at least one metal silicide interconnect comprises a first region of metal silicide on one side of the transverse insulation-filled slit, and a second region of metal silicide on another side of the transverse insulation-filled slit, the first and second regions of metal silicide connect respective contact structures of the at least one lower metal layer to respective contact structures of the at least one upper metal layer.

13. The 3D stacked non-volatile memory device of claim 1, wherein:
the stacked non-volatile memory cell array comprises an etch stop layer below the alternating stacked layers of dielectric and conductive material; and
the at least one contact structure of the at least one lower metal layer extends upward through the etch stop layer to the at least one metal silicide interconnect.

14. The 3D stacked non-volatile memory device of claim 13, wherein:
the first and second insulation-filled slits, extend down to the etch stop layer; and
the at least one metal silicide interconnect extends from the etch stop layer to the topmost layer of the alternating stacked layers.

15. The 3D stacked non-volatile memory device of claim 1, wherein:
the stacked non-volatile memory cell array is arranged in a plurality of subarrays in a plane; and
the at least one interconnect area comprises at least one metal silicide interconnect extending between insulation-filled slits of the at least one interconnect area, in each of the subarrays.

16. The 3D stacked non-volatile memory device of claim 15, further comprising:
circuitry for each subarray, the circuitry for each subarray is carried by the substrate directly below each subarray, the at least one metal silicide interconnect in each of the subarrays electrically connects the circuitry for the subarray to the at least one upper metal layer.

17. The 3D stacked non-volatile memory device of claim 16, wherein:
the circuitry comprises sense amplifier circuitry for each subarray.

18. The 3D stacked non-volatile memory device of claim 1, wherein:

each vertical column comprise a select gate above the NAND cells of the vertical column.

19. The 3D stacked non-volatile memory device of claim 1, wherein:
the at least one metal silicide interconnect is located partway across the stacked non-volatile memory cell array, intermediate to edges of the stacked non-volatile memory cell array.

20. A 3D stacked non-volatile memory device, comprising:
a substrate;
a stacked non-volatile memory cell array carried by the substrate, the stacked non-volatile memory cell array comprising alternating stacked layers of dielectric and conductive material, and a cell area comprising rows of vertical columns, the vertical columns comprise NAND cells and extend through the alternating stacked layers of dielectric and conductive material between insulation-filled slits of the cell area;
a peripheral area of the substrate, lateral of the stacked non-volatile memory cell array, the peripheral area comprising alternating stacked layers of dielectric and conductive material and at least one metal silicide interconnect, the at least one metal silicide interconnect extending between insulation-filled slits of the peripheral area and through the alternating stacked layers of dielectric and conductive material of the peripheral area, from a bottommost layer of the alternating stacked layers of the peripheral area to a topmost layer of the alternating stacked layers of the peripheral area, the peripheral area does not comprise vertical columns of NAND cells;
at least one lower metal layer carried by the substrate, below the peripheral area; and
at least one upper metal layer, above the peripheral area, the at least one metal silicide interconnect is electrically connected to at least one contact structure of the at least one lower metal layer, and to at least one contact structure of the at least one upper metal layer, and the at least one contact structure of the at least one lower metal layer is directly below the peripheral area, wherein:
the insulation-filled slits of the peripheral area include a pair of parallel insulation-filled slits and at least one transverse insulation-filled slit which extends transversely to the pair of parallel insulation-filled slits; and
the at least one metal silicide interconnect comprises one region of metal silicide on one side of the at least one transverse insulation-filled slit, and another region of metal silicide on another side of the at least one transverse insulation-filled slit, the one region of metal silicide on the one side of the at least one transverse insulation-filled slit and the another region of metal silicide on the another side of the at least one transverse insulation-filled slit connect respective contact structures of the at least one lower metal layer to respective contact structures of the at least one upper metal layer.

21. The 3D stacked non-volatile memory device of claim 20, further comprising:
circuitry carried by the substrate, directly below the peripheral area, the at least one metal silicide interconnect electrically connects the circuitry to the at least one upper metal layer.

22. The 3D stacked non-volatile memory device of claim 20, wherein:
the peripheral area comprises an etch stop layer;
the at least one metal silicide interconnect extends from the etch stop layer to the topmost layer of the alternating stacked layers of the peripheral area; and
the at least one contact structure of the at least one lower metal layer extends upward through the etch stop layer to the at least one metal silicide interconnect.

23. The 3D stacked non-volatile memory device of claim 22, wherein:
the insulation-filled slits of the peripheral area extend down to the etch stop layer; and
the at least one metal silicide interconnect extends from the etch stop layer to the topmost layer of the alternating stacked layers of the peripheral area.

24. The 3D stacked non-volatile memory device of claim 20, wherein:
each vertical column comprise a select gate above the NAND cells of the vertical column.

25. The 3D stacked non-volatile memory device of claim 20, wherein:
the at least one metal silicide interconnect is located partway across the stacked non-volatile memory cell array, intermediate to edges of the stacked non-volatile memory cell array.

26. A 3D stacked non-volatile memory device, comprising:
a substrate;
a stacked non-volatile memory cell array carried by the substrate, the stacked non-volatile memory cell array comprising alternating stacked layers of dielectric and conductive material, and a cell area comprising rows of vertical columns, the vertical columns comprise NAND cells and extend through the alternating stacked layers of dielectric and conductive material between insulation-filled slits of the cell area;
a peripheral area of the substrate, lateral of the stacked non-volatile memory cell array, the peripheral area comprising alternating stacked layers of dielectric and conductive material and at least one metal silicide interconnect, the at least one metal silicide interconnect extending between insulation-filled slits of the peripheral area and through the alternating stacked layers of dielectric and conductive material of the peripheral area, from a bottommost layer of the alternating stacked layers of the peripheral area to a topmost layer of the alternating stacked layers of the peripheral area, the peripheral area does not comprise vertical columns of NAND cells;
at least one lower metal layer carried by the substrate, below the peripheral area; and
at least one upper metal layer, above the peripheral area, the at least one metal silicide interconnect is electrically connected to at least one contact structure of the at least one lower metal layer, and to at least one contact structure of the at least one upper metal layer, and the at least one contact structure of the at least one lower metal layer is directly below the peripheral area;
wherein the at least one metal silicide interconnect comprises a terraced portion by which the at least one metal silicide interconnect is electrically connected to the at least one contact structure of the at least one upper metal layer.

27. A 3D stacked non-volatile memory device, comprising:
a substrate;
a stacked non-volatile memory cell array carried by the substrate, the stacked non-volatile memory cell array comprising alternating stacked layers of dielectric and conductive material, and a cell area comprising rows of vertical columns, the vertical columns comprise NAND cells and extend through the alternating stacked layers of dielectric and conductive material between insulation-filled slits of the cell area;

a peripheral area of the substrate, lateral of the stacked non-volatile memory cell array, the peripheral area comprising alternating stacked layers of dielectric and conductive material and at least one metal silicide interconnect, the at least one metal silicide interconnect extending between insulation-filled slits of the peripheral area and through the alternating stacked layers of dielectric and conductive material of the peripheral area, from a bottommost layer of the alternating stacked layers of the peripheral area to a topmost layer of the alternating stacked layers of the peripheral area, the peripheral area does not comprise vertical columns of NAND cells;

at least one lower metal layer carried by the substrate, below the peripheral area; and at least one upper metal layer, above the peripheral area, the at least one metal silicide interconnect is electrically connected to at least one contact structure of the at least one lower metal layer, and to at least one contact structure of the at least one upper metal layer, and the at least one contact structure of the at least one lower metal layer is directly below the peripheral area; wherein:

the at least one metal silicide interconnect comprises respective regions of metal silicide;

each respective region of metal silicide extends between a different pair of the insulation-filled slits of the peripheral area;

the respective regions of metal silicide are insulated from one another by the insulation-filled slits of the peripheral area; and each respective region of metal silicide is electrically connected to a respective contact structure of the at least one lower metal layer, and to a respective contact structure of the at least one upper metal layer.

* * * * *